United States Patent
Karalis et al.

(10) Patent No.: US 11,005,413 B2
(45) Date of Patent: May 11, 2021

(54) HIGHLY-EFFICIENT NEAR-FIELD THERMOPHOTOVOLTAICS USING SURFACE-POLARITON EMITTERS AND THIN-FILM PHOTOVOLTAIC-CELL ABSORBERS

(71) Applicant: Massachusetts Institute of Technology, Cambridge, MA (US)

(72) Inventors: Aristeidis Karalis, Boston, MA (US); John D. Joannopoulos, Belmont, MA (US)

(73) Assignee: Massachusetts Institute of Technology, Cambridge, MA (US)

(*) Notice: Subject to any disclaimer, the term of this patent is extended or adjusted under 35 U.S.C. 154(b) by 252 days.

(21) Appl. No.: 15/864,634

(22) Filed: Jan. 8, 2018

(65) Prior Publication Data

US 2018/0131311 A1    May 10, 2018

Related U.S. Application Data

(63) Continuation of application No. PCT/US2017/038733, filed on Jun. 22, 2017.
(Continued)

(51) Int. Cl.
*H02S 10/30* (2014.01)
*H01L 31/0224* (2006.01)
(Continued)

(52) U.S. Cl.
CPC ...... *H02S 10/30* (2014.12); *H01L 31/022425* (2013.01); *H01L 31/04* (2013.01); *H02S 40/40* (2014.12)

(58) Field of Classification Search
None
See application file for complete search history.

(56) References Cited

U.S. PATENT DOCUMENTS 6,084,173 A    7/2000  DiMatteo
8,325,411 B2  12/2012  Higginson et al.
(Continued)

OTHER PUBLICATIONS

Tong, "Thin-film 'Thermal Well' Emitters and Absorbers for High-Efficiency Thermophotovoltaics" Scientific Reports 5:10661 pp. 1-12, 2015 (Year: 2015).*
(Continued)

*Primary Examiner* — Devina Pillay
(74) *Attorney, Agent, or Firm* — Smith Baluch LLP

(57) ABSTRACT

A near-field ThermoPhotoVoltaic system comprises a hot emitter and a cold absorbing PhotoVoltaic cell separated by a small gap. The emitter emits hot photons and includes a polaritonic material that supports a surface-polaritonic mode. The PhotoVoltaic cell has a metallic back electrode and includes a semiconductor that absorbs the photons and supports guided photonic modes. The surface-polaritonic mode and the first guided photonic mode resonantly couple at a frequency slightly above the semiconductor bandgap. The system material and geometrical parameters are such that the surface-polaritonic mode and the first guided photonic mode are approximately impedance-matched, so that power is transmitted at frequencies just above the semiconductor bandgap, even for relatively large gap widths, while the power transmitted at other frequencies is relatively small, leading to high system efficiency. Also described the PhotoVoltaic cell's front electrode, which may include highly-doped semiconductor regions, thin conducting oxide or silver films, or graphene layers.

28 Claims, 32 Drawing Sheets

Related U.S. Application Data

(60) Provisional application No. 62/353,265, filed on Jun. 22, 2016.

(51) Int. Cl.
  *H02S 40/40* (2014.01)
  *H01L 31/04* (2014.01)

(56) References Cited

U.S. PATENT DOCUMENTS

| | | | |
|---|---|---|---|
| 8,472,771 | B2 | 6/2013 | Karalis et al. |
| 10,083,812 | B1* | 9/2018 | Mackie ................. H01J 1/3044 |
| 2008/0203361 | A1* | 8/2008 | Dutta ...................... C30B 11/06 252/518.1 |
| 2010/0031990 | A1 | 2/2010 | Francoeur et al. |
| 2011/0023958 | A1* | 2/2011 | Masson ............... H01L 31/0201 136/256 |
| 2011/0284059 | A1* | 11/2011 | Celanovic ................. G05F 1/67 136/253 |
| 2015/0228827 | A1* | 8/2015 | Casse ...................... H02S 10/30 136/253 |
| 2016/0142005 | A1* | 5/2016 | Bernardi ................. H02S 10/30 136/253 |
| 2016/0315578 | A1* | 10/2016 | McCann ........... H01L 21/02568 |
| 2016/0322530 | A1* | 11/2016 | Sachet .............. H01L 31/02966 |
| 2017/0137344 | A1* | 5/2017 | Khurram ................ B01J 10/002 |

OTHER PUBLICATIONS

Tong, Supplementary Material for , "Thin-film 'Thermal Well' Emitters and Absorbers for High-Efficiency Thermophotovoltaics" pp. 1-13 (Year: 2015).*

Pilawa-Podgurski "Low-Power Maximum Power Point Tracker with Digital Control for Thermophotovoltaic Generators" Applied Power Electronics Conference and Exposition(APEC), 2010 Twenty-Fifth Annual IEEE, pp. 961-967, 2010 (Year: 2010).*

Parthiban "Investigations on high visible to near infrared transparent and high mobility Mo doped In2O3 thin films prepared by spray pyrolysis technique" Solar Energy Materials & Solar Cells 94 (2010) 406-412 (Year: 2010).*

Chan "High Efficiency Thermophotovoltaic Microgenerators" Thesis for Doctor of Philosophy at the Massachusetts Institute of Technology Jun. 2015 (Year: 2015).*

Lau, Parametric investigation of nano-gap thermophotovoltaic energy conversion, Journal of Quantitative Spectroscopy & Radiative Transfer 171 (2016) 39-49, Published Online: Dec. 7, 2015 (Year: 2015).*

Bright, Performance of Near-Field Thermophotovoltaic Cells Enhanced With a Backside Reflector, Journal of Heat Transfer, Jun. 2014, vol. 136, pp. 062701-1 to 062701-9 (Year: 2014).*

Babar, S. et al., "Optical constants of Cu, Ag, and Au revisited," Applied Optics, vol. 54, No. 3, pp. 477-481, Jan. 20, 2015.

Basu, et al., "Maximum energy transfer in near-field thermal radiation at nanometer distances," Journal of Applied Physics, vol. 105, No. 9, p. 093535-1-6, May 13, 2009.

Basu, S. et al., "Microscale radiation in thermophotovoltaic devices—A review," International Journal of Energy Research, vol. 31, pp. 689-716, 2007.

Bright, T. J. et al., "Performance of Near-Field Thermophotovoltaic Cells Enhanced With a Backside Reflector," Journal of Heat Transfer, vol. 136, p. 062701-1-9, Jun. 2014.

Celanovic, I. C et al., "Resonant-cavity enhanced thermal emission," Physical Review B, vol. 72, No. 7, p. 075127-1-6, Aug. 19, 2005.

Celanovic, I. et al., "Design and optimization of one-dimensional photonic crystals for thermophotovoltaic applications," Optics Letters, vol. 29, No. 8, pp. 863-865, Apr. 15, 2004.

Chalabi, H. et al., "An ab-initio coupled mode theory for near field radiative thermal transfer," Optics Express, vol. 22, No. 24, pp. 30032-30036, Dec. 1, 2014.

Chan, W. R. et al., "Toward high-energy-density, high-efficiency, and moderate-temperature chip-scale thermophotovoltaics," PNAS, vol. 110, No. 14, pp. 5309-5314, Apr. 2, 2013.

Chandola, A. et al., "Below band-gap optical absorption in Ga(x)In(1-x)Sb alloys," Journal of Applied Physics, vol. 98, No. 9, pp. 093103-1-7, 2005.

Charache, G. W. et al., "InGaAsSb thermophotovoltaic diode: Physics evaluation," Journal of Applied Physics, vol. 85, No. 4, pp. 2247-2252, Feb. 15, 1999.

Chen, W. et al., "Ultrathin, ultrasmooth, and low-loss silver films via wetting and annealing," Applied Physics Letters, vol. 97, No. 21, pp. 211107-1-3, 2010.

Coutts, T. J., "A review of progress in thermophotovoltaic generation of electricity," Renewable and Sustainable Energy Reviews, vol. 3, pp. 77-184, 1999.

Crowley, C. J. et al., "Thermophotovoltaic Converter Performance for Radioisotope Power Systems," in AIP Conf. Proc., Space Technology and Applications International Forum, pp. 601-614, 2005.

Dashiell, M. W. et al., "Quaternary InGaAsSb Thermophotovoltaic Diodes," IEEE Transactions on Electron Devices, vol. 53, No. 12, pp. 2879-2891, Dec. 2006.

Datas, A. et al., "Development and experimental evaluation of a complete solar thermophotovoltaic system," Progress in Photovoltaics, vol. 21, pp. 1025-1039, 2013.

Datas, A. et al., "Global optimization of solar thermophotovoltaic systems," Progress in Photovoltaics, vol. 21, pp. 1040-1055, 2013.

Desai, P. D. et al., "Electrical Resistivity of Selected Elements," Journal of Physical and Chemical Reference Data, vol. 13, No. 4, pp. 1069-1096, 1984.

Dimatteo, R. et al., "Micron-gap ThermoPhotoVoltaics (MTPV)," in AIP Conf. Proc., Thermophotovoltaic Generation of Electricity, 6th Conf., 11 pages, 2004.

Dimatteo, R. S. et al., "Enhanced photogeneration of carriers in a semiconductor via coupling across a nonisothermal nanoscale vacuum gap," Applied Physics Letters, vol. 79, No. 12, pp. 1894-1896, Sep. 17, 2001.

Falkovsky, L. A., "Optical properties of graphene," Journal of Physics: Conference Series, vol. 129, 012004, 8 pages, 2008.

Fan, S. et al., "Temporal coupled-mode theory for the Fano resonance in optical resonators," Journal of Optical Society of America A, vol. 20, No. 3, pp. 569-572, Mar. 2003.

Ferrari, C. et al., "Thermophotovoltaic energy conversion: Analytical aspects, prototypes and experiences," Applied Energy, vol. 113, pp. 1717-1730, 2014.

Francoeur, M. et al., "Solution of near-field thermal radiation in one-dimensional layered media using dyadic Green's functions and the scattering matrix method," Journal of Quantitative Spectroscopy & Radiative Transfer, vol. 110, pp. 2002-2018, 2009.

Francoeur, M. et al., "Thermal Impacts on the Performance of Nanoscale-Gap Thermophotovoltaic Power Generators," IEEE Trans. on Energy Conversion, vol. 26, No. 2, pp. 686-698, Jun. 2011.

Greffet, J.-J. et al., "Coherent emission of light by thermal sources," Nature, vol. 416, No. 52, pp. 61-64, Mar. 7, 2002.

Han, S. E. et al., "Beaming thermal emission from hot metallic bull's eyes," Optics Express, vol. 18, No. 5, pp. 4829-4837, Mar. 1, 2010.

Harder, N.-P. et al., "Theoretical limits of thermophotovoltaic solar energy conversion," Semiconductor Science & Technology, vol. 18, pp. S151-S157, Apr. 4, 2003.

Ilic, O. et al., "Overcoming the black body limit in plasmonic and graphene near-field thermophotovoltaic systems," Optics Express, vol. 20, No. S3, pp. A366-A384, 2012.

International Search Report and Written Opinion dated Oct. 31, 2017 for International Application No. PCT/US2017/038733, 13 pages.

Jablan, M. et al., "Plasmonics in graphene at infrared frequencies," Physical Review B, vol. 80, No. 24, p. 245435-1-7, 2009.

Johnson, P. B. et al., "Optical Constants of the Noble Metals," Physical Review B, vol. 6, No. 12, pp. 4370-4379, Dec. 15, 1972.

Karalis, A. et al., "Plasmonic-Dielectric Systems for High-Order Dispersionless Slow or Stopped Subwavelength Light," Physical Review Letters, vol. 103, No. 4, pp. 043906-1-4, Jul. 24, 2009.

(56) References Cited

OTHER PUBLICATIONS

Karalis, A. et al., "Surface-Plasmon-Assisted Guiding of Broadband Slow and Subwavelength Light in Air," Physical Review Letters, vol. 95, No. 6, pp. 063901-1-4, Aug. 5, 2005.
Karalis, A. et al., "Temporal coupled-mode theory model for resonant near-field thermophotovoltaics," Applied Physics Letters, vol. 107, No. 4, pp. 141108-1-5, Oct. 7, 2015.
Karalis, A. et al., "'Squeezing' near-field thermal emission for ultra-efficient high-power thermophotovoltaic conversion," Scientific Reports, vol. 6, 28472, 12 pages, 2016.
Karalis, A. et al., Supplementary Information—"'Squeezing' near-field thermal emission for ultra-efficient high-power thermosphotovoltaic conversion," Dep. of Physics, Massachusetts Institute of Technology, 2016, 10 pages.
Khan, M. J. et al., "Mode-Coupling Analysis of Multipole Symmetric Resonant Add/Drop Filters," IEEE Journal of Quantum Electronics, vol. 35, No. 10, pp. 1451-1460, Oct. 1999.
Kim, S. et al., "Graphene p-n Vertical Tunneling Diodes," ACS Nano, vol. 7, No. 6, pp. 5168-5174, 2013.
Kristensen, R. T. et al., "Frequency selective surfaces as near-infrared electromagnetic filters for thermophotovoltaic spectral control," Journal of Applied Physics, vol. 95, No. 9, pp. 4845-4851, May 1, 2004.
Laroche, M. et al., "Near-field thermophotovoltaic energy conversion," Journal of Applied Physics, vol. 100, No. 6, pp. 063704-1-10, Sep. 2006.
Licciulli, A. et al., "The challenge of high-performance selective emitters for thermophotovoltaic applications," Semiconductor Science & Technology, vol. 18, pp. S174-S183, Apr. 4, 2003.
Lin, S. Y. et al., "Three-dimensional photonic-crystal emitter for thermal photovoltaic power generation," Applied Physics Letters, vol. 83, No. 2, pp. 380-382, Jul. 14, 2003.
Liu, H.-C. et al., "Synthesis of high-order bandpass filters based on coupled-resonator optical waveguides (CROWs)," Optics Express, vol. 19, No. 18, pp. 17653-17668, Aug. 2011.
Messina, R. et al., "Graphene-based photovoltaic cells for near-field thermal energy conversion," Scientific Reports, vol. 3, 1383, 5 pages, 11 Mar. 2013.
Modine, F. A. et al., "Electrical properties of transition-metal carbides of group IV," Physical Review B, vol. 40, No. 14, pp. 9558-9564, Nov. 15, 1989.
Molesky, S. et al., "Ideal near-field thermophotovoltaic cells," Physical Review B, vol. 91, No. 20, pp. 205435-1-7, 2015.
Narayanaswamy, A. et al., "Surface modes for near field thermophotovoltaics," Applied Physics Letters, vol. 82, No. 20, pp. 3544-3546, May 19, 2003.
Nefzaoui, E. et al., "Selective emitters design and optimization for thermophotovoltaic applications," Journal of Applied Physics, vol. 111, No. 8, pp. 084316-1-8, Apr. 27, 2012.
Otey, C. R. et al., "Fluctuational electrodynamics calculations of near-field heat transfer in non-planar geometries: A brief overview," Journal of Quantitative Spectroscopy & Radiative Transfer, vol. 132, pp. 3-11, 2014.
Otey, C. R. et al., "Thermal Rectification through Vacuum," Physical Review Letters, vol. 104, No. 15, pp. 154301-1-4, Apr. 16, 2010.
Pachoud, A. et al., "Graphene transport at high carrier densities using a polymer electrolyte gate," Europhysics Letters, vol. 92, pp. 27001-1-6, Oct. 2010.
Pan, J. L. et al., "Very Large Radiative Transfer over Small Distances from a Black Body for Thermophotovoltaic Applications," IEEE Trans. on Electron Devices, vol. 47, No. 1, pp. 241-249, Jan. 2000.
Park, K. et al., "Performance analysis of near-field thermophotovoltaic devices considering absorption distribution," Journal of Quantitative Spectroscopy & Radiative Transfer, vol. 109, pp. 305-316, 2008.
Parthiban, S. et al., "Spray deposited molybdenum doped indium oxide thin films with high near infrared transparency and carrier mobility," Applied Physics Letters, vol. 94, No. 21, pp. 212101-1-3, 2009.

Pendry, J. B. et al., "Mimicking Surface Plasmons with Structured Surfaces," Science, vol. 305, pp. 847-848, Aug. 6, 2004.
Ramirez, D. M. et al., "Degenerate four-wave mixing in triply resonant Kerr cavities," Physical Review A, vol. 83, No. 3, pp. 033834-1-12, Mar. 2011.
Rephaeli, E. et al., "Absorber and emitter for solar thermophotovoltaic systems to achieve efficiency exceeding the Shockley-Queisser limit," Optics Express, vol. 17, No. 17, pp. 15145-15159, Aug. 17, 2009.
Rinnerbauer, V. et al., "High-temperature stability and selective thermal emission of polycrystalline tantalum photonic crystals," Optics Express, vol. 21, No. 9, pp. 11482-11491, May 6, 2013.
Rowell, M. W. et al., "Transparent electrode requirements for thin film solar cell modules," Energy & Environmental Science, vol. 4, pp. 131-134, 2011.
Sachet, E. et al., "Dysprosium-doped cadmium oxide as a gateway material for mid-infrared plasmonics," Nature Materials, vol. 14, pp. 414-420, Feb. 16, 2015.
Sievenpiper, D. et al., "High-Impedance Electromagnetic Surfaces with a Forbidden Frequency Band," IEEE Trans. Microwave Theory and Techniques, vol. 47, No. 11, pp. 2059-2074, 1999.
Sievenpiper, D. F. et al., "3D Metallo-Dielectric Photonic Crystals with Strong Capacitive Coupling between Metallic Islands," Physical Review Letters, vol. 80, No. 13, pp. 2829-2832, Mar. 30, 1998.
Suh, W. et al. "Temporal Coupled-Mode Theory and the Presence of Non-Orthogonal Modes in Lossless Multimode Cavities," IEEE Journal of Quantum Electronics, vol. 40, No. 10, pp. 1511-1518, Oct. 2004.
Svetovoy, V. B. et al., "Graphene-on-Silicon Near-Field Thermophotovoltaic Cell," Physical Review Applied, vol. 2, No. 3, pp. 034006-1-6, Sep. 11, 2014.
Tong, J. K. et al., "Thin-film 'Thermal Well' Emitters and Absorbers for High-Efficiency Thermophotovoltaics," Scientific Reports, vol. 5, 10661, 12 pages, Jun. 1, 2015.
Tong, J. K. et al., Supplementary Information—"Thin-film 'Thermal Well' Emitters and Absorbers for High-Efficiency Thermophotovoltaics," Dep. Of Mechanical Engineering, Massachusetts Institute of Technology, 2015-2016, 13 pages.
Van De Groep, J. et al., "Transparent Conducting Silver Nanowire Networks," NanoLetters, vol. 12, pp. 3138-3144, May 3, 2012.
Whale, M. D. et al., "Modeling and Performance of Microscale Thermophotovoltaic Energy Conversion Devices," IEEE Trans. on Energy Conversion, vol. 17, No. 1, pp. 130-142, Mar. 2002.
Wilt, D. et al., "Monolithic interconnected modules (MIMs) for thermophotovoltaic energy conversion," Semiconductor Science & Technology, vol. 18, pp. S209-S215, Apr. 4, 2003.
Wurfel, P., "The chemical potential of radiation," Journal of Physics C: Solid State Physics, vol. 15, pp. 3967-3985, 1982.
Yamada, N. et al., "Effects of Postdeposition Annealing on Electrical Properties of Mo-Doped Indium Oxide (IMO) Thin Films Deposited by RF Magnetron Cosputtering," Japanese Journal of Applied Physics, vol. 45, No. 44, pp. L1179-L1182, 2006.
Yanik, M. F. et al., "Stopping Light All Optically," Physical Review Letters, vol. 92, No. 8, pp. 083901-1-4, Feb. 2004.
Yeng, Y. X. et al., "Enabling high-temperature nanophotonics for energy applications," PNAS, vol. 109, No. 7, pp. 2280-2285, Feb. 14, 2012.
Yeng, Y. X. et al., "Performance analysis of experimentally viable photonic crystal enhanced thermophotovoltaic systems," Optics Express, vol. 21, No. S6, pp. A1035-A1051, Nov. 4, 2013.
Zhang, S. H. et al., "Piezoelectric surface acoustical phonon limited mobility of electrons in graphene on a GaAs substrate," Physical Review B, vol. 87, No. 7, pp. 075443-1-075443-5, 2013.
Zhu, L. et al., "Temporal coupled mode theory for thermal emission from a single thermal emitter supporting either a single mode or an orthogonal set of modes," Applied Physics Letters, vol. 102, No. 10, pp. 103104-1-103104-4, 2013.
Zhu, W. et al., "Carrier scattering, mobilities, and electrostatic potential in monolayer, bilayer, and trilayer graphene," Physical Review B, vol. 80, No. 23, pp. 235402-1-235402-8, 2009.

(56) References Cited

OTHER PUBLICATIONS

Johns et al., "Epsilon-near-zero response in indium tin oxide thin films: Octave span tuning and IR plasmonics." Journal of Applied Physics 127.4 (2020): 043102. 13 pages.

* cited by examiner

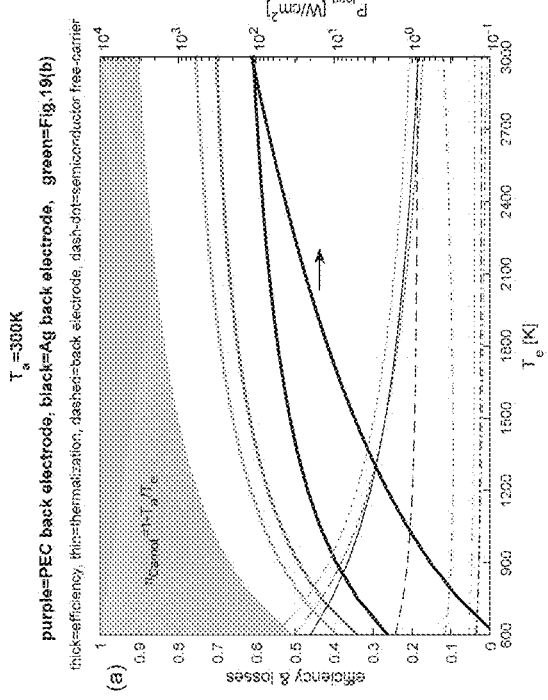
FIG. 6A
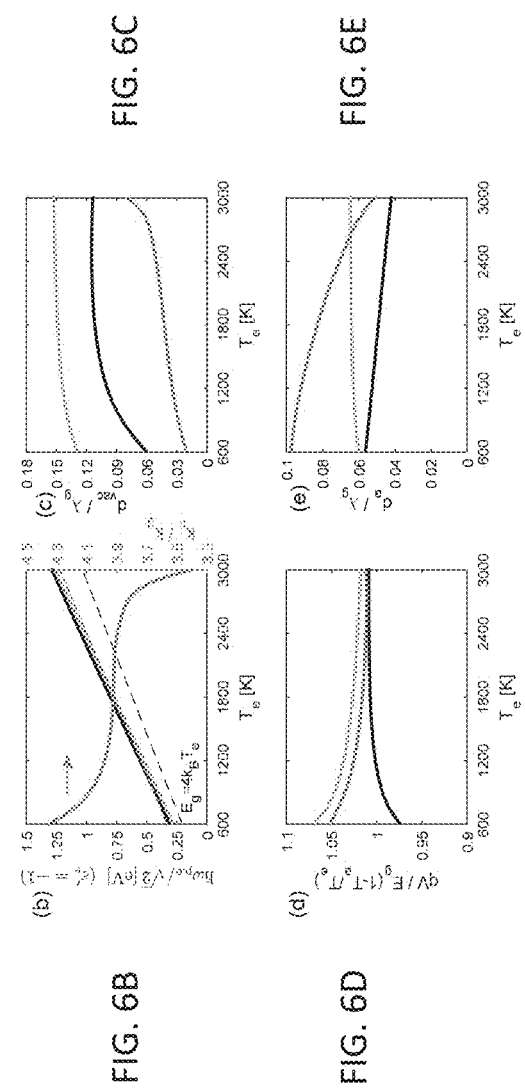
FIG. 6B
FIG. 6C
FIG. 6D
FIG. 6E

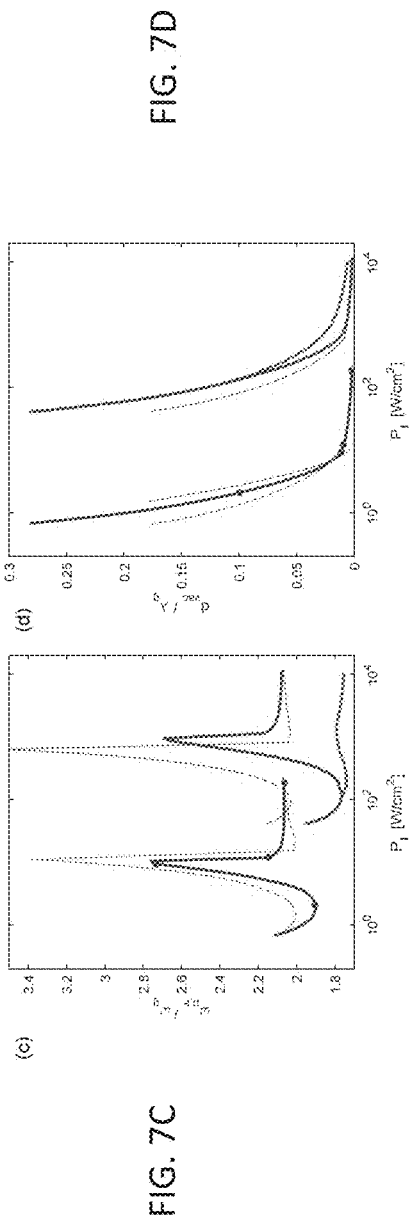
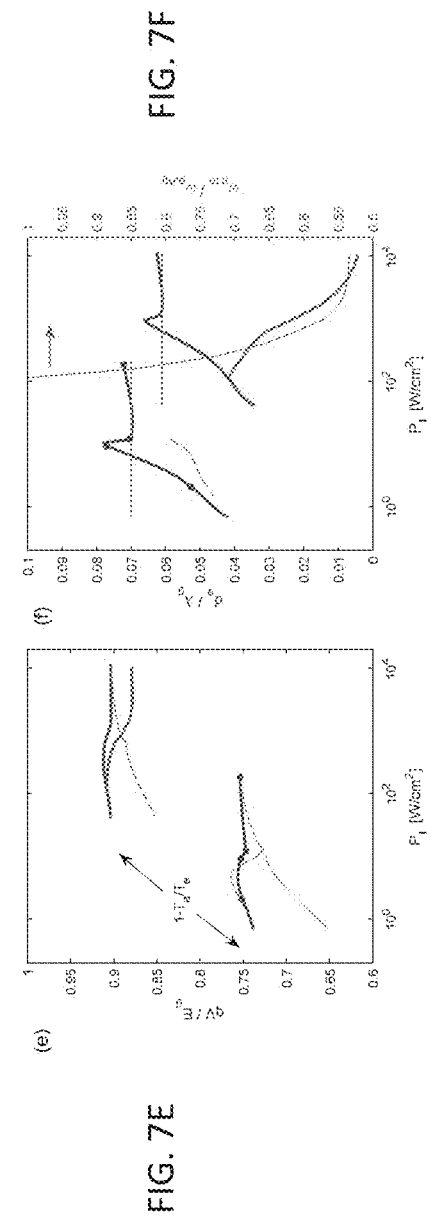
FIG. 7C  FIG. 7D
FIG. 7E  FIG. 7F

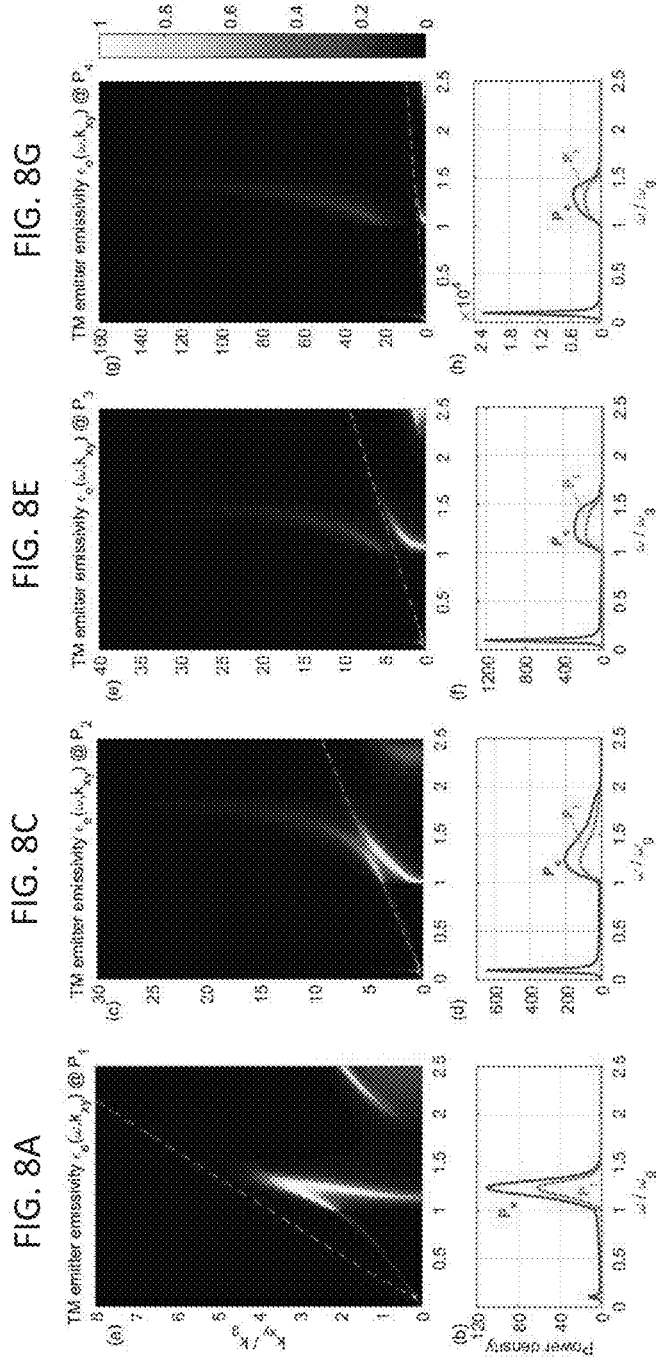

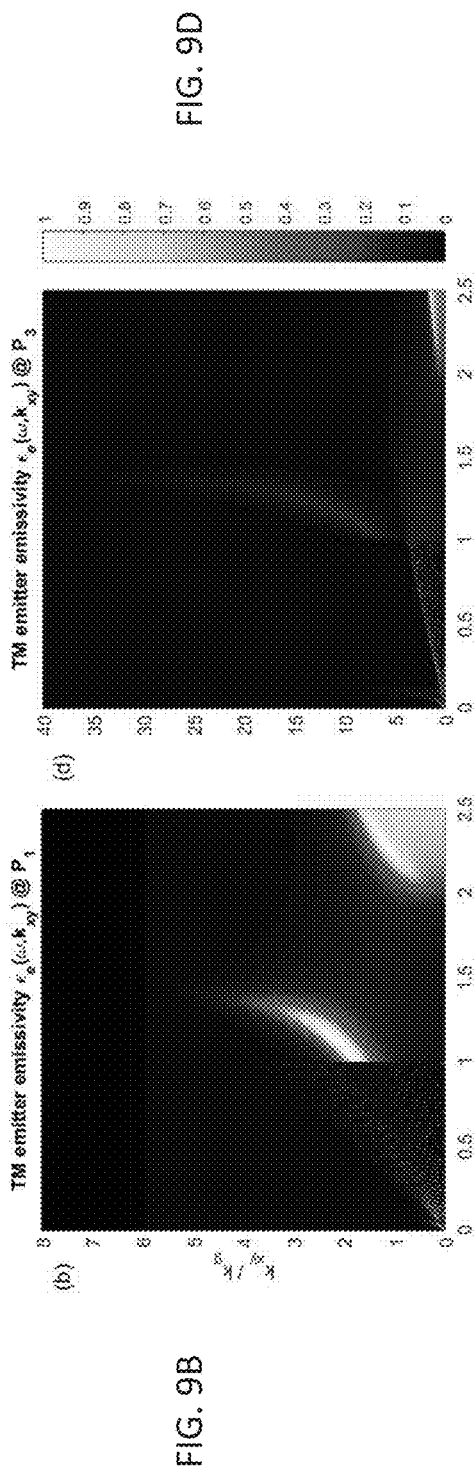

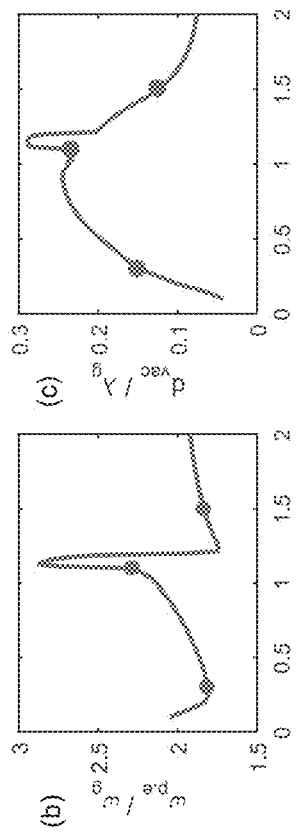
FIG. 13C
FIG. 13E
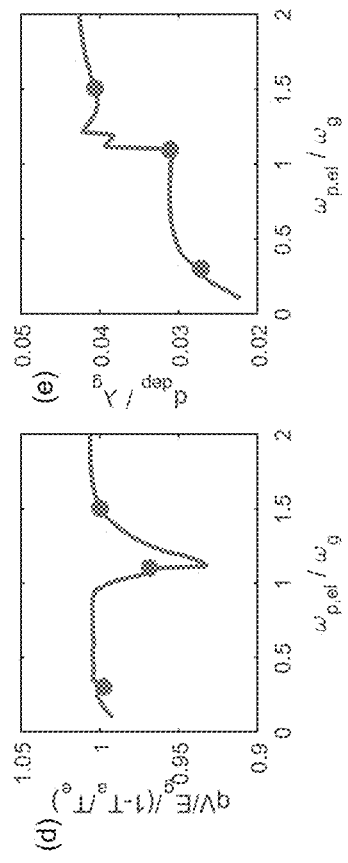
FIG. 13B
FIG. 13D

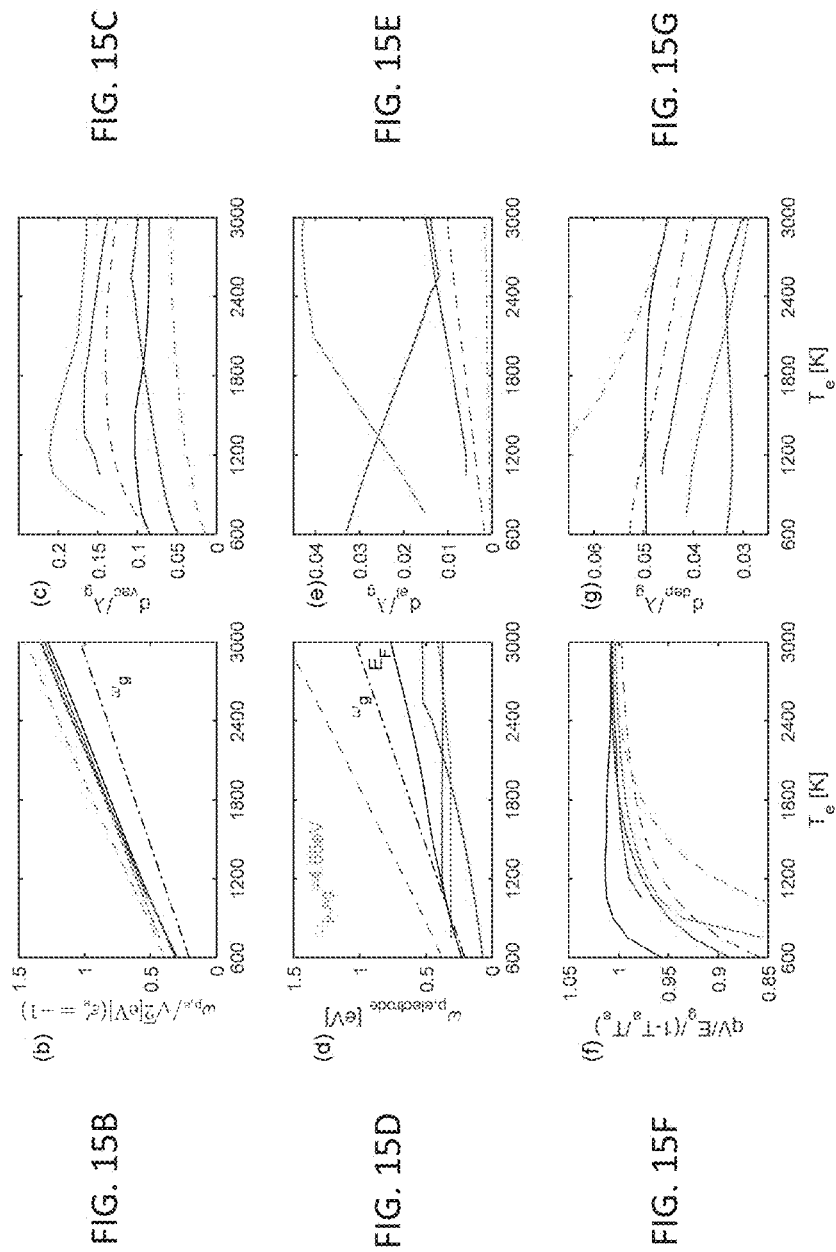

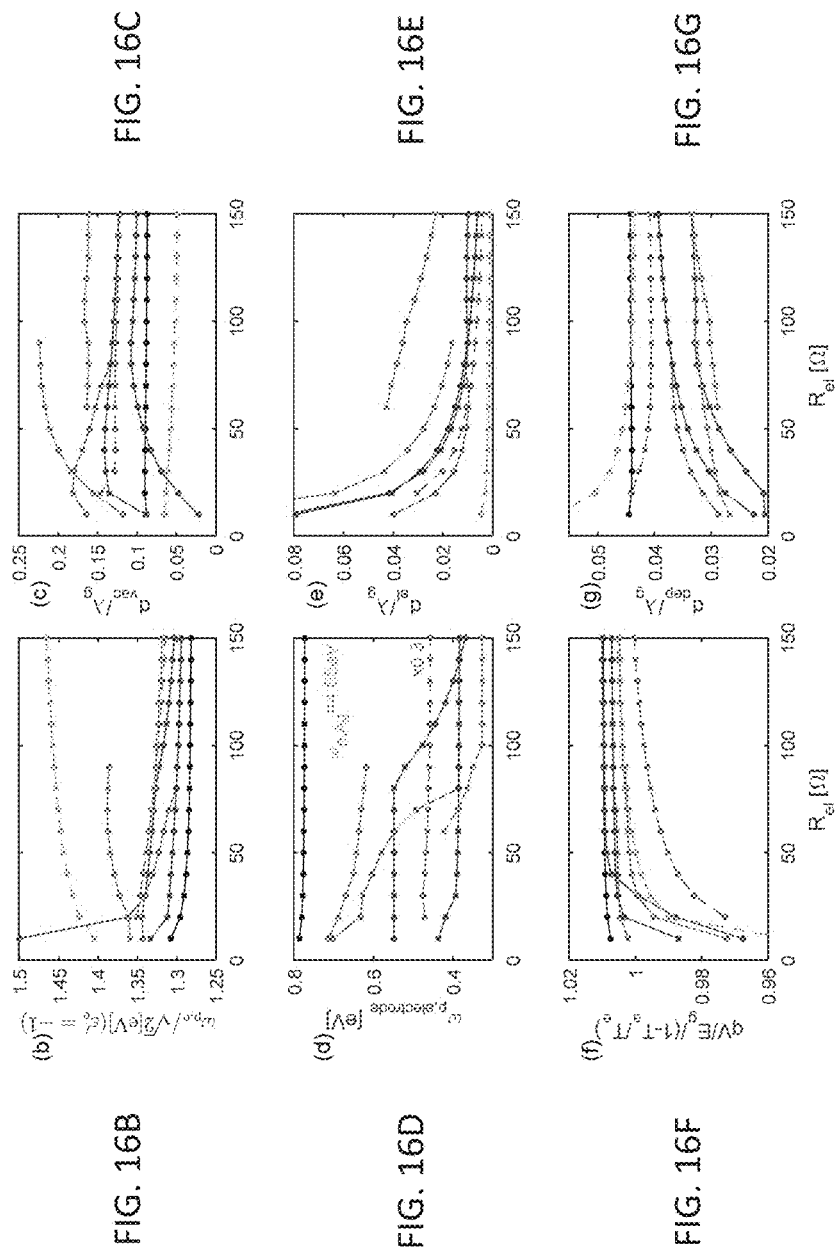

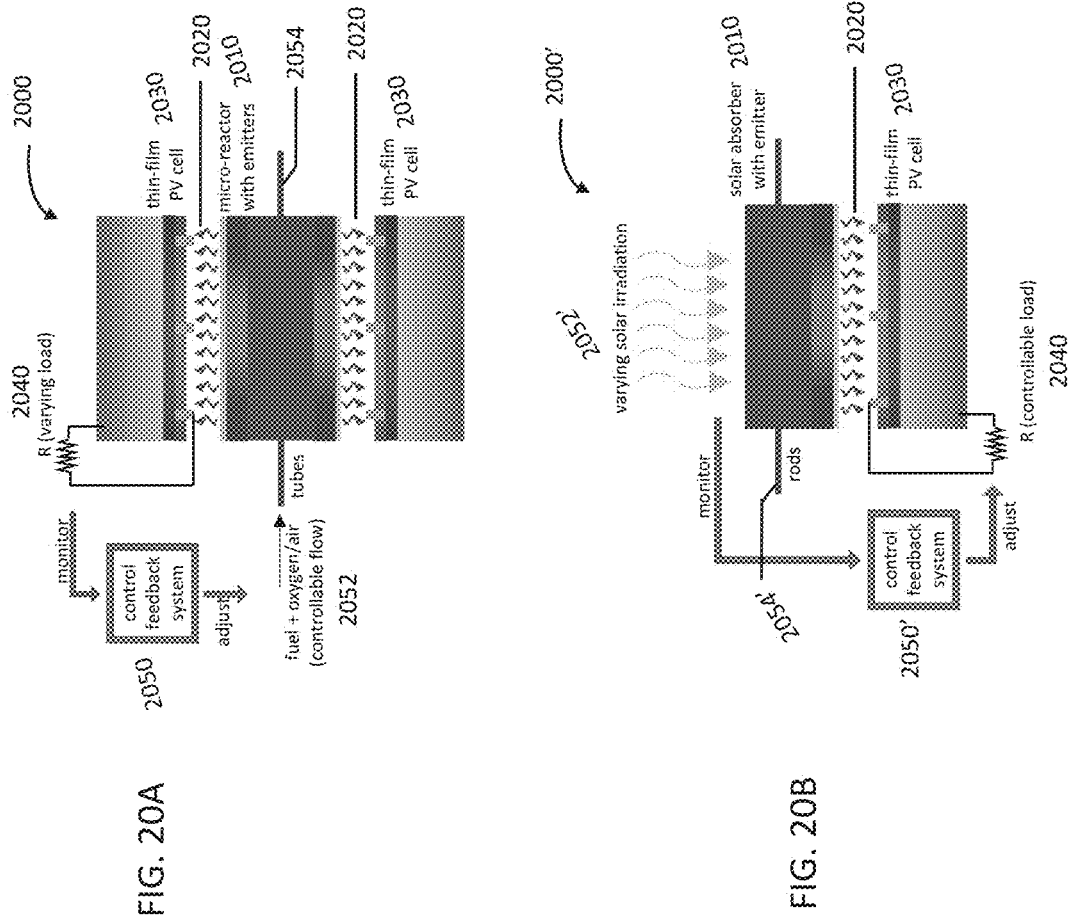

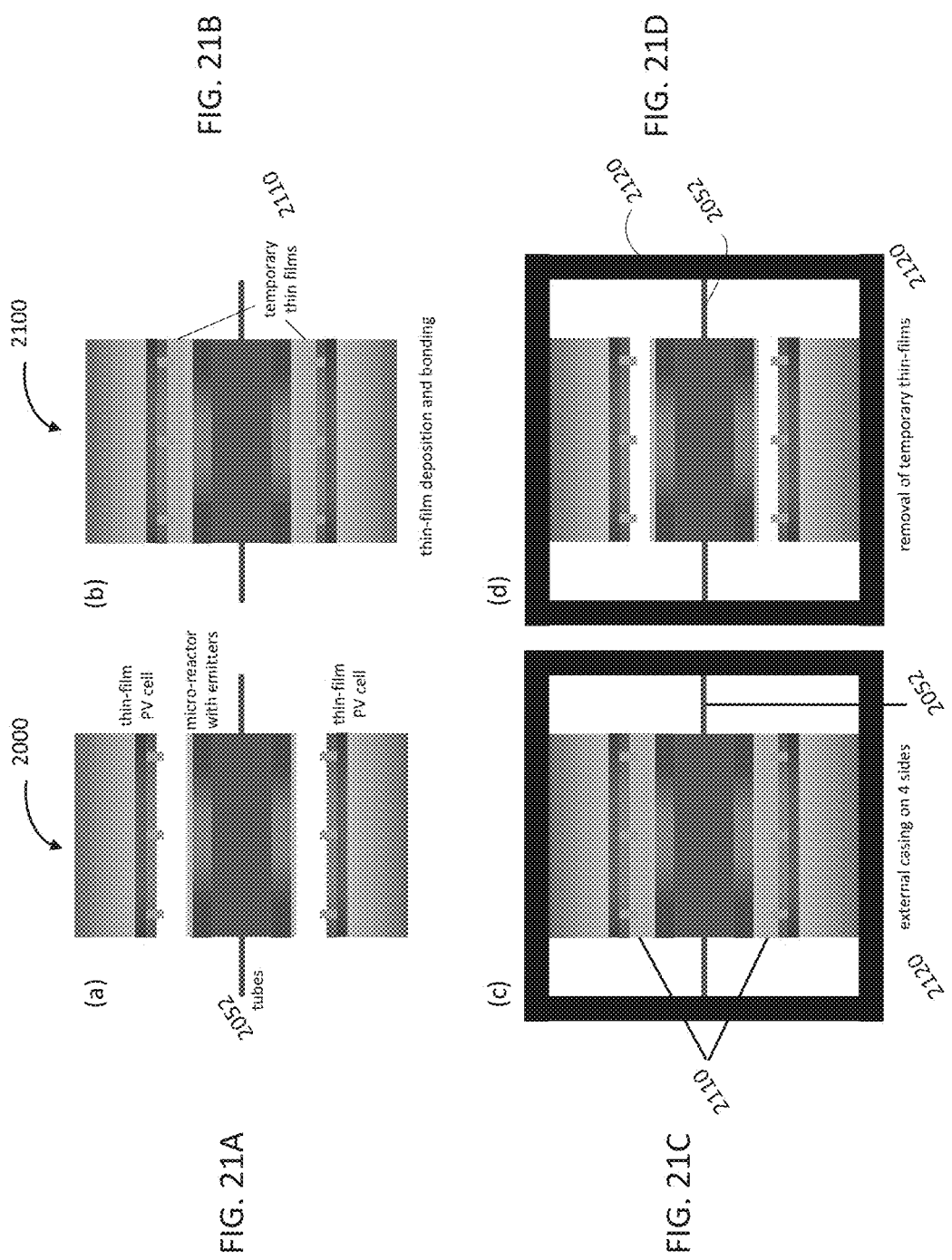

HIGHLY-EFFICIENT NEAR-FIELD THERMOPHOTOVOLTAICS USING SURFACE-POLARITON EMITTERS AND THIN-FILM PHOTOVOLTAIC-CELL ABSORBERS

CROSS-REFERENCE TO RELATED APPLICATION(S)

This application is a bypass continuation application of International Patent Application PCT/US2017/038733, entitled "Highly Efficient Near-Field ThermoPhotoVoltaics Using Surface-Polariton Emitters and Thin-Film PhotoVoltaic-Cell Absorbers," filed on Jun. 22, 2017 which claims the priority benefit, under 35 U.S.C. § 119(e), of U.S. Application No. 62/353,265, which was filed on Jun. 22, 2016. Each of these applications is incorporated herein by reference in its entirety.

GOVERNMENT SUPPORT

This invention was made with Government support under Contract No. W911NF-13-D-0001 awarded by the Army Research Office. The Government has certain rights in the invention.

BACKGROUND

ThermoPhotoVoltaics (TPV) is a heat-to-electricity conversion mechanism, wherein Thermal radiation is absorbed by a semiconductor PhotoVoltaic (PV) cell. It is very favorable, as it involves no moving parts, allowing the possibility for compact, light (thus portable), quiet and long-lived generators, powerable from numerous sources, such as high-energy-density hydrocarbon or nuclear fuels, or solar irradiation. Like any heat engine, a TPV system has the Carnot efficiency limit, which can only be achieved with monochromatic radiation matched to the semiconductor electronic bandgap. Absorbed thermal radiation below the bandgap is completely lost and far above it suffers thermalization losses. Reaching this limit in practical implementations has been challenging.

By far the most developed TPV systems use the far-field radiation of the hot emitter to transfer thermal energy across a vacuum gap to a semiconductor PV-cell absorber. To enhance efficiency, systems with emitter emissivity of both a Lorentzian (resonant) shape and a step-function shape above the semiconductor bandgap have been suggested and built. As the emission bandwidth above the bandgap increases, more output power is produced, but the system suffers from thermalization losses. These losses can be reduced, while maintaining large output power, by utilizing tandem PV-cell absorbers, however the cost then increases significantly. Although such selective-emitter TPV systems are designed to suppress photons emitted below the bandgap, unfortunately, at high emitter temperatures, this suppression is not really effective, as the emitter-material losses are so high that both the Lorentzian and step transitions are very broad and a considerable number of photons is still emitted below the bandgap, with a great associated hit in efficiency. This can be inhibited via the use of reflectors on the cold absorber to recycle below-bandgap photons back to the emitter, either via rugate filters on the PV-cell front surface, but again cost increases drastically, or via back reflectors, but only if the substrate has low free-carrier absorption.

There is in recent years a huge interest in near-field TPV systems, primarily because utilization of not only the radiative modes but also the evanescent modes for thermal energy transfer can lead to significantly increased output power.

Systems with emitters employing a Surface Plasmon Polariton resonance tuned above the semiconductor bandgap of a thick PV cell, spaced across an extremely narrow vacuum gap, without and with a metal back-surface, have been analyzed. Indeed, much more useful power is transferred to the PV cell at a given emitter temperature, and therefore the efficiency is also improved. However, as we show, these systems not only experience the same spectrum broadening due to the increased losses of the emitter at high temperatures, but also suffer from large absorption losses in the conducting carriers of the PV-cell electrode. These two mechanisms keep the efficiency away from the ideal Carnot limit.

Systems with semiconductor emitters matched to the semiconductor absorbing PV cell have also been proposed. The case of thick emitter and absorber at nanoscopic vacuum spacings offers a $\eta^2$ increase in transmitted power over the far-field equivalent, where $\eta$ is the index of refraction of the semiconductors. The resonant-system case of a thin film emitter and absorber, supporting coupled electromagnetic modes, has also been investigated recently and shown to have better performance at larger gap spacings. The main drawback though of semiconductor-emitter TPV systems is that semiconductors have relatively low melting temperatures compared to metals and therefore a sacrifice is made in both efficiency (from the Carnot limit $1-T_a/T_e$) and power (from the Stefan-Boltzmann law $\sim T_e^4$). The efficiency also suffers from losses due to the thermal carriers in the hot semiconductor emitter and the shift of its bandgap edge at high temperatures.

A TPV system including a polaritonic emitter and a thin-film semiconductor absorber has also been studied in the past (surface-phonon emitter and tungsten emitter). However, those systems were not designed so that the emitter polaritonic mode and the absorber dielectric-waveguide-type mode cross, couple and are impedance-matched just above the bandgap. This is why the reported efficiencies in those studies are significantly lower than those reported here.

In most cases of TPV studied so far, the free-carrier absorption losses associated with the necessary partially-absorbing conducting electrode on the emitter side of the PV cell have been greatly ignored or not sufficiently studied. Using graphene layers on the front of the PV cell has been suggested in R. Messina and P. Ben-Abdallah, "Graphene-based photovoltaic cells for near-field thermal energy conversion," Scientific Reports, vol. 3, p. 1383, 11 Mar. 2013, and in V. B. Svetovoy and G. Palasantzas, "Graphene-on-Silicon Near-Field Thermophotovoltaic Cell," Physical Review Applied, vol. 2, no. 3, p. 034006, 11 Sep. 2014, but, in both cases, the PV cell had a bulk geometry.

SUMMARY

Embodiments of the present technology include a thermophotovoltaic apparatus that comprises a thermal emitter and a photovoltaic cell. The thermal emitter comprises at least one material having a relative dielectric permittivity with a real part of $-1$ at a frequency between $\omega_g$ and about $1.7\omega_g$. The photovoltaic cell comprises at least one semiconductor material having an electronic bandgap of energy $\hbar\omega_g$, where $\hbar$ is Planck's constant and $\omega_g$ is an angular frequency of the electronic bandgap. The semiconductor material has a thickness of less than $\lambda_g=2\pi c/\omega_g$, where c is the speed of light in vacuum. The photovoltaic cell further comprises a back reflector having a reflectivity at $\omega_g$ of at least 90%.

In operation, the thermal emitter is placed in thermal communication with a heat source and receives heat from the heat source. Similarly, the photovoltaic cell is placed in electrical communication with an electrical load and delivers power to the electrical load. The photovoltaic cell is separated from the thermal emitter by a vacuum gap, which has a width of less than $\lambda_g$, and receives thermally emitted photons from the thermal emitter across the vacuum gap.

In other examples of the thermophotovoltaic apparatus, the thermal emitter comprises at least one paritonic material and supports, on an interface of the polaritonic material, at least one surface polaritonic mode having (i) an upper cutoff frequency between $\omega_g$ and about $1.7\omega_g$ and (ii) a field that extends inside the vacuum gap.

The thermal emitter may also comprise at least one polaritonic material and support, on an interface of the at least one polaritonic material, a surface polaritonic mode having a resonant frequency between $\omega_g$ and about $1.5\omega_g$. In these cases, the photovoltaic cell supports a photonic mode having a resonant frequency between $\omega_g$ and about $1.5\omega_g$. And the surface polaritonic mode of the thermal emitter couples with the photonic mode of the photovoltaic cell with a coupling coefficient $\kappa$, where $\kappa/\omega_g$ is larger than 0.01.

Other examples of the present technology include methods of fabricating thermophotovoltaic apparatuses. An example method includes holding a thermal emitter and a photovoltaic cell together with a temporary thin film to form a connected structure. A casing is formed around the connected structure. This casing is connected to the thermal emitter and to the photovoltaic cell and has at least one opening. The temporary thin film is removed through the casing's opening(s) to create a gap between the thermal emitter and the photovoltaic cell. The casing is closed. The air inside the casing is removed to create a vacuum in the gap between the thermal emitter and the photovoltaic cell.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIGS. 6A-6E show optimization results vs emitter temperature $T_e$, for different TPV systems: FIG. 4 with silver back electrode (black lines), FIG. 4 with PEC back electrode (purple lines) and FIG. 18B with silver back electrode (green—approximate results). FIG. 6A shows, on the left axis, maximum efficiency (thick solid lines), thermalization losses (thin solid lines), back-electrode losses (dashed lines) and semiconductor free-carrier absorption losses (dash-dotted lines); grey region is the Carnot limit on efficiency. On the right axis, FIG. 6A shows output load power density. FIG. 6B, left axis, shows optimal emitter plasma frequency (scaled to cutoff frequency of a SPP on interface with vacuum, to be compared with Table 1); dashed black line shows $E_g=4k_BT_e$, for guidance. FIG. 6B, right axis, shows optimal in-plane wave vector for lateral size of pillars. FIG. 6C shows optimal vacuum gap width. FIG. 6D shows optimal load voltage (normalized to $E_g$ and the Carnot efficiency). FIG. 6E shows optimal thickness of semiconductor thin film.

FIGS. 7A-7F show optimization results vs output load power density $P_l$, for different planar TPV systems: FIG. 4 with silver back electrode (blue lines at $T_e=1200°$ K, red lines at $T_e=3000°$ K), FIG. 9A with silver back electrode and $d_{a,base}=5\lambda_g$ (cyan lines at $T_e=1200°$ K, brown lines at $T_e=3000°$ K), FIG. 10A with silver back electrode and tungsten emitter substrate (green lines at $T_e=1200°$ K) and FIG. 11A with "tunable-silver" plasmonic back electrode (magenta lines at $T_e=3000°$ K). FIG. 7A shows efficiency; thick black line is max-efficiency parametrized by $T_e$ from FIG. 6A; dashed black line is efficiency vs $P_l$ when tuning only $T_e$ and V for a system fully-optimized for one value of $P_l$. FIG. 7B shows thermalization losses (solid lines), back-electrode losses (dashed lines) and semiconductor free-carrier absorption losses (dash-dotted lines). FIG. 7C shows optimal emitter plasma frequency (normalized to $E_g$). FIG. 7D shows optimal vacuum gap width. FIG. 7E shows optimal load voltage (normalized to $E_g$); results stay close to the Carnot efficiency values at the two examined $T_e$. The left and right axes of FIG. 7C show optimal thickness of semiconductor thin film and plasmonic back-electrode effective plasma frequency (normalized to silver plasma frequency), respectively.

FIGS. 8A-8H show spectra for optimized results of FIGS. 7A-7F blue line (FIG. 4 system at $T_e=1200°$ K) at 4 load-power levels indicated on FIG. 7 blue line: (A, B) $P_1$, (C, D) $P_2$, (E, F) $P_3$, (G, H) $P_4$. (A, C, E, G) TM emitter emissivity $\in_e(\omega,k_{xy})$; green line is the semiconductor-material radiation cone. (B, D, F, H) TM emitter power $P_e(\omega)$ (red line) and load power $P_l(\omega)$ (green line) densities at the optimal-efficiency load voltage.

FIGS. 9B-9E show spectra for optimized results of FIG. 7 cyan line (FIG. 9A system at $T_e=1200°$ K) at 2 load-power levels indicated on FIG. 7 blue line: (B, C) $P_1$, (D, E) $P_3$. (B, D) TM emitter emissivity $\in_e(\omega,k_{xy})$. (C, E) TM emitter power $P_e(\omega)$ (red line) and load power $P_l(\omega)$ (green line) densities at the optimal-efficiency load voltage.

FIGS. 13A-13K show optimization results vs front-electrode doping level (quantified via $\omega_{p,el}$), for TPV system of FIG. 12A with electrode-material parameters $\varepsilon_{\infty,el}=4$ and $\gamma_{el}=0.06\omega_{p,el}$, under the restriction $R_{el}=60\Omega$, at $T_e=3000°$ K, $T_a=300°$ K and with $E_g=4k_BT_e\approx1$ eV. FIG. 13A shows maximum efficiency. FIG. 13B shows optimal emitter plasma frequency (normalized to $E_g$). FIG. 13C shows optimal vacuum gap width. FIG. 13D shows optimal load voltage (normalized to $E_g$ and the Carnot efficiency). FIG. 13E shows optimal thickness of semiconductor thin-film/depletion region. FIGS. 13F-13K show spectra for optimized results at 3 values of $\omega_{p,el}$ indicated on FIG. 13A: (F, G) $\omega_{p,1}$, (H, I) $\omega_{p,2}$, (J, K) $\omega_{p,3}$. (F, H, J) TM emitter emissivity $\in_e(\omega,k_{xy})$. (G, I, K) TM emitter power $P_e(\omega)$ (red line) and load power $P_l(\omega)$ (green line) densities at the optimal-efficiency load voltage.

FIGS. 15A-15G shows optimization results vs emitter temperature $T_e$, for different front-electrode material choices, with $R_{el}=60\Omega$. FIG. 15A shows maximum efficiency; grey region is the Carnot limit on efficiency. FIG. 15B shows optimal emitter plasma frequency (scaled to cutoff frequency of a SPP on interface with vacuum, to be compared with Table 1); dash-dot black line shows $E_g=4k_BT_e$, for guidance. FIG. 15C shows optimal vacuum gap width. FIG. 15D shows optimal front-electrode plasma frequency (to be compared with FIG. 14); dash-dot black line shows $E_g=4k_BT_e$, for guidance. FIG. 15E shows optimal front-electrode TCO thin-film or semiconductor region thickness. FIG. 15F shows optimal load voltage (normalized to $E_g$ and the Carnot efficiency). FIG. 15G shows optimal thickness of semiconductor depletion region.

FIGS. 16A-16G show optimization results vs front-electrode square resistance $R_{el}$, for different front-electrode material choices, at $T_e=3000°$ K and $E_g=4k_BT_e=1.03$ eV. FIG. 16A shows maximum efficiency; grey region is the Carnot limit on efficiency. FIG. 16B shows optimal plasma frequency (scaled to cutoff frequency of a SPP on interface with vacuum, to be compared with Table 1). FIG. 16C shows optimal vacuum gap width. FIG. 16D shows optimal front-electrode plasma frequency (to be compared with FIG. 14). FIG. 16E shows optimal front-electrode TCO thin-film or semiconductor region thickness. FIG. 16F shows optimal load voltage (normalized to $E_g$ and the Carnot efficiency). FIG. 16G shows optimal thickness of semiconductor depletion region.

FIG. 20A shows an integrated micro-burner and thermophotovoltaic converter controlled by a control feedback system.

FIG. 20B shows an integrated solar absorber and thermophotovoltaic converter with a control feedback system.

FIGS. 21A-21D show an example method of fabricating TPV cells like those used in the system shown in FIG. 20A.

DETAILED DESCRIPTION

Figures 1A, 1B, 1C:
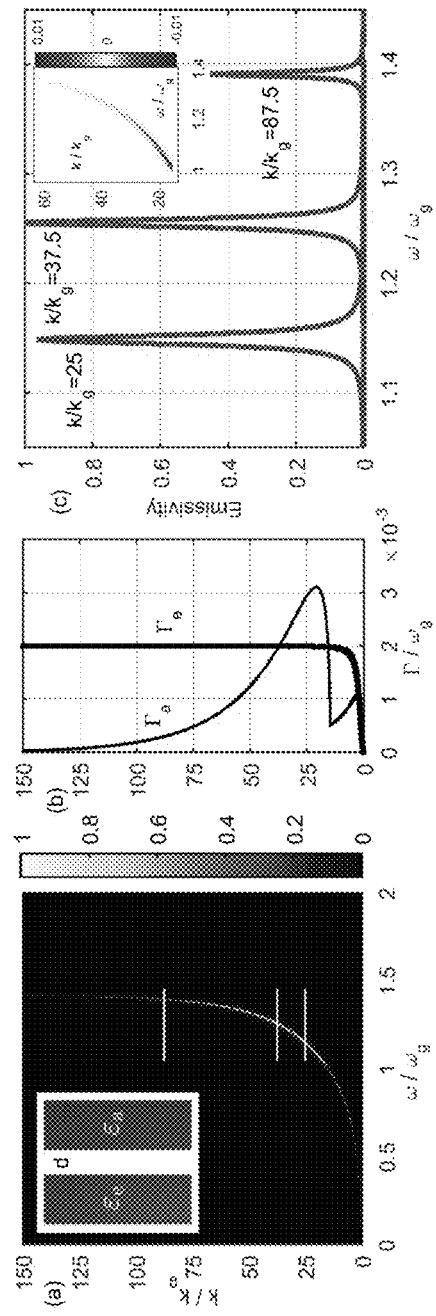
FIG. 1A shows transverse magnetic (TM) emitter emissivity $\in_e(\omega,k)$ for structure shown in inset with $d=0.003\lambda_g$. The structure in the inset includes a semi-infinite plasmonic emitter (left) and a semi-infinite semiconductor absorber (right) spaced across a narrow vacuum gap.
FIG. 1B shows loss rates $\Gamma_e(k)$ and $\Gamma_a(k)$ of single resonant mode.
FIG. 1C shows exact (solid) and Coupled Mode Theory (CMT) (dashed) calculations of emitter emissivity $\in_e(\omega,k)$ for the three k-cross-sections indicated with white lines in FIG. 1A; the inset shows algebraic error of CMT method for emitter emissivity.

Radiative Transfer of Thermal Energy (Definitions and Calculation Methods) Fluctuation-Dissipation Theorem (FDT)

Consider an isotropic object of a relative dielectric permittivity, $\varepsilon$, that can absorb electromagnetic fields or photons, when at zero absolute temperature and without any voltage across it. Using $\exp(-i\omega t)$ time dependence for the fields, this implies $\mathrm{Im}\{\varepsilon\}>0$. Then, if it is brought at a non-zero absolute temperature, T, and optionally has a voltage, V, across it, then the thermally excited molecules, atoms and electrons act as randomly fluctuating sources of electromagnetic fields or photons. These fluctuating sources can be modeled via the fluctuation-dissipation theorem (FDT) as current sources, $J(r, \omega)$, at position r and angular frequency $\omega$, with spatial correlation function $$\langle J_\alpha(\omega, r) J_\beta(\omega, r') \rangle = \frac{\omega \varepsilon_o \varepsilon''(\omega, r)}{\pi} \hbar \omega \Theta(\omega, V, T) \cdot \delta(r - r') \delta_{\alpha\beta} \quad (1)$$

where $$\Theta(\omega, V, T) = \frac{1}{e^{\frac{\hbar\omega - qV}{k_B T}} - 1} \quad (2)$$

is the mean number of generated photons of frequency $\omega$ in thermo-chemical quasi-equilibrium at voltage V and temperature T$\varepsilon_o$ is the dielectric permittivity of free space, $\varepsilon''$ is the imaginary part of $\varepsilon$, $\hbar$ is the Planck constant divided by $2\pi$, q is the electronic charge of an electron, $k_B$ is the Boltzmann constant, $\delta(r'-r'')$ is the Dirac delta function and $\delta_{\alpha\beta}$ is the Kronecker delta. In $\Theta$ the term 1/2 that accounts for vacuum fluctuations is omitted, since it does not affect the exchange of energy between objects.

Transmission of Electromagnetic Power (Photons) from a Hot Object to a Cold Object Poynting's theorem is a statement of conservation of energy, stating that the electromagnetic power exiting a closed surface area, A, is equal to the electromagnetic power generated due to sources, J, inside the enclosed volume, V, minus the electromagnetic power absorbed by the volume, V.

$$\oint_A dA \cdot \frac{1}{2}\mathrm{Re}\{E \times H^*\} = \int_V dr \cdot \frac{1}{2}\mathrm{Re}\{-E \cdot J^*\} - \int_V dr \frac{\omega \varepsilon_o \varepsilon''}{2}|E|^2 \quad (3)$$

If we denote as j an object at a non-zero absolute temperature, T, and optionally with a voltage, V, across it, to calculate the net power, $P_{ij}$, absorbed by another object i at a zero absolute temperature and voltage due to the thermal current-sources inside object j, one needs to integrate over all frequencies the power per unit frequency, $\rho_{ij}(\omega)$, absorbed at each frequency $\omega$. In Poynting's theorem, Eq. (3), we identify $\rho_{ij}(\omega)$ as $$p_{ij}(\omega) = 4 \cdot \frac{\omega \varepsilon_o}{2} \int_{V_i} dr_i \varepsilon_i''(\omega, r_i) \langle E_{i,\gamma}(r_i) \cdot E_{i,\gamma}^*(r_i) \rangle \quad (4)$$

where here an extra factor of 4 has been added in the definition of the time-averaged power, since only positive frequencies are considered in the Fourier decomposition of the time-dependent fields into frequency-dependent quantities.

The electric field, $E_i(r_i)$, due to sources, $J_j(r_j)$, can be calculated via the Green's function for the electric field, $G^E(\omega; r_i, r_j)$, from the convolution integral $$E_i(r_i) = i\omega\mu_o \int_{V_j} dr_j G^E(\omega; r_i, r_j) \cdot J_j(r_j) \quad (5)$$

where $\mu_o$ is the magnetic permeability of free space.

Using Eq. (5), the power per unit frequency Eq. (4) can be written $$p_{ij}(\omega) = 4 \cdot \frac{\omega \varepsilon_o (\omega \mu_o)^2}{2} \int_{V_i} dr_i \varepsilon_i''(\omega, r_i) \quad (6)$$

$$\left\langle \int_{V_j} dr_j G_{\gamma\alpha}^E(r_i, r_j) J_{j,\alpha}(r_j) \int_{V_j} dr_j' G_{\beta\gamma}^{E*}(r_i, r_j') J_{j,\beta}^*(r_j') \right\rangle$$

Using the FDT from Eq. (1), we get the average power per unit frequency $$p_{i,j}(\omega) = \frac{\hbar\omega}{2\pi} \Theta(\omega, V, T) \cdot 4k_o^4 \quad (7)$$

$$\int_{V_i} dr_i \varepsilon_i''(\omega, r_i) \int_{V_j} dr_j \varepsilon_j''(\omega, r_j) G_{\gamma\alpha}^{E*}(r_i, r_j) G_{\alpha\gamma}^{E*}(r_i r_j)$$

where $k_o = \omega\sqrt{\varepsilon_o\mu_o} = \omega/c$ is the wavevector of propagation in free space and c the speed of light in free space.

We define the thermal transmissivity, $\in_{ij}(\omega)$, of photons from object j to object i via the net power absorbed by object i due to thermal sources in j $$p_{ij} = \int_0^\infty d\omega p_{ij}(\omega) = \int_0^\infty \frac{d\omega}{2\pi} \hbar\omega \Theta(\omega, V, T) \epsilon_{ij}(\omega) \quad (8)$$

therefore, from Eqs. (7) and (8), we get $$\in_{ij}(\omega)=4k_o^4 \int_{V_j} dr_j \int_{V_i} dr_i \varepsilon_j''(\omega,r_j)\varepsilon_i''(\omega,r_i) G_{\gamma\alpha}^E(\omega;r_i,r_j) G_{\alpha\gamma}^{E*}(\omega;r_i,r_j) \quad (9)$$

From the expression of the thermal transmissivity, Eq. (9), it can be seen that it is dimensionless (G has units of $m^{-1}$) and it depends only on the geometry and material selection and not on the temperatures or voltages of the two objects. Furthermore, when the system is reciprocal, then $G(\omega;r_i,r_j)= G^T(\omega;r_j,r_i)$ and, as a consequence, from Eq. (9)

$$\in_{ij}(\omega)=\in_{ji}(\omega) \quad (10)$$

One could, in principle, calculate the transmissivity via Eq. (9), however, this expression needs the calculation of two volume integrals (in $V_i$ and $V_j$), which make it cumbersome either analytically or numerically. Instead, there is a simpler method to calculate the same quantity with only one integral. From Poynting's theorem, Eq. (3), and from Eq. (4), the power per unit frequency absorbed in object i due to the thermal current-sources inside object j can be written as $$p_{ij}(\omega) = 4 \cdot \int_{V_i} dr_i \frac{1}{2}\text{Re}\{-\langle E_{i,\alpha} J_{j,\alpha}^* \rangle\} - 4 \cdot \varepsilon_{\alpha\beta\gamma} \oint_{A_i} dA_{i,\alpha} \frac{1}{2}\text{Re}\{\langle E_{i,\beta} H_{i,\gamma}^* \rangle\} \quad (11)$$

where $\varepsilon_{\alpha\beta\gamma}$ is the Levi-Civita symbol for outer product between vectors.

The first term on the right-hand side of Eq. (11) is non-zero, only in the case where we are calculating the power absorbed inside an object due to the thermal sources inside the same object, namely i and j coincide, which we denote with a Kronecker delta $\delta_{ij}$. For thermal power transmission between different objects, this term is zero.

The first term (A), where i=j, can be calculated using the Green's function for the electric field, Eq. (5)

$$(A) = 4 \cdot \int_{V_j} dr_j \text{Re}\left\{-\frac{i\omega\mu_o}{2}\left\{\int_{V_j} dr_j' G_{\alpha\mu}^E(r_j, r_j') J_{j,\mu}(r_j') J_{j,\alpha}^*(r_j)\right\}\right\} \delta_{ij} \quad (12)$$

while the second term (B) needs also the Green's function for the magnetic field $$H_i(r_i) = \int_{V_j} dr_j G^H(\omega; r_i, r_j) \cdot J_j(r_j) \quad (13)$$

$$(B) = -4\varepsilon_{\alpha\beta\gamma} \oint_{A_i} dA_{i,\alpha} \text{Re} \quad (14)$$

$$\left\{\frac{i\omega\mu_o}{2}\left(\int_{V_j} dr_j G_{\beta\mu}^E(r_i, r_j) J_{j,\mu}(r_j) \int_{V_j} dr_j' G_{\gamma\nu}^{H*}(r_i, r_j') J_{j,\nu}^*(r_j')\right)\right\}$$

Using the FDT from Eq. (1), we get the average power per unit frequency $$p_{ij}(\omega) = \frac{\hbar}{2\pi}\Theta(\omega, V, T) \cdot 4k_o^2 \int_{V_j} dr_j \varepsilon_j''(\omega, r_j)\text{Im}\{G_{\alpha\alpha}^E(r_j, r_j)\}\delta_{ij} + \quad (15)$$

$$\frac{\hbar\omega}{2\pi}\Theta(\omega, V, T) \cdot 4k_o^2 \varepsilon_{\alpha\beta\gamma}$$

-continued $$\oint_{A_i} dA_{i,\alpha} \int_{V_j} dr_j \varepsilon_j''(\omega, r_j)\text{Im}\{G_{\beta\mu}^E(r_i, r_j) G_{\gamma\mu}^{H*}(r_i, r_j)\}$$

Therefore the transmissivity, from Eq. (8) and (15), is $$\in_{ij}(\omega)=4k_o^2 \int_{V_j} dr_j \varepsilon_j''(\omega,r_j) \text{Im}\{G_{\alpha\alpha}^E(r_j,r_j)\}\delta_{ij} + \varepsilon_{\alpha\beta\gamma}$$
$$\oint_{A_i} dA_{i,\alpha} G_{\beta\mu}^E(r_i,r_j) G_{\gamma\mu}^{H*}(r_i,r_j)\} \quad (16)$$

where, again, the first term is only present if we are calculating the power absorbed inside an object j due to the thermal sources inside the same object. Both terms involve now only one volume integral and the second term also a simpler surface integral, so Eq. (16) should be the preferred method of transmissivity calculation.

We also define the thermal emissivity, $\in_j(\omega)$, of object j via the net power emitted outwards by object j due to its thermal sources. Clearly, the net power emitted outwards by object j must be the sum of the powers transmitted to all other absorbing objects and the power radiated into infinity. If radiation is also regarded as an "object", then $\in_j(\omega)= \Sigma_{i\neq j}\in_{ij}(\omega)$. In general, it is straightforward to show that $$\in_j(\omega)=4k_o^2 \int_{V_j} dr_j \varepsilon_j''(\omega,r_j)\text{Im}\{\varepsilon_{\alpha\beta\gamma}\oint_{A_j} dA_{j,\alpha}' G_{\beta\mu}^E(r_j',r_j) G_{\gamma\mu}^{H*}(r_j',r_j)\} \quad (17)$$

Using Eq. (16) with i=j and (17), one can write a "thermal form" of the power conservation Poynting's theorem Eq. (3) for an object j, stating that the power generated by the thermal sources inside j is either emitted outwards ($\in_j$) or reabsorbed inside it ($\in_{jj}$):

$$\in_{jj}(\omega)=4k_o^2 \int_{V_j} dr_j \varepsilon_j''(\omega,r_j) \text{Im}\{G_{\alpha\alpha}^E(r_j,r_j)\} - \in_j(\omega) \quad (18)$$

Note that, if the object j is of infinite extent, the integral term in Eq. (18) (same as first term in Eq. (16)) also diverges to infinity. Therefore, when in need to calculate the self-reabsorption term $\in_{jj}$, we typically restrict ourselves to a finite object j, which is also practically reasonable to assume.

Note that, similar to Eq. (8), also the net rate of photons, $R_{ij}$, emitted from object j and absorbed by object i can be found by simply removing the energy per photon $\hbar\omega$, therefore $$R_{ij} = \int_0^\infty \frac{d\omega}{2\pi}\Theta(\omega, V, T)\in_{ij}(\omega) \quad (19)$$

Transmission of Electromagnetic Power (Photons) for Linear Systems

Consider a thermal-power transmission system that varies only in two (xy) directions and is uniform and of infinite (practically very large) extent in the third (z) direction. Then, the Green's function between the emitter linear object j and the absorber linear object i can be written via its Fourier transform $$G^{E,H}(\omega; r_i, r_j) = \int \frac{dk_z}{2\pi} g^{E,H}(\omega, k_z; \rho_i, \rho_j) e^{ik_z z} \quad (20)$$

where $\rho_i=(x_i,y_i)$. Then in Eq. (7), if $k_z$ and $k_z'$ are the integration variables for the two instances of the Green's function, the integral $\int dz_j$ gives a result $\delta(k_z-k_z')$ and the integral $\int dz_i$ gives the total linear (large) length L of the system. Therefore, the power per unit length becomes $$\frac{P_{ij}}{L} = \int_0^\infty \frac{d\omega}{2\pi} \hbar\omega\Theta(\omega, V, T) 4k_o^4 \int_{A_i} d\rho_i \varepsilon_i''(\omega, \rho_i) \quad (21)$$

$$\int_{A_j} d\rho_j \varepsilon_j''(\omega, \rho_j) \int_{-\infty}^{+\infty} \frac{dk_z}{2\pi} g_{\gamma\alpha}^E(\rho_i, \rho_j) g_{\alpha\gamma}^{E*}(\rho_i, \rho_j)$$

If we define again the dimensionless thermal transmissivity, $\in_{ij}(\omega, k_z)$, via $$\frac{P_{ij}}{L} = \int_0^\infty \frac{d\omega}{2\pi} \hbar\omega\Theta(\omega, V, T) \int_{-\infty}^{+\infty} \frac{dk_z}{2\pi} \epsilon_{ij}(\omega, k_z) \quad (22)$$

then from Eq. (28) and (29) we get $$\in_{ij}(\omega,k_z) = 4k_o^4 \int_{A_j} d\rho_j \int_{A_i} d\rho_i \varepsilon_j''(\omega,\rho_j) \varepsilon_i''(\omega,\rho_i) g_{\gamma\alpha}^E(\omega, k_z; \rho_i, \rho_j) g_{\alpha\gamma}^{E*}(\omega, k_z; \rho_i, \rho_j) \quad (23)$$

which is the same as Eq. (9), only with surface instead of volume integrals and the Green's functions replaced by their Fourier transforms. Similarly, Eq. (16) can be used for the calculation of transmissivity for linear systems with the same modifications.

$$\in_{ij}(\omega,k_z) = 4k_o^2 \int_{A_j} d\rho_j \varepsilon_j''(\omega,\rho_j) Im\{g_{\alpha\alpha}^E(\omega,k_z;\rho_j,\rho_j)\delta_{ij} + \varepsilon_{\alpha\beta\gamma} \oint_{L_u} dL_{i,\alpha} g_{\beta\mu}^E(\omega,k_z;\rho_i,\rho_j) g_{\gamma\mu}^{H*}(\omega,k_z;\rho_i,\rho_j)\} \quad (24)$$

The thermal emissivity, $\in_j(\omega,k_z)$, of object j is, for a linear system:

$$\in_j(\omega,k_z) = -4k_o^2 \int_{A_j} d\rho_j \varepsilon_j''(\omega,\rho_j) Im\{\varepsilon_{\alpha\beta\gamma} \oint_{L_j} dL_{j,\alpha}' g_{\beta\mu}^E(\omega,k_z;\rho_j',\rho_j) g_{\gamma\mu}^{H*}(\omega,k_z;\rho_j',\rho_j)\} \quad (25)$$

The "thermal form" of Poynting's theorem for an object j in a linear systems is:

$$\in_{jj}(\omega,k_z) = 4k_o^2 \int_{A_j} d\rho_j \varepsilon_j''(\omega,\rho_j) Im\{g_{\alpha\alpha}^E(\omega,k_z;\rho_j,\rho_j)\} - \in_j (\omega,k_z) \quad (26)$$

Transmission of Electromagnetic Power (Photons) for Planar Systems

Consider a thermal-power transmission system that varies only in one (z) direction and is uniform and of infinite (or practically very large) extent in the other two (xy) directions. Let this planar system include N layers, of dielectric permittivities $\varepsilon_n$ and thicknesses $d_n$, stacked down-up. Let the structure be rotated, so that the emitting layer j is below or the same as the absorbing layer i, $1 \leq j \leq i \leq N$. The layers 1 and N might be semi-infinite (unbounded) or bounded by a Perfect Electric Conductor (PEC) or a Perfect Magnetic Conductor (PMC).

A PEC can be implemented practically over a large range of frequencies by a metal with very large plasma frequency, low loss rate and thickness much larger than the skin depth or over a smaller range of frequencies and wave vectors by a photonic-crystal structure with a bandgap (such as an omni-directional mirror. A PMC can be implemented practically over a small range of frequencies by structured metallo-dielectric photonic crystals with a bandgap designed to reflect an incident electric field without any phase-shift.

For the planar system under investigation, the Green's function between the emitter layer j and the absorber layer i can be written via its Fourier transform $$G^{E,H}(\omega; r_i, r_j) = \int\int \frac{dk_x dk_y}{(2\pi)^2} g^{E,H}(\omega, k_{xy}; z_i, z_j) e^{ik_x x + ik_y y} \quad (27)$$

where $k_{xy} = \sqrt{k_x^2 + k_y^2}$. Then in Eq. (7), if $k_x$, $k_y$ and $k_x'$, $k_y'$ are the integration variables for the two instances of the Green's function, the integral $\int dx_j dy_j$ gives a result $\delta(k_x - k_x')\delta(k_y - k_y')$ and the integral $\int dx_i dy_i$ gives the total transverse (large) area A of the system. Therefore, using also that $\iint_{-\infty}^{+\infty} dk_x dk_y = 2\pi \int_0^\infty k_{xy} dk_{xy}$, the power per unit area becomes $$\frac{P_{ij}}{A} = \int_0^\infty \frac{d\omega}{2\pi} \hbar\omega\Theta(\omega, V, T) 4k_o^4 \quad (28)$$

$$\int_{d_i} dz_i \varepsilon_i''(\omega, z_i) \int_{d_j} dz_j \varepsilon_j''(\omega, z_j) \int_0^\infty \frac{k_{xy} dk_{xy}}{2\pi} g_{\gamma\alpha}^E(z_i, z_j) g_{\alpha\gamma}^{E*}(z_i, z_j)$$

If we define again the dimensionless thermal transmissivity, $\in_{ij}(\omega, k_{xy})$, via $$\frac{P_{ij}}{A} = \int_0^\infty \frac{d\omega}{2\pi} \hbar\omega\Theta(\omega, V, T) \int_0^\infty \frac{k_{xy} dk_{xy}}{2\pi} \epsilon_{ij}(\omega, k_{xy}) \quad (29)$$

then from Eq. (28) and (29) we get $$\in_{ij}(\omega,k_{xy}) = 4k_o^4 \int_{d_j} dz_j \int_{d_i} dz_i \varepsilon_j''(\omega,z_j) \varepsilon_i''(\omega,z_i) g_{\gamma\alpha}^E(\omega,k_{xy};z_i,z_j) g_{\alpha\gamma}^{E*}(\omega,k_{xy};z_i,z_j) \quad (30)$$

which is the same as Eq. (9), only with linear instead of volume integrals and the Green's functions replaced by their Fourier transforms. Similarly, Eq. (16) can be used for the calculation of transmissivity for planar systems with the same modifications.

$$\in_{ij}(\omega,k_{xz}) = 4k_o^2 \int_{d_j} dz_j \varepsilon_j''(\omega,z_j) Im\{g_{\alpha\alpha}^E(\omega,k_{xy};z_j,z_j)\delta_{ij} + \varepsilon_{\beta\gamma} g_{\beta\mu}^E(\omega,k_{xy};z_i,z_j) g_{\gamma\mu}^{H*}(\omega,k_{xy};z_i,z_j)|_{z_{i,min}}^{z_{i,max}}\} \quad (31)$$

where $\beta$, $\gamma$ run now only through x, y in Cartesian coordinates or $\rho$, $\theta$ in cylindrical coordinates.

The thermal emissivity, $\in_j (\omega, k_{xy})$, of object j is, for a planar system:

$$\in_j(\omega,k_{xy}) = -4k_o^2 \int_{d_j} dz_j \varepsilon_j''(\omega,z_j) Im\{\varepsilon_{\beta\gamma} g_{\beta\mu}^E(\omega,k_{xy};z_j',z_j) g_{\gamma\mu}^{H*}(\omega,k_{xy};z_j',z_j)|_{z_{j,min}}^{z_{j,max}}\} \quad (32)$$

The "thermal form" of Poynting's theorem for an object j in a planar systems is:

$$\in_{jj}(\omega,k_{xy}) = 4k_o^2 \int_{d_j} dz_j \varepsilon_j''(\omega,z_j) Im\{g_{\alpha\alpha}^E(\omega,k_{xy};z_j,z_j)\} - \in_j (\omega,k_{xy}) \quad (33)$$

Planar Thermal Transmissivity and Emissivity Calculation at Layer Boundaries

We see that in planar systems, the surface integral of Eq. (16) and (17) conveniently converts in Eq. (31) and (32) to two simple evaluations at the limiting z coordinates of the layer i or j boundaries. These two limits capture the net power exiting or entering layer i, of thickness $d_i = z_{i,max} - z_{i,min}$, and are not always both present (non-zero).

When calculating the transmissivity $\in_{ij}$ between two different layers $i \neq j$, the first term in Eq. (31) is zero. With the emitter layer j below the absorber layer i:

If layer i is semi-infinite (practically very thick, $z_{i,max} \to \infty$), the net power entering layer i is the power entering layer i from below, as it may all be absorbed inside this layer, so the $z_{i,max}$ term in Eq. (31) does not exist.

If above layer i there is a perfect reflector (such as a PEC or PMC) or the field is purely evanescent as $z \to \infty$ at $(\omega, k_{xy})$ and there are potentially other lossless material layers in-between, the net power entering layer i is the power entering layer i from below, since above layer i no power can be absorbed in any layer or radiated into infinity, so the $z_{i,max}$ term in Eq. (31) is zero, at that $(\omega,k_{xy})$.

Otherwise, the net power entering layer i, at that $(\omega,k_{xy})$, is the power entering layer i from below minus the power leaving layer i above it, which may be absorbed in the lossy layers or radiated into infinity.

When calculating the emissivity $\in_j$ of layer j via Eq. (32), then:

If layer j is semi-infinite ($z_{j,max} \to \infty$), no emitted power ever leaves the layer towards $z \to \infty$, so the $z_{j,max}$ term in Eq. (32) does not exist.

If above the finite layer j there is a perfect reflector or the field is purely evanescent as $z \to \infty$ at $(\omega,k_{xy})$ and there are potentially other lossless-material layers in-between, then no power can be emitted above the layer, as no power can be absorbed in any other layer or radiated into infinity, so the $z_{j,max}$ term in Eq. (32) is zero, at that $(\omega,k_{xy})$.

Otherwise, some power may be emitted above, at that $(\omega,k_{xy})$, which may be absorbed in the lossy layers or radiated into infinity.

Similarly, for below the layer j and the $z_{j,min}$ term in Eq. (32).

When calculating the self-reabsorption term $\in_{jj}$ of layer j via Eq. (33), again, we typically assume that layer j is finite, so that the integral in Eq. (33) does not diverge.

Scattering-Matrix Formalism for Planar Thermal Transmissivity Calculation

For planar systems, in order to calculate $\in_{ij}(\omega,k_{xy})$ from Eq. (31), one can construct a semi-analytical expression for the Green's functions, g, using a scattering matrix formalism, and then perform the integration in $z_j$ analytically. We use the procedure outlined by M. Francoeur, M. P. Mengüç and R. Vaillon, "Solution of near-field thermal radiation in one-dimensional layered media using dyadic Green's functions and the scattering matrix method," Journal of Quantitative Spectroscopy & Radiative Transfer, vol. 110, p. 2002, 2009, with the modification that we use the canonical scattering-matrix formulation:

For a two-port with ports I and II, waves incoming to the ports have amplitudes $a_I$, $a_{II}$—for example (E, H)$_{I,in}$=$a_I(\phi^E$, $\phi^H)_I$—and waves outgoing from the ports have amplitudes $b_I$, $b_{II}$, where the wavefunctions $\phi^E$, $\phi^H$ are normalized so that, for example for an incoming wave at port I (propagating along $+\hat{z}$):

$$\frac{1}{2} E_{I,in} \times H_{I,in} \cdot \hat{z} = a_I^2 \leftrightarrow \frac{1}{2} \Phi_I^E \times \Phi_I^H \cdot \hat{z} = 1.$$

Then the scattering matrix is defined by $$\begin{pmatrix} b_I \\ b_{II} \end{pmatrix} = \overline{S} \cdot \begin{pmatrix} a_I \\ a_{II} \end{pmatrix} \quad (34)$$

With this definition, the scattering matrix is symmetric ($\overline{S}=\overline{S}^T$) for reciprocal systems and unitary ($\overline{S}^\dagger \overline{S}=\overline{I}$) for lossless systems.

For calculation of a scattering matrix at the interface between layers i and j, we use the sign convention that the reflection coefficient of a wave incident from layer i is $r_{ij}=-r_{ji}=(X_i-X_j)/(X_i+X_j)$, where the admittance of a transverse electric (TE) wave in layer n is $X_n=k_{z,n}/\omega\in_n$, and the impedance of a transverse magnetic (TM) wave in layer n is $X_n=k_{z,n}/\omega\mu_o$. Note that, with this convention, at $k_{xy}=0$, where the TE and TM waves are identical, the reflection coefficient has opposite sign for the two polarizations.

For the thermal system of planar layers, we define the amplitude coefficients of the forward (upward) and backward (downward) propagating (or evanescent) waves inside each layer at the middle of the layer, except for the cases of a semi-infinite bottom layer 1 or a semi-infinite top layer N, for which they are defined at their only interface.

The first step is to find the amplitude coefficients at the layer j. Let $\overline{S}_{1,j}$ be the scattering matrix between the layers 1 and j (where $$\overline{S}_{1,j} = \begin{pmatrix} 0 & 1 \\ 1 & 0 \end{pmatrix}$$

if j=1 and the layer is semi-infinite), and $\overline{S}_{jN}$ the scattering matrix between the layers j and N. Also let $r_1=0$, if the bottom boundary of layer 1 is open (semi-infinite), $r_1=-1$, if it is PEC for TE polarization (electric field in the xy plane) or PMC for TM polarization, and $r_1=1$, if it is PMC for TE polarization or PEC for TM polarization (magnetic field in the xy plane). Similarly $r_N=0$ or $-1$ or $1$ for the top boundary of layer N. Then, we define the coefficients:

$$S_{1,j} = \frac{\overline{S}_{1j}(1,2)\overline{S}_{1j}(2,1)r_1}{1-\overline{S}_{1j}(1,1)r_1} + \overline{S}_{1j}(2,2) \quad (35)$$

$$S_{N,j} = \frac{\overline{S}_{jN}(2,1)\overline{S}_{jN}(1,2)r_N}{1-\overline{S}_{jN}(2,2)r_N} + \overline{S}_{jN}(1,1)$$

and $$A_j = B_j S_{1,j} = C_j S_{N,j} = D_j = \frac{S_{1,j} S_{N,j}}{1-S_{1,j} S_{N,j}} \quad (36)$$

Note that:
if layer j=1 and the layer is semi-infinite ($r_1=0$), $S_{1,1}=0=A_1=C_1=D_1$ and $B_1=S_{N,1}$.
if layer j=N and the layer is semi-infinite ($r_N=0$), $S_{N,N}=0=A_N=B_N=D_N$ and $C_N=S_{1,N}$.

Using the Green's functions expansion in M. Francoeur, M. P. Mengüç and R. Vaillon, "Solution of near-field thermal radiation in one-dimensional layered media using dyadic Green's functions and the scattering matrix method," Journal of Quantitative Spectroscopy & Radiative Transfer, vol. 110, p. 2002, 2009, the first term in Eq. (31) or (33), denoted by $\in_{J,j}$ is calculated as $$\epsilon_{J,j} = 4\text{Re}\left\{\frac{k'_{z,j} k''_{z,j}}{k_{z,j}^2}[(1+A_j+D_j)u_j + p(B_j+C_j)\sin(u_j)]\right\} \quad (37)$$

where $k_{z,j}=\sqrt{k_o^2 \in_j - k_{xy}^2}=k_{z,j}'+ik_{z,j}''$ the complex wavevector z-component, $u_j=k_{z,j}d_j=u_{z,j}'+iu_{z,j}''$ the complex propagation phase, and p=1 for TE waves or $p=(k_o^2-k_{z,j}^2)/(k_o^2+k_{z,j}^2)$ for TM waves. Again, for this term we are really only interested in the situation where layer j is finite ($d_j<\infty$). Note that, if a value is needed for a semi-infinite layer, one can provide one by removing the divergent parts and keeping only the structure-related terms:

if layer j=1 and is semi-infinite, $\in_{J,1}=4\text{Re}\{k_{z,1}'k_{z,1}''/k_{z,1}^2 [p(\overline{S}_{12}(1,1)-S_{N,1})/2i]\}$.

if layer j=N and is semi-infinite, $\in_{j,N}$=4Re{$k_{z,N}'k_{z,N}''$/ $k_{z,N}^2$[p($\overline{S}_{N-1,N}$(2,2)−$S_{1,N}$)/2i]}.

To calculate the second expression in Eq. (31), we then find the amplitude coefficients at layer i relative to those at layer j. Let $\overline{S}_{ji}$ be the scattering matrix between the layers j and i, and assume, without loss of generality, that j<i. We define the coefficients:

$$B_{ij} = \frac{B_j - (1+A_j)\overline{S}_{ji}(1,1)}{\overline{S}_{ji}(1,2)} \quad (38)$$

$$A_{ij} = (1+A_j)\overline{S}_{ji}(2,1) + B_{ij}\overline{S}_{ji}(2,2)$$

$$D_{ij} = \frac{D_j - C_j\overline{S}_{ji}(1,1)}{\overline{S}_{ji}(1,2)}$$

$$C_{ij} = C_j\overline{S}_{ji}(2,1) + D_{ij}\overline{S}_{ji}(2,2)$$

Let $x_n=X_n/|X_n|=x_n'+ix_n''$, and $R_n=2x_n'$ sin h($u_{z,n}''$), $I_n=2x_n''$ sin ($u_{z,n}'$), if layer n is finite, or $R_n=x_n'$, $I_n=x_n''$, if it is semi-infinite. Then we calculate $$\epsilon_{ij}(\omega, k_{xy}) = R_jR_i(A_{ij}A_{ij}^* + B_{ij}B_{ij}^* + C_{ij}C_{ij}^* + D_{ij}D_{ij}^*) + \quad (39)$$
$$R_jI_i(A_{ij}B_{ij}^* + B_{ij}A_{ij}^* + C_{ij}D_{ij}^* + D_{ij}C_{ij}^*) +$$
$$I_jR_i(A_{ij}C_{ij}^* + B_{ij}D_{ij}^* + C_{ij}A_{ij}^* + D_{ij}B_{ij}^*) +$$
$$I_jI_i(A_{ij}D_{ij}^* + B_{ij}C_{ij}^* + C_{ij}B_{ij}^* + D_{ij}A_{ij}^*)$$

Note that if layer j=1 and is semi-infinite, then $C_{i1}=D_{i1}=0$.

If, additionally, layer i=N and semi-infinite, then $A_{N1}=\overline{S}_{1N}(2,1)$ and $B_{N1}=0$, and $$\in_{N1}(\omega, k_{xy}) = x_1'x_N'|\overline{S}_{1N}(2,1)|^2 \quad (40)$$

A similar procedure can be followed if j>i.

Therefore, using Eq. (35)-(39), the transmissivity $\in_{ij}(\omega, k_{xy})$, as defined in Eq. (29), can be fully calculated for planar systems in a semi-analytical way.

Physical Interpretations of Transmissivity and Emissivity for Planar Systems

The transmissivity, $\in_{ij}(\omega,k_{xy})$, physically quantifies how many of the thermal photons per mode of frequency ω and wavevector $k_{xy}$, emitted from the emitter j, are absorbed by the absorber i. Therefore, it cannot be larger than 1, for each one of the two decoupled (for isotropic media) TE and TM polarizations. This can easily be seen for the special case of Eq. (40).

The emissivity, $\in_j(\omega,k_{xy})$, physically quantifies how many of the thermal photons per mode of frequency ω and wavevector $k_{xy}$, emitted from the emitter j, are absorbed by all other absorbing objects or radiated and lost into the infinite background. Therefore, it also cannot be larger than 1, for each one of the two decoupled (for isotropic media) TE and TM polarizations.

If the infinite background has refractive index $n_b$, the modes of the emitter layer j, which are evanescent in it ($k_{xy} \geq \omega n_b/c$), do not radiate into the background. Instead, only radiative modes ($k_{xy} < \omega n_b/c$) can reach the far field. Consider the case where all emission goes into radiation (no absorption) and the emissivity is the same for both polarizations and has the form:

$$\epsilon_j(\omega, k_{xy}) = \begin{cases} \tilde{\epsilon}_j(\omega) \leq 1, & \text{for } k_{xy} < \omega n_b/c \\ 0, & \text{for } k_{xy} \geq \omega n_b/c \end{cases} \quad (41)$$

Then, from Eq. (29), the $k_{xy}$-integral gives the background density of states $\rho_b(\omega)=\omega^2 n_b^2/4\pi c^2$, and we get $$\frac{P_j}{A} = \int_0^\infty \frac{d\omega}{2\pi} \hbar\omega\Theta(\omega, V, T)\frac{\omega^2 n_b^2}{4\pi c^2}2\tilde{\epsilon}_j(\omega) = \quad (42)$$
$$\int_0^\infty d\omega \frac{\hbar\omega^3 n_b^2}{4\pi^2 c^2}\Theta(\omega, V, T)\tilde{\epsilon}_j(\omega)$$

where the factor of 2 comes from accounting for both polarizations. We see that Eq. (42) coincides exactly with Planck's law of thermal radiation by a body with the commonly-defined emissivity $\tilde{\in}_j(\omega)$, which also by definition is not larger than 1.

We conclude that the emissivity, $\in_j(\omega,k_{xy})$, defined in this specification for planar systems is a generalization of the commonly-defined emissivity, $\tilde{\in}_j(\omega)$, with values between 0 and 1. It is wavevector-dependent and it depends on the geometry and materials, not only of the emitter but of the entire photonic system.

Superposition Principle

Consider a system of multiple objects, where each one may be at a non-zero absolute temperature, $T_j$, and may have a voltage, $V_j$, across it. The thermally-excited sources inside each object j generate photons with mean number $\Theta(\omega,V_j,T_j)$. To find the net rate of photons $R_i$ (or power $P_i$ equivalently) emitted by object i, one must successively set to zero the temperatures of all objects but one each time, and then apply the superposition principle.

$$R_i = \sum_j R_{ji} - R_{ij} = \quad (43)$$
$$\int \frac{d\omega}{2\pi}\left\{\Theta(\omega, V_i, T_i)\epsilon_i(\omega) - \sum_{j\neq i}\Theta(\omega, V_j, T_j)\epsilon_{ij}(\omega)\right\}$$

where the emissivity $\in_i(\omega)=\Sigma_{j\neq i}\in_{ji}(\omega)$. If the system is reciprocal, then $\in_{ij}(\omega)=\in_{ji}(\omega)$ and therefore Eq. (43) can also be written as $$R_i = \int \frac{d\omega}{2\pi}\sum_j [\Theta(\omega, V_i, T_i) - \Theta(\omega, V_j, T_j)]\epsilon_{ji}(\omega) \quad (44)$$

Coupled Mode Theory Formalism for Transmissivity and Emissivity Calculation

Temporal Coupled-Mode Theory (CMT) is a powerful semi-analytical tool, providing good approximate results for resonant physical systems, that has been used primarily in the field of photonics and recently to predict far-field thermal radiation emission from resonant thermal emitters and near-field thermal energy exchange between resonant surface states. Here, we extend these thermal-radiation CMT models to show how to easily calculate the thermal transmissivity $\in_{ij}$ between two objects i and j or the thermal emissivity $\in_i$ of an object i. We demonstrate the model use for both orthogonal and coupled resonances, and in the presence of background losses.

Consider a system of multiple objects, where each object n is at a non-zero absolute temperature $T_n$ and potentially has a voltage $V_n$ across it. At this thermal and chemical equilibrium, the excited sources inside lossy object n generate photons at every frequency ω with mean number $\Theta_n(\omega) = \Theta(\omega, V_n, T_n)$. To calculate the radiative thermal energy exchange between two lossy objects i, j typically requires complex and numerically intensive calculations, which can be hundreds of hours long in 3D geometries. However, if, in the appropriate frequency regime, the system supports a few well-defined resonant electromagnetic modes, which a typical mode solver can calculate in minutes at most, a CMT formalism can be used to provide an approximate, yet reliable, solution.

Single Resonance

Consider first the case where, for some frequency regime of interest, the system of multiple objects supports and can be approximately described by predominantly one resonant electromagnetic mode at frequency $\omega_o$ and with loss rates $\Gamma_n$ associated with different loss mechanisms of the various system objects and/or radiation into the background. Essentially, the Green's function has, in that frequency regime, a dominant single pole at $\omega_o$ and can be approximated by it.

Let a represent the amplitude of the mode, normalized such that $|a|^2$ equals the total "number of photons per unit frequency" stored in the mode. (Note the difference here with the standard definition where $|a|^2$ equals the total energy stored in the mode.) Then we can write the CMT equations:

$$\frac{d}{dt}a = \left(-i\omega_o - \sum_n \Gamma_n\right)a + \sum_n \sqrt{2\Gamma_n}\,\theta_{+n} \qquad (45)$$

$$\theta_{-n} = \sqrt{2\Gamma_n}\,a - \theta_{+n}$$

where $\langle \theta_{+n}\theta_{+n}^* \rangle = \Theta_n(\omega)$ is the mean number of ω-photons injected by the thermochemical reservoir at $T_n$ and $V_n$ into loss mechanism n, and similarly $\langle \theta_{-n}\theta_{-n}^* \rangle$ is the mean number of ω-photons reflected from loss mechanism n back into the reservoir. Since different reservoirs have independent statistics, $\langle \theta_{+n}\theta_{+i}^* \rangle = 0$.

In steady state at frequency ω, we substitute in Eq. (45) $da/dt = -i\omega a$, so the amplitude is $$a = \frac{i\sum_n \sqrt{2\Gamma_n}\,\theta_{+n}}{\omega - \omega_o + i\sum_n \Gamma_n} \qquad (46)$$

$$\Rightarrow \langle |a|^2 \rangle = \frac{\sum_n 2\Gamma_n \Theta_n(\omega)}{(\omega - \omega_o)^2 + (\sum_n \Gamma_n)^2}$$

Then, the net mean number of photons emitted by loss mechanism i is the difference of those injected into the mode minus those reflected back, namely $$N_i(\omega) = \langle |\theta_{+i}|^2 \rangle - \langle |\theta_{-i}|^2 \rangle = 2\sqrt{2\Gamma_i}\,\mathrm{Re}\{a\theta_{+i}^*\} - 2\Gamma_i\langle |a|^2 \rangle \qquad (47)$$

$$N_i(\omega) = \Theta_i(\omega)\sum_n \frac{4\Gamma_i\Gamma_n}{(\omega - \omega_o)^2 + (\sum_n \Gamma_n)^2} -$$

$$\sum_n \Theta_n(\omega)\frac{4\Gamma_i\Gamma_n}{(\omega - \omega_o)^2 + (\sum_n \Gamma_n)^2} =$$

$$\sum_{n \neq i} [\Theta_i(\omega) - \Theta_n(\omega)]\frac{4\Gamma_i\Gamma_n}{(\omega - \omega_o)^2 + (\sum_n \Gamma_n)^2}$$

Since the net rate of photons emitted by object i is $R_i = \int N_i(\omega)d\omega/2\pi$, comparing with Eq. (44), we confirm that the system is reciprocal and we calculate the thermal transmissivity between two objects i and j solely from the resonant properties of the electromagnetic mode:

$$\epsilon_{ij}(\omega) = \epsilon_{ji}(\omega) = \frac{4\Gamma_i\Gamma_j}{(\omega - \omega_o)^2 + (\sum_n \Gamma_n)^2} \qquad (48)$$

Furthermore, the thermal emissivity of an object i can be found from the net number of photons it emits at ω, if all other objects are at zero temperature, $N_i(\omega)|_{T_{j \neq i}=0} = \Theta_i(\omega)\epsilon_i(\omega)$:

$$\epsilon_i(\omega) = \sum_{j \neq i} \epsilon_{ji}(\omega) = \frac{4\Gamma_i\left(\sum_{j \neq i} \Gamma_j\right)}{(\omega - \omega_o)^2 + (\sum_n \Gamma_n)^2} \qquad (49)$$

In this case of a single resonance, both the emissivity $\epsilon_i$ and the transmissivity $\epsilon_{ij}$ have a Lorentzian spectrum and are smaller than 1. The emissivity $\epsilon_i$ is maximized to 1 at resonance $\omega = \omega_o$ and when the emitter loss rate $\Gamma_i$ is "matched" to the sum of the other loss rates $\Gamma_i = \sum_{j \neq i}\Gamma_j$, two conditions collectively known as "impedance matching" in electrical engineering and "Q-matching" in physics. The transmissivity $\epsilon_{ij}$ approaches 1, when no other lossy objects exist and the impedance matching conditions ($\omega = \omega_o$ and $\Gamma_i = \Gamma_j$) are satisfied.

Two Coupled Resonances

Let now the system support two resonant electromagnetic modes, one at frequency $\omega_1$ with loss rates $\Gamma_{1n}$ and one at frequency $\omega_2$ with loss rates $\Gamma_{2n}$, where the two modes are spatially separated and coupled to each other via their field tails with coupling coefficient κ. With $\theta_+$ and $\theta_-$ having the same interpretation as before, the CMT equations are now written as $$\frac{d}{dt}a_1 = \left(-i\omega_1 - \sum_n \Gamma_{1n}\right)a_1 + i\kappa a_2 + \sum_n \sqrt{2\Gamma_{1n}}\,\theta_{+1n} \qquad (50)$$

$$\frac{d}{dt}a_2 = \left(-i\omega_2 - \sum_n \Gamma_{2n}\right)a_2 + i\kappa a_1 + \sum_n \sqrt{2\Gamma_{2n}}\,\theta_{+2n}$$

$$\theta_{-1n} = \sqrt{2\Gamma_{1n}}\,a_1 - \theta_{+1n}$$

$$\theta_{-2n} = \sqrt{2\Gamma_{2n}}\,a_2 - \theta_{+2n}$$

In steady state at frequency ω, if we denote $\delta_1 = \omega - \omega_1 + i\sum_n \Gamma_{1n}$ and similarly for $\delta_2$, then $$\begin{bmatrix} a_1 \\ a_2 \end{bmatrix} = \frac{i}{\delta_1\delta_2 - \kappa^2}\begin{bmatrix} \delta_2 \sum_n \sqrt{2\Gamma_{1n}}\,\theta_{+1n} - \kappa\sum_n \sqrt{2\Gamma_{2n}}\,\theta_{+2n} \\ \delta_1 \sum_n \sqrt{2\Gamma_{2n}}\,\theta_{+2n} - \kappa\sum_n \sqrt{2\Gamma_{1n}}\,\theta_{+1n} \end{bmatrix} \qquad (51)$$

$$\Rightarrow \begin{bmatrix} \langle |a_1|^2 \rangle \\ \langle |a_2|^2 \rangle \end{bmatrix} =$$

$$\frac{1}{|\delta_1\delta_2 - \kappa^2|^2}\begin{bmatrix} |\delta_2|^2 \sum_n 2\Gamma_{1n}\langle |\theta_{+1n}|^2 \rangle - \kappa^2 \sum_n 2\Gamma_{2n}\langle |\theta_{+2n}|^2 \rangle \\ |\delta_1|^2 \sum_n 2\Gamma_{2n}\langle |\theta_{+2n}|^2 \rangle - \kappa^2 \sum_n 2\Gamma_{1n}\langle |\theta_{+1n}|^2 \rangle \end{bmatrix}$$

and the net number of photons emitted by the lossy object 1i is $$N_{1i}(\omega) = \langle |\theta_{+1i}|^2 \rangle - \langle |\theta_{-1i}|^2 \rangle = 2\sqrt{2\Gamma_{1i}} \operatorname{Re}\{a_1\theta_{+1i}^*\} - 2\Gamma_{1i}\langle |a_1|^2 \rangle \quad (52)$$

$$N_{1i}(\omega) = \sum\nolimits_{n \neq i} [\Theta_{1i}(\omega) - \Theta_{1n}(\omega)] \frac{4\Gamma_{1i}\Gamma_{1n}|\delta_2|^2}{|\delta_1\delta_2 - \kappa^2|^2} +$$
$$\sum\nolimits_n [\Theta_{1i}(\omega) - \Theta_{2n}(\omega)] \frac{4\Gamma_{1i}\Gamma_{2n}\kappa^2}{|\delta_1\delta_2 - \kappa^2|^2}$$

Therefore, for an absorber in the vicinity of the second resonant mode 2j, $$\epsilon_{1i,2j}(\omega) = \epsilon_{2j,1i}(\omega) = \frac{4\Gamma_{1i}\Gamma_{2j}\kappa^2}{|\delta_1\delta_2 - \kappa^2|^2} \quad (53)$$

This transmissivity spectrum shape is now a double-Lorentzian and it is still smaller than 1. At resonance $\omega = \omega_o \equiv \omega_1 = \omega_2$ and in the absence of other loss mechanisms in the system, the "impedance matching" condition, which makes the transmissivity equal 1 and locally flat, becomes $$\Gamma_{1i}\Gamma_{2j} = \eta_2 \quad (54)$$

For a symmetric system, where also $\Gamma_{1i} = \Gamma_{2j} \equiv \Gamma$, the transmissivity $\epsilon_{1i,2j} = 1$ (but not flat) at the two distinct frequencies $\omega = \omega_o \pm \sqrt{\kappa^2 - \Gamma^2}$. As expected, these two frequencies merge to a double solution at $\omega = \omega_o$, when $\kappa = \Gamma$, namely Eq. (54) is satisfied.

Note that, if the absorber was also in the vicinity of the first resonant mode 1j, just like the emitter 1i, then $$\epsilon_{1i,1j}(\omega) = \epsilon_{1j,1i}(\omega) = \frac{4\Gamma_{1i}\Gamma_{1j}|\delta_2|^2}{|\delta_1\delta_2 - \kappa^2|^2} \quad (55)$$

which correctly reduces to Eq. (48), if the two modes are decoupled ($\kappa = 0$) and thus they can be treated separately.

Finally, the emissivity of object 1i is $$\epsilon_{1i}(\omega) = \frac{4\Gamma_{1i}[(\sum_{n \neq i} \Gamma_{1n})|\delta_2|^2 + (\sum_n \Gamma_{2n})\kappa^2]}{|\delta_1\delta_2 - \kappa^2|^2} \quad (56)$$

The CMT model presented here can be applied also to a larger number of coupled resonant electromagnetic modes of the system.

Linear and Planar Systems and CMT Validation

When the electromagnetic system is invariant in one or two dimensions, the modes of the system can be enumerated via a conserved wavenumber $k_z$ and $k_{xy}$ respectively, where two modes of different wavenumbers are orthogonal to each other. Therefore, one can use superposition over the wavenumber and arrive at Eqs. (22) and (29), by redefining the transmissivity (and similarly the emissivity) from Eqs. (48) or (53) via the substitution $$\epsilon_{ij}(\omega) \to L \int_{-\infty}^{+\infty} \frac{dk_z}{2\pi} \epsilon_{ij}(\omega, k_z)$$

for linear systems and $$\epsilon_{ij}(\omega) \to A \int_0^\infty \frac{k_{xy}dk_{xy}}{2\pi} \epsilon_{ij}(\omega, k_{xy})$$

for planar systems. The wavenumber dependence of the transmissivity and emissivity calculated via CMT stems from the wavenumber dependence of the resonant frequencies, loss and coupling rates.

The impedance matching condition is then also wavenumber-dependent. Typically, a main parameter that can be used to achieve impedance matching between the emitter and absorber, either for a single or for two coupled resonances, is the distance between the two objects. For smaller distances, it can be accomplished at higher wavenumbers and vice versa.

To test the accuracy of the CMT model, we analyze a planar system of a semi-infinite plasmonic (e.g., metallic) emitter e separated by a small vacuum gap of thickness d from a semi-infinite semiconductor absorber a (FIG. 1A inset). The interband-absorption profile for a direct-bandgap semiconductor of relative dielectric permittivity $\varepsilon_a(\omega) = \varepsilon_a' + i\varepsilon_a''(\omega)$ scales as $\alpha_g(\omega) \approx \omega \varepsilon_g''(\omega)/c\sqrt{\varepsilon_a'} \sim \sqrt{\omega - \omega_g}$, therefore $\varepsilon_g''(\omega) \approx M\sqrt{\varepsilon_a'\omega_g(\omega - \omega_g)}/\omega$. The dimensionless constant M depends on the conduction-band electron and valence-band hole effective masses, and we found it to be around 0.7 for many semiconductors used for TPV. Therefore, the absorber is modeled via $\varepsilon_a(\omega) = 14 + i0.1 + i0.7\sqrt{14\omega_g(\omega - \omega_g)}/\omega$, where the term i0.1 simply models non-voltage-generating absorption mechanisms (background losses $\varepsilon_b''$). The absorber internal quantum efficiency can be identified as $\eta_{iq}(\omega) = \varepsilon_g''(\omega)/\varepsilon_a''(\omega)$. The plasmonic emitter is modeled via the Drude model $\varepsilon_e(\omega) = 1 - \omega_p^2/(\omega^2 + i\gamma\omega)$, with $\omega_p = 2\omega_g$ and $\gamma = 0.002\omega_p$, and $d = 0.003\lambda_g$, with $\lambda_g = 2\pi/k_g$ and $k_g = \omega_g/c$.

In FIG. 1A, we show the results for the emitter emissivity $\epsilon_e(\omega, k)$ of TM polarization (H parallel to interfaces), calculated via the exact method. To apply the CMT solution Eq. (49), for each k, the Surface-Plasmon-Polariton resonant mode of the system $\omega_o - i(\Gamma_e + \Gamma_a)$ is calculated via a (also transfer-matrix-based) complex-mode solver. $\Gamma_e$ and $\Gamma_a$ can be separated by using the mode solver with the losses activated only in e ($\varepsilon_a'' = 0$) and a ($\gamma = 0$) respectively. The dispersion $\omega_o(k)$ is obvious in FIG. 1A from where the emissivity is non-zero and the loss rates $\Gamma_e(k)$ and $\Gamma_a(k)$ are shown in FIG. 1B. Note how both $\Gamma_a$ and $\epsilon_e$ sharply increase as the semiconductor bandgap is crossed ($\omega > \omega_g \Leftrightarrow k > 15 k_g$) and interband absorption starts. Also, $\Gamma_e(k) = \Gamma_a(k)$ at $k/k_g = 15.7$ and 37.3, where, as predicted for impedance matching, $\epsilon_e(\omega_o(k), k) = 1$. This can be seen clearly in FIG. 1C, where $\epsilon_e$ is plotted again for three values of k, using both the exact calculation and the CMT model. For improved accuracy of the CMT model, we scaled the bandgap-related absorber loss rate with frequency, so that $\Gamma_g(\omega, k) = \Gamma_a(k)\varepsilon_g''(\omega)/\varepsilon_a''(\omega_o(k))$, while $\Gamma_b(k) = \Gamma_a(k)\varepsilon_b''/\varepsilon_a''(\omega_o(k))$. The agreement is almost perfect. The algebraic error ($\epsilon_e^{CMT} - \epsilon_e^{exact}$) shown in the inset of FIG. 1C for a large range of ($\omega$,k), is indeed really small.

Figures 2A, 2B, 2C:
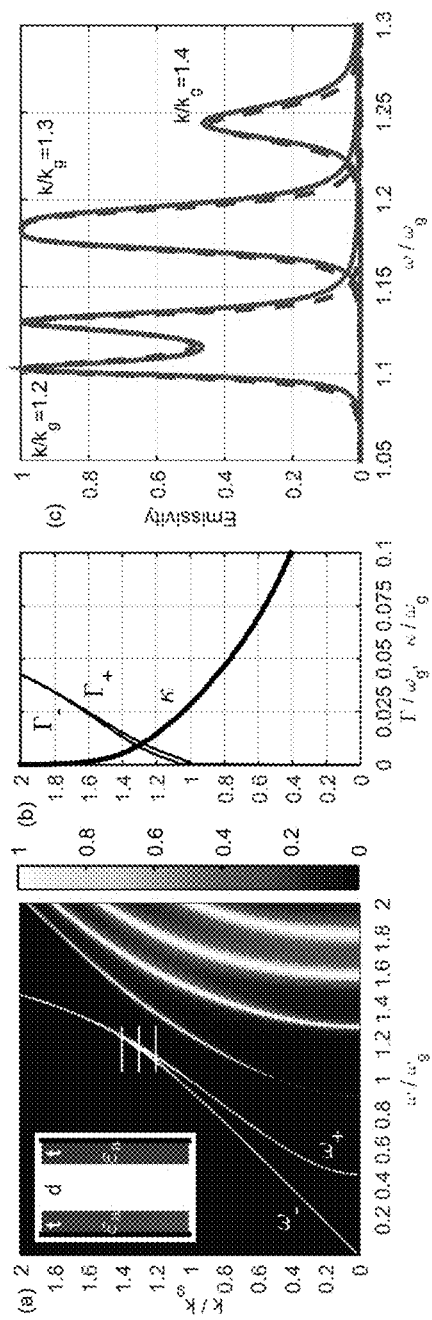
FIG. 2A shows TM emitter emissivity $\in_e(\omega,k)$ (color plot) and lowest two modes $\omega_\pm$ (dotted lines) for structure shown in inset with $t=0.04\lambda_g$ and $d=\lambda_g$. The structure in the inset includes a semiconductor thin-film emitter backed by a perfect metal (left) and a semiconductor thin-film absorber backed by a perfect metal (right) spaced across a narrow vacuum gap.
FIG. 2B shows loss rates $\Gamma_\pm(k)$ and coupling (half-splitting) $\kappa(k)$ of the two resonant modes.
FIG. 2C shows exact (solid) and CMT (dashed) calculations of emitter emissivity $\in_e(\omega,k)$ for the three k-cross-sections indicated with white lines in FIG. 2A.

As another planar-system example, we analyze thermal energy exchange between two semiconductor thin films (emitter-absorber) of relative dielectric permittivity $\varepsilon_a(\omega)$ as above and thickness $t = 0.04\lambda_g$, both backed by a perfect metal, and separated by a small vacuum gap of thickness $d = \lambda_g$ (FIG. 2A inset). In FIG. 2A, we show again the exact semi-analytical result for the emitter emissivity $\epsilon_e(\omega, k)$ of TM polarization. Multiple resonance modes of the system can be identified by the emissivity peaks, but the lowest two ($\omega_\pm - i\Gamma_\pm$) are also explicitly shown (in FIGS. 2A and 2B), as calculated by the complex-mode solver. They arise from the coupling of the lowest mode ($\omega_o - i\Gamma$) of each thin film, via the overlap of the modes' tails in the vacuum gap. Since the system is symmetric, CMT predicts that $\omega_\pm - i\Gamma_\pm = \omega_o - i\Gamma \pm \kappa$, so we can extract the uncoupled individual resonance of each film $\omega_o = (\omega_+ + \omega_-)/2$ and the coupling coefficient $\kappa = (\omega_+ - \omega_-)/2$, plotted also in FIG. 2B. Note that $\Gamma_\pm$ slightly differ, for small wavevectors k, deviating from the CMT prediction $\Gamma_+ = \Gamma_- = \Gamma$ above, because the CMT validity condition $\kappa \ll \omega_o$ worsens as k decreases, therefore we use again their average for the uncoupled loss rate $\Gamma = (\Gamma_+ + \Gamma_-)/2$. In our CMT model of Eq. (56), we scale the emitter and absorber film loss rates with frequency just like before, namely $\Gamma_e(\omega,k) = \Gamma(k)\varepsilon_a''(\omega)/\varepsilon_a''(\omega_o(k))$ and so on for $\Gamma_g(\omega,k)$ and $\Gamma_b(k)$. As CMT predicts, at k=1.3 $k_g$ when $\kappa = \Gamma$ (impedance matching), the emitter emissivity reaches 1 with a flat double-Lorentzian shape, while, for smaller k, it reaches 1 at two distinct peaks, as is seen in FIG. 2C. The accuracy of CMT, compared to the exact result, is very good.

In the examples above, the coupling coefficient $\kappa$ between two resonant modes was calculated via the splitting of the final modes of the coupled system. However, one can also use CMT to derive a formula for calculating the coupling coefficient $\kappa$ using the electromagnetic fields of the two resonant modes. Let $\varepsilon_1$ and $\mu_1$ be the (generally anisotropic tensor) dielectric permittivity and magnetic permeability, respectively, describing the first resonator in the absence of the second resonator, where the first resonant mode has eigenfrequency $\omega_1$ and eigenfields ($E_1, D_1, H_1, B_1$), and vice versa for the second resonator. Let $\varepsilon$ and $\mu$ be the dielectric permittivity and magnetic permeability, respectively, describing the whole structure in the presence of both resonators. Then the coupling coefficient $\kappa_{21}$ from the first resonant mode to second resonant mode is given by:

$$\kappa_{21} \approx \omega_2 \frac{\int_{V_1} dV [D_2^{-T} \cdot (\varepsilon^{-1} - \varepsilon_2^{-1}) \cdot D_1 + B_2^{-T} \cdot (\mu^{-1} - \mu_2^{-1}) \cdot B_1]}{\int_V dV [D_2^{-T} \cdot E_1 + H_2^{-T} \cdot B_1]}$$

where ($E_2^{-T}, D_2^{-T}, H_2^{-T}, B_2^{-T}$) are the time-reversed and transposed eigenfields of the second resonator, the integral in the numerator is only over the volume of the first resonator, the integral in the denominator is over the entire volume of the structure (and should be treated carefully in the case of leaky modes) and only first order perturbation terms have been kept. $\kappa_{12}$ is given by the same expression with $1 \leftrightarrow 2$ exchanged. $\kappa_{21}$ and $\kappa_{12}$ should be equal from reciprocity, but may differ numerically due to approximation errors, so we take the coupling coefficient $\kappa$ to be $\kappa = \sqrt{\kappa_{12}\kappa_{21}}$.

When the system has linear or planar symmetry, the first and second resonant modes can be characterized via a conserved wavenumber $k_{z1}$ and $k_{z2}$ or $k_{xy1}$ and $k_{xy2}$ in one or two dimensions, respectively. The integral in the numerator is zero unless $k_{z1} = k_{z2}$ or $k_{xy1} = k_{xy2}$, in which case the integrals become dxdy-area or dz-line integrals respectively. So two guided modes have zero coupling unless their wavevectors are the same.

Analysis of Thermo-Photo-Voltaic (TPV) Systems
Efficiency of a TPV System

A typical ThermoPhotoVoltaic (TPV) system comprises an emitting object or emitter, e, at a high temperature $T_e$, and an absorbing PhotoVoltaic (PV)-cell absorber, a, which may typically be a semiconductor with an electronic bandgap of energy $E_g = \hbar\omega_g$, at a lower temperature $T_a < T_e$, surrounded by a background, b, at the same absorber-temperature $T_a$. The background may be free space or it may include any set of other absorbing or lossless, finite or infinite-extent objects, at $T_a$. To quantify the statistics of thermal emission/absorption of each object, we need to examine each object separately, "set the temperature" of the other objects to zero and apply the superposition principle.

Based on the FDT in Eq. (1), the thermally-excited sources in the emitter generate photons with mean number $\Theta(\omega,0,T_e)$. Some of those photons that leave the emitter can be absorbed by the absorber, some by the background and some can be radiated into the background.

The PV-cell absorber, with a relative dielectric permittivity, $\varepsilon_a$, has several mechanisms by which it absorbs photons. One absorption mechanism, g, associated with interband absorption through the semiconductor electronic bandgap, leads to a coherent conversion of an absorbed photon to a photo-generated electron-hole pair, which separates to a free electron and a free hole under a built-in chemical potential and leads to a voltage differential, V, across the PV cell, and a photo-generated current, I, when an external load l is connected to the PV-cell output. Other absorption mechanisms in the PV cell include free-carrier absorption, inter-valence-band absorption, inter-valley-conduction-band absorption and non-radiative recombination in semiconductors, and do not lead to photo-generated voltage and current. We characterize the various absorption mechanisms via the imaginary part of the relative dielectric permittivity of the absorber, the voltage/current-generating one as $\varepsilon_g''$ and the ones leading to lost absorbed photons collectively as $\varepsilon_l''$, such that $\varepsilon_a'' = \varepsilon_g'' + \varepsilon_l''$. Using Eq. (9), one can see that, for any lossy object or loss mechanism i, $$\in_{ia}(\omega) = \in_{ig}(\omega) + \in_{il}(\omega) \quad (57)$$

At the temperature $T_a$ of the absorber, randomly fluctuating sources, associated with all its different absorption mechanisms, may lead to photon emission, but with different statistics. To quantify the statistics of thermal emission of each such mechanism, again we need to examine each mechanism separately, "set the temperature" of the other mechanisms to zero and apply the superposition principle. Based on the FDT in Eq. (1), the thermally-excited sources in the absorber associated with the absorption mechanism g generate photons with mean number $\Theta(\omega, V, T_a)$, when the PV cell operates with an induced voltage V across it. Note that the induced voltage is smaller than the bandgap energy, $qV < \hbar\omega_g$, so that the mean number of photons $\Theta(\omega, V, T_a)$ is positive for frequencies $\omega > \omega_g$, at which the bandgap absorbs/emits and its emissivity is non-zero. Some of those photons emitted by the bandgap can be absorbed by the emitter, some by the background, some can be radiated into the background and some can be re-absorbed inside the absorber by a different absorption mechanism (free-carrier, inter-valence-band, inter-valley-conduction-band, etc.). Similarly, the thermally-excited sources in the absorber associated with the other absorption mechanisms generate photons with mean number $\Theta(\omega,0,T_a)$. Some of those photons can be absorbed by the emitter, some by the background, some can be radiated into the background and some can be re-absorbed inside the absorber by the electronic bandgap.

Based on the FDT in Eq. (1), the thermally-excited sources in the absorbing objects of the background generate photons with mean number $\Theta(\omega,0,T_a)$. If the TPV system extends to infinity, so that photons can be radiated away from the system, then, at thermal quasi-equilibrium at the background temperature $T_a$, photons are also radiated into the system from infinity, again with mean number $\Theta(\omega,0,T_a)$ The efficiency, $\eta$, of the TPV system is defined as the ratio of the power, $P_l = V \cdot I$, fed into the load l connected to the PV-cell output over the net power outflow from the emitter, $P_e$, so that $\eta = P_l/P_e$.

The net power outflow from the emitter is the integral over all frequencies of the energy per photon $\hbar\omega$ times the net number of photons flowing out of the emitter. Using Eq. (8) and the superposition principle Eq. (43), the net number of photons flowing out of the emitter is the total number of photons emitted by the emitter towards the absorber and background, assuming $T_a=0$, minus the number of photons absorbed by the emitter, assuming $T_e=0$, and emitted by absorption mechanism g of the absorber and all other absorption or radiation mechanisms in the absorber and background.

$$P_e = \int \frac{d\omega}{2\pi} \hbar\omega \{\Theta(\omega, 0, T_e)\epsilon_e(\omega) - \Theta(\omega, 0, T_a)[\epsilon_{el}(\omega) + \epsilon_{eb}(\omega)] - \Theta(\omega, V, T_a)\epsilon_{eg}(\omega)\} \tag{58}$$

where, using also Eq. (57), $$\epsilon_e(\omega) = \epsilon_{ge}(\omega) + \epsilon_{le}(\omega) + \epsilon_{be}(\omega) = \epsilon_{ae}(\omega) + \epsilon_{be}(\omega) \tag{59}$$

and $\epsilon_{ij}(\omega)$ is the thermal transmissivity of object or mechanism j into object or mechanism i. Using now Eq. (59) and reciprocity Eq. (10), we can rewrite Eq. (58) as $$P_e = \int \frac{d\omega}{2\pi} \hbar\omega \{[\Theta(\omega, 0, T_e) - \Theta(\omega, 0, T_a)]\epsilon_e(\omega) + [\Theta(\omega, 0, T_a) - \Theta(\omega, V, T_a)]\epsilon_{eg}(\omega)\} \tag{60}$$

The current fed into a load connected to the PV cell output is the integral over all frequencies of the electron charge q times the net number of photons absorbed by the electronic bandgap of the PV cell and successfully converted to free electrons and holes flowing through the load. Using Eq. (19) and the superposition principle Eq. (43) (with a minus sign for absorption vs emission), the net number of photons absorbed by mechanism g is the number of photons emitted by the emitter and absorbed by g, assuming $T_a=0$, plus the number of photons emitted by all other absorption or radiation mechanisms in the absorber and background and absorbed by g, minus the total number of photons emitted by the mechanism g towards the emitter and all other absorption or radiation mechanisms in the absorber and background.

$$I = q \int \frac{d\omega}{2\pi} \{\Theta(\omega, 0, T_e)\epsilon_{ge}(\omega) + \Theta(\omega, 0, T_a)[\epsilon_{gl}(\omega) + \epsilon_{gb}(\omega)] - \Theta(\omega, V, T_a)\epsilon_g(\omega)\} \tag{61}$$

where $$\epsilon_g(\omega) = \epsilon_{eg}(\omega) + \epsilon_{lg}(\omega) + \epsilon_{bg}(\omega) \tag{62}$$

Using now Eq. (62) and reciprocity Eq. (10), we can rewrite Eq. (61) as $$I = q \int \frac{d\omega}{2\pi} \{[\Theta(\omega, 0, T_e) - \Theta(\omega, 0, T_a)]\epsilon_{eg}(\omega) + [\Theta(\omega, 0, T_a) - \Theta(\omega, V, T_a)]\epsilon_g(\omega)\} \tag{63}$$

Homogeneous Absorber

As can be seen from Eq. (9), if the absorptive object j is homogeneous, namely its dielectric permittivity does not depend on position r, then $\epsilon_{ij}(\omega) \propto \epsilon_j''(\omega)$. If the absorber is homogeneous, it is then convenient to define the internal quantum efficiency, $\eta_{iq}$, of the absorbing material of the PV cell as $$\eta_{iq}(\omega) = \frac{\varepsilon_g''(\omega)}{\varepsilon_a''(\omega)} = \frac{\varepsilon_g''(\omega)}{\varepsilon_g''(\omega) + \varepsilon_l''(\omega)} \tag{64}$$

which may be approximately zero at frequencies below the bandgap $\omega_g$. Using Eq. (64), we have $$\epsilon_{ig}(\omega) = \eta_{iq}(\omega)\epsilon_{ia}(\omega) \text{ and } \epsilon_{il}(\omega) = [1 - \eta_{iq}(\omega)]\epsilon_{ia}(\omega) \tag{65}$$

and therefore we can rewrite $$P_e = \int \frac{d\omega}{2\pi} \hbar\omega \{[\Theta(\omega, 0, T_e) - \Theta(\omega, 0, T_a)]\epsilon_e(\omega) + [\Theta(\omega, 0, T_a) - \Theta(\omega, V, T_a)]\eta_{iq}(\omega)\epsilon_{ea}(\omega)\} \tag{66}$$

and $$I = q \int \frac{d\omega}{2\pi} \eta_{iq}(\omega)\{[\Theta(\omega, 0, T_e) - \Theta(\omega, 0, T_a)]\epsilon_{ea}(\omega) + [\Theta(\omega, 0, T_a) - \Theta(\omega, V, T_a)]\epsilon_a(\omega)\} \tag{67}$$

with $$\epsilon_a(\omega) = \epsilon_{ae}(\omega) + \epsilon_{al}(\omega) + \epsilon_{ab}(\omega) = \epsilon_{ae}(\omega) + [1 - \eta_{iq}(\omega)]\epsilon_{aa}(\omega) + \epsilon_{ab}(\omega) \tag{68}$$

"Boltzmann" Approximation

Eq. (60) and (63) can be simplified, if $\hbar\omega_g - qV \gg k_B T_a$, as one can then use the (equivalent to, but slightly better than, the Boltzmann) approximation $$\Theta(\omega, V, T_a) \approx \Theta(\omega, 0, T_a) \cdot e^{\frac{qV}{k_B T}} \tag{69}$$

Both of these equations are written as a sum of a term, which is non-zero at short circuit (V=0), and a term, which is non-zero at thermal equilibrium ($T_e = T_a$). Under the approximation of Eq. (69), they can be written as $$P_e \approx P_{e,sc} + P_{e,eq}\left(1 - e^{\frac{qV}{k_B T}}\right) \tag{70}$$

$$I \approx I_{sc} + I_{eq}\left(1 - e^{\frac{qV}{k_B T}}\right) \tag{71}$$

with $$P_{e,sc} = \int \frac{d\omega}{2\pi} \hbar\omega [\Theta(\omega, 0, T_e) - \Theta(\omega, 0, T_a)] \epsilon_e(\omega) \tag{72}$$

$$P_{e,eq} = \int \frac{d\omega}{2\pi} \hbar\omega \Theta(\omega, 0, T_a) \epsilon_{eg}(\omega) \tag{73}$$

$$I_{sc} = q\int \frac{d\omega}{2\pi} [\Theta(\omega, 0, T_e) - \Theta(\omega, 0, T_a)] \epsilon_{eg}(\omega) \tag{74}$$

$$I_{eq} = q\int \frac{d\omega}{2\pi} \Theta(\omega, 0, T_a) \epsilon_g(\omega) \tag{75}$$

Eqs. (70) and (71) are general and contain simple subcases:
(i) No emitter ($\epsilon_{en}=0$, $\epsilon_{gl}, \epsilon_{gb} \neq 0$): A simple diode. If losses into the background include radiation, it is a Light-Emitting Diode (LED).
(ii) No absorber ($\epsilon_{an}=0$, $\epsilon_{eb} \neq 0$): A hot resonant emitter emits thermal photons into the cold background, where they are absorbed and/or radiated away.
(iii) No background losses ($\epsilon_{bn}=\epsilon_{ln}=0$, $\epsilon_{eg} \neq 0$): Ideal TPV case.

Linear and Planar Systems

In the case of a linear system, the Eqs. (60), (63), (66), (67) and (72)-(75) for the input power and output current of the TPV system should be reinterpreted as input power per unit length and output current per unit length, with the substitution of all transmissivity terms as Eqs. (8) and (22) suggest $$\epsilon_{ij}(\omega) = L \int_{-\infty}^{+\infty} \frac{dk_z}{2\pi} \epsilon_{ij}(\omega, k_z) \tag{76}$$

In the case of a planar system, the Eqs. (60), (63), (66), (67) and (72)-(75) for the input power and output current of the TPV system need to be reinterpreted as input power per unit area and output current per unit area, with the substitution of all transmissivity terms as Eqs. (8) and (29) suggest $$\epsilon_{ij}(\omega) = A \int_0^\infty \frac{k_{xy} dk_{xy}}{2\pi} \epsilon_{ij}(\omega, k_{xy}) \tag{77}$$

Operating Voltage of a TPV System

The operating voltage of a TPV system can be chosen via the choice of the load impedance, R=V/I, connected at the output of the TPV system.

Figures 3A, 3B:
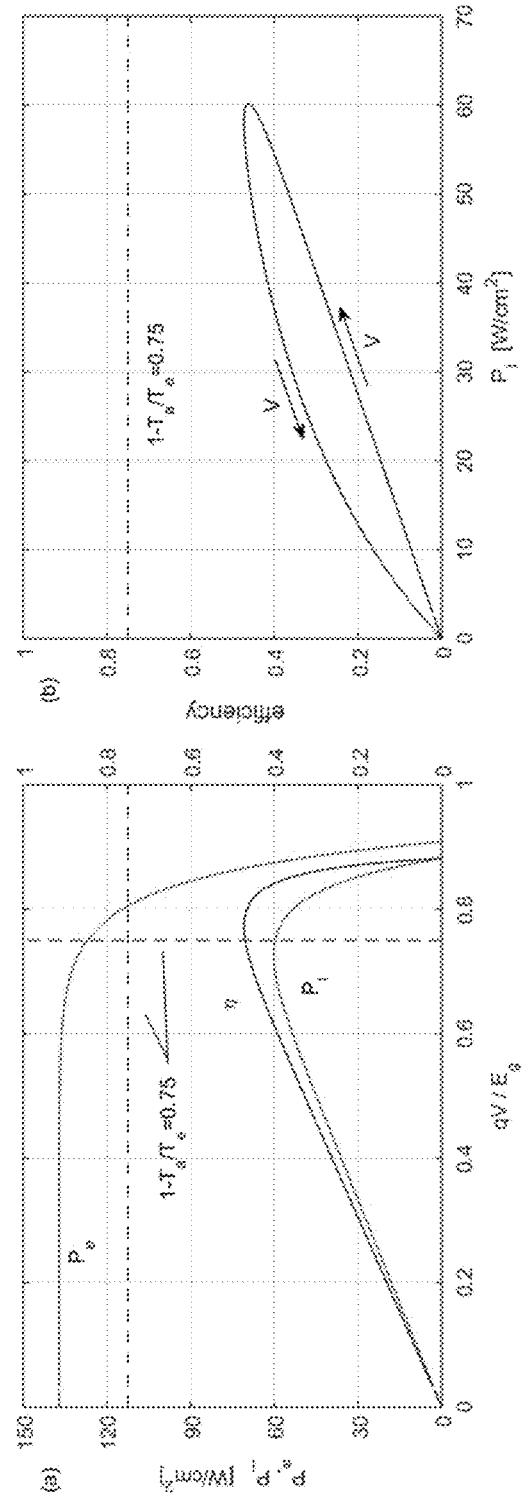
FIG. 3A shows emitter power $P_e$ and load power $P_l$ (left axis) and efficiency $\eta$ (right axis) vs load voltage V (normalized to the semiconductor bandgap $E_g$), for a typical TPV system at $T_e/T_a=4$.
FIG. 3B shows efficiency vs load power, parametrized by the load voltage, for the same TPV system.

In contrast to PhotoVoltaic (PV) systems, both the emitted power $P_e$ and load power $P_l=V \cdot I(V)$ of a TPV system depend on the operating voltage, V, as can be seen from Eq. (60) and (63). Therefore, the output power $P_l$ and system efficiency $\eta = P_l/P_e$ are not maximized at the same voltage, with the efficiency maximized at a larger voltage than the power. In FIG. 3A, all three quantities are plotted as a function of the voltage for a typical TPV system.

The operating voltage, V, can also be chosen to achieve a desired output power level, $P_l$. In this case, since two values of the voltage can give the same output power, it may be preferable to choose the larger value, since that corresponds to higher efficiency. The efficiency advantage of the higher-voltage solution can be seen in FIG. 3B.

If the approximation of Eq. (69) applies, one can use the Eq. (70)-(75) to determine the desired (optimal-efficiency, optimal-power or target-power) voltage without requiring multiple frequency integrations.

In some embodiments of a TPV system, one can choose the operating voltage to increase or maximize the efficiency. In some embodiments, one can choose the operating voltage to increase or maximize the output power. In some embodiments, one can choose the operating voltage to achieve a compromise between efficiency and output power. In some embodiments, one can choose the operating voltage to achieve a target output power, wherein the chosen voltage can be larger than the voltage which maximizes output power.

Carnot Efficiency Limit

It is instructive to know what the highest achievable limit is for the efficiency. Losses arise, first, from photons that are emitted by the emitter and absorbed by non-voltage-generating absorption mechanisms inside the absorber or in the background and, second, from photons that are emitted by the emitter with frequency above the absorber bandgap, as these photons generate one electron-hole pair and lose their excess (over the bandgap) energy by thermalization. The highest efficiency may be possible, first, when no non-voltage-generating loss mechanisms exist inside the absorber and in the background, namely only $\epsilon_{eg}(\omega) \neq 0$, and, second, when all emitter photons are emitted exactly at the bandgap frequency, namely $\epsilon_{eg}(\omega) \sim \epsilon_g \omega_g \delta(\omega - \omega_g)$. Then, Eq. (60) and (63) become $$P_e = \frac{\epsilon_g \omega_g}{2\pi} \hbar\omega_g [\Theta(\omega_g, 0, T_e) - \Theta(\omega_g, 0, T_a)] \tag{78}$$

$$I = \frac{\epsilon_g \omega_g}{2\pi} q[\Theta(\omega_g, 0, T_e) - \Theta(\omega_g, 0, T_a)] \tag{79}$$

Therefore the efficiency is $$\eta_{max} = \frac{VI}{P_e} = \frac{qV}{\hbar\omega_g} \tag{80}$$

and is maximized, when the voltage is maximized. This occurs at open circuit (R=∞), which implies, from Eq. (79) and (80), $$I = 0 \leftrightarrow \Theta(\omega_g, 0, T_e) = \quad (81)$$

$$\Theta(\omega_g, V, T_a) \leftrightarrow \frac{\hbar\omega_g - qV}{k_B T_e} = \frac{\hbar\omega_g}{k_B T_a} \leftrightarrow \frac{qV}{\hbar\omega_g} = \eta_{max} = 1 - \frac{T_a}{T_e}$$

which is, as one would expect, the Carnot limit of efficiency of a Carnot engine between a hot object at $T_e$ and a cold object at $T_a$. However, in this maximum efficiency limit, the output power tends to zero, since the output current tends to zero.

In a practical non-ideal TPV system, there may be some photons absorbed by the TPV cell that are not converted into useful electron-hole pairs, such as below-bandgap photons. Since these photons correspond to some power lost, the optimal emission profile deviates from a sharp peak right above the bandgap frequency, since such a sharp peak implies very little output power generated, so efficiency would be low. A larger emission bandwidth above the bandgap is necessary, so that the output power can overcome the power lost, but not too large, to avoid the increasing thermalization losses.

Design of Efficient Planar Thermo-Photo-Voltaic (TPV) Systems

Design Principles of Efficient Planar TPV Systems

Resonant Crossing and Impedance Matching of Emitter and Absorber Modes

Based on the previous sections, the efficiency of a planar layered TPV system should be high if the thermal transmissivity, $\in_{ea}(\omega, k_{xy})$, between the emitter and absorber layers is close to 1 (its maximum per polarization) for a small bandwidth of frequencies right above the bandgap of the semiconductor absorber and close to zero everywhere else. Put differently, if the emitter-absorber thermal transmissivity has a "top-hat" profile above the semiconductor bandgap, the TPV system should be very efficient. A common problem with most prior-art systems, especially non-resonant ones, in implementing such a transmission profile is the large broadening of the emitter electromagnetic modes at elevated temperatures. The result is typically unavoidable losses due to below-bandgap emitted photons absorbed by free carriers in the PV cell, either at its electrodes or its main body.

In this disclosure, we describe and show several versions of a TPV system whose thermal transmission profile increases efficiency by suppressing below-bandgap and high-frequency transmitted photons. The underlying principle is to make both the emitter and absorber support resonant electromagnetic modes that are substantially different (in wave vector $k_{xy}$) at all frequencies except for a single frequency above the PV-cell bandgap, where they cross and couple appropriately to achieve impedance matching. The selective property of coupled impedance-matched resonances means that the thermal transmissivity is high at the resonant crossing frequency, and very low at other frequencies. Mathematically, we accomplish for the transmissivity, at the coupling wave vector $k_{xy}$, the double-Lorentzian shape of Eq. (53), which can have very sharp transitions compared to the single Lorentzian of Eq. (48), even if one of the resonances is very broad (that of the emitter).

Physically, one can understand the advantage of two coupled resonances versus a single resonance in the following way. One typically aims to achieve impedance matching at a frequency above the semiconductor PV cell bandgap. For a single-Lorentzian TPV system without a resonant absorber, to satisfy the condition $\gamma_e = \gamma_a$, since the modal loss rate in the absorber scales quadratically with the emitter field $\gamma_a \sim |E_e|^2$, where the emitter modal field $|E_e|$ decays exponentially inside the vacuum gap, one typically has to bring the absorber in very close proximity to the resonant mode of the emitter. At that close proximity the emitter photons of all (also below-bandgap) frequencies are seen by the absorber, thus the transmissivity profile is broad. For a double-Lorentzian system, the impedance matching condition between the two (emitter and absorber) resonances at the frequency of the resonant modal crossing is approximately $\gamma_e \gamma_a = \kappa^2$. In this case, the coupling constant scales linearly with the fields $\kappa \sim |E_e|$, so, given their exponential decay, the PV cell has to be kept at a large distance from the hot emitter. At that distance, the evanescent tails of the two photonic modes overlap sufficiently to couple at resonance, while the penetration of the emitter-mode tail inside the absorber (and vice versa) is very weak, so transmission is low away from resonance.

An additional advantage of the present systems of coupled resonances is that the vacuum gap between the emitter and absorber can be kept relatively large. One bottleneck for practically implementing near-field TPV systems has so far been mainly the extremely small (tens of nm) gaps that need to be accomplished and maintained. That distance can be much larger with the present designs.

Example TPV System: Surface-Plasmon-Polariton Emitter and Thin-Film Semiconductor Absorber One way to accomplish a resonant crossing between two electromagnetic modes is to use modes that, at the same frequency, have substantially different group velocities.

Figure 4:
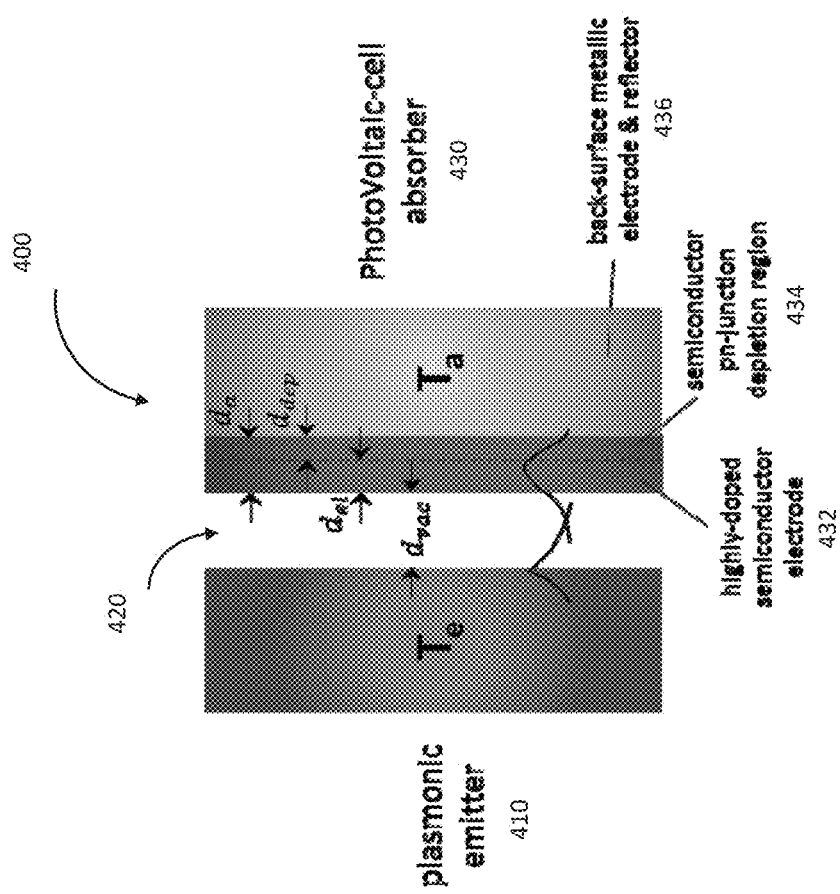
FIG. 4 shows an example near-field TPV structure. A hot plasmonic emitter is separated by a vacuum gap from a PV cell comprising a semiconductor thin-film pn-junction absorber, including a front highly-doped electrode region and a depletion region, backed by a metallic electrode/reflector. Also shown qualitatively typical energy-density profiles of the emitter surface plasmon polariton (SPP) mode, on its interface with the vacuum gap, and the semiconductor-absorber thin-film dielectric-waveguide-type photonic mode.

FIG. 4 shows an example TPV system 400 that includes a thermal emitter 410 separated from a PV-cell absorber 430 by a vacuum gap 420. The PV-cell absorber 430 typically includes a semiconductor material with a bandgap $E_g = \hbar\omega_g$. (Here, we normalize every frequency by $\omega_g$, every wavevector by $k_g = \omega_g/c$ and every dimension by $\lambda_g = 2\pi/k_g$.) Semiconductor materials typically have a large relative dielectric permittivity ($\varepsilon_a \sim 7$-16) and thus a thin film semiconductor supports tightly-confined dielectric-waveguide photonic resonant modes.

In some embodiments of the present TPV system, such as the system 400 shown in FIG. 4, the modal confinement on the thin-film side away from the emitter 410 can be achieved via a metallic material, which can also serve as a back electrode 436 for the PV cell 430 or a Lateral Conduction Layer in Monolithic Interconnected Modules. This metallic material can remove modes from the radiation cone and can shape the system modes for improved thermal transmissivity, as is shown herein. The metallic material can be thick enough to be considered semi-infinite with very high accuracy. The modal energy-density profile of the first such waveguide mode is shown qualitatively in FIG. 4 and its dispersion is usually close to the light line of the semiconductor material, therefore its group velocity is positive and on the order of $c/\sqrt{\varepsilon_a}$.

Therefore, to get a mode crossing with clear separation between the emitter and absorber modes at frequencies other than the desired one, an emitter resonant mode with group velocity close to zero or even negative would be best. Photonic modes that exhibit such dispersion are surface polaritons on the interfaces of a polaritonic material with a dielectric. Such modes usually exist only for Transverse Magnetic (TM) polarization, where the magnetic field is parallel to the uniform symmetry plane and perpendicular to the direction of the mode propagation. Although any type of polaritonic material (e.g., exciton, phonon) can be used, we focus on plasmonic materials and Surface Plasmon Polariton (SPP) modes. On their interface with dielectric materials, such as air or vacuum, they are well known to support slow-light surface states, whose dispersion can thus be designed to cross the dispersion of a dielectric waveguide mode. Therefore, in some embodiments of the present TPV system, the thermal emitter 410 can be a slab of plasmonic material, as shown in FIG. 4 along with the typical SPP modal energy-density profile. The plasmonic material can be thick enough to be considered semi-infinite with very high accuracy.

Note that a TPV system including a polaritonic emitter and a thin-film semiconductor absorber has been studied in the past (surface-phonon emitter and tungsten emitter). However, those systems were not designed so that the emitter polaritonic mode and the absorber dielectric-waveguide-type mode cross, couple and are impedance-matched just above the bandgap. This is why the reported efficiencies in those studies are significantly lower than those reported here. Furthermore, free-carrier absorption was not modeled properly in those studies.

The PV cell 430 in FIG. 4 has two conductive electrodes across which the output voltage V is induced and the load is connected. One electrode of the PV cell 430 can be provided by the metal back reflector 436 as described above. The front conductive electrode 432, on the side of the thin-film PV cell 430 towards the emitter 410 and vacuum gap 420, should transmit the hot photons for absorption in the depletion region of the semiconductor pn junction 434.

In some embodiments, a front transparent electrode 432 can be formed by very highly doping a portion of the thin-film semiconductor, as shown in FIG. 4. This process is often called diffusion of the pn-junction "emitter". In this case, the semiconductor material of the PV cell 400 includes a highly doped semiconductor electrode 432 and a semiconductor pn-junction depletion region 434. The higher the doping concentration and the thicker the highly-doped region, the higher the conductivity (lower square resistance) of the front electrode 432, but the higher also the free-carrier absorption losses and the faster the radiative recombination of excited carriers before they diffuse towards the depletion region to contribute to current. On the contrary, free-carrier absorption and radiative recombination may be greatly reduced in the depletion region of the semiconductor pn junction, since the carriers are depleted. The thickness of the depletion region decreases as the doping increases.

In a typical thin-film PV cell, the semiconductor film thickness may be so small that the film should be doped at significantly high levels for both the depletion and electrode regions to fit within the thin film, as depicted in FIG. 4. A compromise may have to be made between the thicknesses of the two regions of the semiconductor in order to optimize the final efficiency, considering both free-carrier absorption/radiative recombination in the electrodes and their square resistance. For simplicity, in this specification, we do not model the electronic details of the pn junction of the PV cell. We also assume that surface recombination is negligible via the use of passivation layers. In our first analysis, we assume that the semiconductor has uniform dielectric properties, including both interband and free-carrier absorption mechanisms, with values that on average can describe well the pn-junction behavior and present low enough electrode square resistance. We use this first embodiment of current TPV systems to study the underlying physics and compare its performance to prior-art TPV systems.

Drude Model and Surface Plasmon Polaritons

Throughout this specification, we model free carriers, for example, in the plasmonic material or in the PV-cell electrodes. The Drude model is an approximate but realistic and convenient model, described by the relative dielectric permittivity $$\varepsilon(\omega) = \varepsilon_\infty\left(1 - \frac{\omega_p^2}{\omega^2 + i\gamma\omega}\right) \quad (82)$$

The free-carrier plasma frequency and loss factor can be calculated by $$\omega_p = q\sqrt{\frac{N}{\varepsilon_o\varepsilon_\infty m^*}} \text{ and } \gamma = \frac{q}{\mu m^*} = \rho\frac{Nq^2}{m^*}, \text{ since } \rho = 1/qN\mu \quad (83)$$

where N is the carrier density (from doping), $m^*$ the effective mass of the carriers (electrons or holes), $\mu$ the carrier mobility and $\rho$ the dc resistivity. Note that the plasma frequency $\omega_p$ is approximately the frequency at which Re{$\varepsilon$}=0.

At the interface of such a Drude-type material with a dielectric of relative permittivity $\varepsilon_d$, a SPP surface mode is supported with upper cutoff frequency (as k→∞) at $$\text{Re}\{\varepsilon(\omega_c)\} = -\varepsilon_d \Leftrightarrow \omega_c \approx \frac{\omega_p}{\sqrt{1 + \frac{\varepsilon_d}{\varepsilon_\infty}}} \quad (84)$$

Semiconductor Absorber Material Selection

The optimal choice of semiconductor bandgap $E_g = \hbar\omega_g$ relates to the operating temperature $T_e$ of the emitter. The short-circuit power emitted by the emitter is given by Eqs. (72) and (77). If we ignore the term $\Theta(\omega,0,T_a)$ for high enough emitter temperature $T_e \gg T_a$, normalize the integration frequency by $u=\omega/\omega_g$ and the integration wave vector by $n_{xy}=k_{xy}/k_g$, then $$P_{e,A} \equiv \frac{P_e}{A} \approx \frac{\hbar\omega_g^4}{4\pi^2 c^2}\int_0^\infty du\, u\Theta(u, 0, T_e/\omega_g)\int_0^\infty dn_{xy}n_{xy}\epsilon_e(u, n_{xy})$$

Since, by design, the emissivity is high close to u=1 and as small as possible at other frequencies, we can approximate the slowly-varying term $\Theta(u,0,T_e/\omega_g) \approx \Theta(1,0, T_e/\omega_g)$, therefore the emitted power is maximized with respect to $\omega_g$ along with $\omega_g^4\Theta(1,0, T_e/\omega_g)$, which happens when $$E_g = \hbar\omega_g \approx 4k_B T_e \quad (85)$$

As a guide, an emitter at 3000° K would require a bandgap of approximately 1 eV to maximize emitter power, while at 1200° K approximately 0.4 eV. In all subsequent example designs, we use the choice of Eq. (85). Note, however, that different bandgap frequencies can also be used with the current method to improve TPV efficiency, only the power level may be smaller than the maximum.

A consequence of the choice of Eq. (85) for the bandgap is that the power emitted by the emitter (and also that absorbed by the PV cell) scales as $P_{e,A} \sim T_e^4$, similarly to the Stefan-Boltzmann law for far-field thermal radiation.

A very large subset of available semiconductors falls inside the above spectrum of bandgaps. The semiconductor material can be a group-IV semiconductor, such as germanium or even silicon, although they do not have a direct bandgap and silicon has just a bit higher bandgap than the 1 eV suggested above. The semiconductor material can be a III-V semiconductor, such as GaSb, InAs, InN, ternaries GaInSb, GaInAs, InAsSb, GaAsSb, and quaternaries GaInAsSb, GaInPAs, GaInPSb, GaInNAs. The semiconductor material can be a II-VI semiconductor ternary, such as HgCdTe, HgCdSe.

Semiconductor Absorber Material Modeling

For the semiconductor absorber, we use a high-frequency relative dielectric constant $\varepsilon_{\infty,a}=14$, approximately appropriate for both direct- and indirect-bandgap materials stated above.

The interband absorption profile for a direct-bandgap bulk semiconductor scales as $\alpha_g(\omega) \approx \omega \varepsilon_g''(\omega)/c\sqrt{\varepsilon_a'(\omega)} \sim \sqrt{\omega - \omega_g}$, therefore $\varepsilon_g''(\omega) \approx M\sqrt{\varepsilon_{\infty,a}\omega_g(\omega-\omega_g)}/\omega$, since $\varepsilon_a'(\omega) \approx \varepsilon_{\infty,a}$ at $\omega > \omega_g$. The dimensionless proportionality constant M depends on the conduction-band electron and valence-band hole effective masses, and we found it to be around 0.7 for many semiconductors used for TPV, such as GaInAsSb. In embodiments, quantum wells (step-function absorption profile), quantum wires (inverse-square-root absorption profile) or quantum dots (Lorentzian absorption profile) can also be used for the PV cell. The approximate functional form of the interband absorption $\alpha_g(\omega)$ may also be one of the above forms convoluted with a Lorentz functional to account for homogeneous and inhomogeneous broadening.

The free-carrier absorption of the semiconductor absorber is modeled via the Drude model in Eq. (82). Again, we initially assume uniform average dielectric properties for the semiconductor absorber, including the electrode region and entire pn junction. In this initial analysis, we stipulate that the doping concentration (and thus free-carrier density) $N_D$ increases as $\omega_g$ increases (and thus film thickness $d_a$ decreases) to maintain low electrode square resistance, so we use scaling $N_D \sim \omega_g^2 \Rightarrow \omega_{p,a} \sim \omega_g$. With guidance typical values (for GaInAsSb semiconductors) for the electron and hole effective masses $m_e^* \approx 0.035 m_e$ and $m_h^* \approx 0.4 m_e$, where $m_e$ the electron mass, and typical carrier-density levels from previously reported TPV cells, we use $\sqrt{\varepsilon_{\infty,a}}\omega_{p,a}=0.4\omega_g$. For example, this value corresponds to $N_e \approx 7 \times 10^{17}$ cm$^{-3}$ electrons or $N_h \approx 8 \times 10^{18}$ cm$^{-3}$ holes at $T_e=1200°$ K. Assuming furthermore, for simplicity, an electron mobility scaling $\mu \sim 1/\sqrt{N_D}$, which is a fair approximation for large ranges of $N_D$ in semiconductors and matching typical mobility values, we use $\gamma_a=0.05\sqrt{\varepsilon_{\infty,a}}\omega_{p,a}=0.02\omega_g$. Therefore, in our first analysis, we model the absorber with dielectric permittivity $$\varepsilon_a(\omega) = 14 - \frac{0.16}{(\omega/\omega_g)^2 + i0.02\omega/\omega_g} + i0.7(\omega_g/\omega)\sqrt{14(\omega/\omega_g - 1)} \quad (86)$$

The internal quantum efficiency of the electrode region of the semiconductor is $$\eta_{iq,a}(\omega) = \frac{0.7(\omega_g/\omega)\sqrt{14(\omega/\omega_g - 1)}}{\mathrm{Im}\{\varepsilon_a(\omega)\}} \quad (87)$$

Other loss mechanisms, which reduce the internal quantum efficiency, could be included in $\varepsilon_a''$, but they are ignored here, for simplicity and to determine optimal performance limits.

Back Metallic Electrode Material Selection and Modeling

The back metallic electrode/reflector should have the lowest possible loss to reduce or minimize the loss of the absorber mode due to its penetration into the metal. Therefore, we can use silver (Ag) as the electrode material and the Drude approximation for silver with $\varepsilon_{\infty,Ag}=4$, $\sqrt{\varepsilon_{\infty,Ag}}\hbar\omega_{p,Ag}=9.3$ eV and $\hbar\gamma_{Ag}=0.023$ eV. Other metals can also be used, such as gold, aluminum or copper, but efficiency may be lower.

Plasmonic Emitter Material Selection

The emitter plasmonic material should support a SPP mode with a cutoff frequency $\omega_{c,e}$ slightly above the semiconductor bandgap $\omega_g$, say $\omega_g < \omega_{c,e} \leq 1.6 \omega_g$ (e.g., $\omega_{c,e} \approx 1.2 \omega_g$). As discussed earlier, $\omega_g$ typically lies in the range (0.2-1) eV/$\hbar$, so $\omega_{c,e}$ should fall roughly in the range (0.24-1.2) eV/$\hbar$. Since the SPP mode predominantly "sees" the vacuum gap $\varepsilon_{vac}=1$, its cutoff frequency occurs when $\mathrm{Re}\{\varepsilon_e(\omega_{c,e})\} \approx -1$ (Eq. (84)). Therefore, suitable materials may have high melting temperature, with $\varepsilon'(\omega)=-1$ for $\omega$ roughly in (0.24-1.2) eV/$\hbar$. This range is confirmed by our simulations, as shown later in FIGS. 6B and 15B.

In Table 1, we show a list of such materials. In general, there are several refractory metals, metal carbides (e.g., ZrC, VC and TiC), nitrides and silicides that can be used in embodiments of the present technology as the emitter material. Also the most common TPV emitter material, tungsten W, can be used for very high emitter temperatures, perhaps even matched with a silicon thin-film PV cell. Thick enough films of these refractory materials can be grown epitaxially on a substrate to ensure minimum defects and surface variations on the films.

The thermal emitter material may have a high melting temperature and a relative dielectric permittivity with a real part that is −1 at infrared frequencies. It can be but does not have to be a plasmonic material. Phononic materials have negative dielectric permittivities within a finite bandwidth rather than all the way down to zero frequency (like plasmonic materials). Therefore, in example embodiments, a phononic material (e.g., SiC and BN) can be used for the thermal emitter.

A metamaterial is a periodic arrangement (e.g., a photonic crystal) of at least two different materials with a period substantially smaller than the wavelength of operation. Such a metamaterial exhibits effectively a uniform (but generally anisotropic) dielectric permittivity and magnetic permeability to electromagnetic waves at that wavelength of operation. If at least one of the constituent materials in a metamaterial is a polaritonic material, then the metamaterial can have an effective permittivity with a negative real part. Therefore, in example embodiments, a metamaterial can be used for the thermal emitter, where at least one of the constituent materials is a polaritonic material, such as a plasmon polaritonic (plasmonic) or phonon polaritonic (phononic) material. A metamaterial comprising a polaritonic material and a dielectric material can have an effective plasma frequency that is smaller than the plasma frequency of the constituent polaritonic material, and thus it can have an effective $\varepsilon_{eff}'=-1$ at a lower frequency than the frequency at which the constituent polaritonic material has $\varepsilon'=-1$. Therefore, in some example embodiments, metamaterials comprising a refractory polaritonic material of high plasma frequency (e.g., W, Ta, Hf, Re, Os, Ir, Mo, Nb, Ru) or alloys thereof (e.g., Tantalum Hafnium Carbide) and a refractory dielectric (e.g., thoria $ThO_2$, hafnia $HfO_2$ and zirconia $ZrO_2$) can be used for the thermal emitter.

TABLE 1

List of plasmonic (metallic-type) refractory materials, along with their high melting temperatures and the frequencies at which their real permittivity approximately equals −1 and thus they support a SPP mode in vacuum.

| Material | $T_{melt}$ [°K] | E (ε' = −1) [eV] |
|---|---|---|
| W | 3683 | 1.3 |
| Ta | 3269 | 2 |
| ZrC | 3813 | 0.6 |
| NbC | 3773 | 2 |
| TiC | 3413 | 0.9 |
| VC | 3083 | 0.7 |
| VN | 2320 | 1.7 |
| $TaSi_2$ | 2473 | 0.8 |
| $NbSi_2$ | 2223 | 0.7 |
| $VSi_2$ | 2023 | 0.6 |

Plasmonic Emitter Material Modeling

The plasmonic emitter is also modeled via the Drude permittivity. In our design optimizations that follow, we have left $\omega_{p,e}$ as an optimization variable and we have assumed $\varepsilon_{\infty,e}=1$ for simplicity. In order to quantify the losses of the plasmonic emitter in the Drude model, we have to take into account how the losses increase with temperature. F. A. Modine, M. D. Foegelle, C. B. Finch and C. Y. Allison, "Electrical properties of transition-metal carbides of group IV," *Physical Review B*, vol. 40, no. 14, pp. 9558-9564, 15 Nov. 1989, describes a model for the temperature dependence of resistivity, which should also hold for the Drude loss factor γ in Eq. (83), since N and m* do not significantly depend on temperature for metallic-type materials. We use the simplified model $$\gamma_{lin}(T) = \gamma_o(1 + \alpha T) \text{ and } \gamma_e(T) = \frac{\gamma_{lin}(T)}{1 + \frac{\gamma_{lin}(T)}{\gamma_\infty}} \quad (88)$$

From parameters and measurements for ZrC and TiC, we deduce and use approximate values $\gamma_o=0.05 \, \omega_{p,e}$, $\alpha=0.002/°$K and $\gamma_\infty=2\gamma_o$. Note that, compared to silver (Ag) with $\gamma\approx0.0025\sqrt{\varepsilon_\infty}\omega_p$, these are much lossier metallic-type materials and they become even lossier (almost twice) at very high temperatures. The associated broadening has been a problem for prior TPV systems with metallic emitters, however, here we show how a coupled-resonant system circumvents this problem.

Thermal Emissivity Spectrum for an Example TPV Structure

In order to evaluate the performance of the present mechanism for enhanced TPV efficiency, we perform an optimization procedure to calculate the maximum efficiency that can be accomplished. The optimization results throughout this specification are not guaranteed to be global optima, but we believe they are very close. For our first optimization, we consider the emitter at temperature $T_e=1200°$ K and the absorber at room temperature $T_a=300°$ K. The PV cell bandgap is selected from Eq. (85) as $E_g\approx0.414$ eV. For the structure of FIG. 4, the optimization parameters are the emitter plasma frequency $\omega_{p,e}$, the vacuum gap width $d_{vac}$, the thickness of the PV-cell absorber $d_a$ and the operating voltage V. At every combination of the first three parameters, the voltage is always chosen to maximize the efficiency $\eta=VI_A/P_{e,A}$ with Eqs. (66) and (67), where $I_A\equiv I/A$ is the current density for the planar system. The initial guess for $\omega_{p,e}$ and $d_a$ is provided, such that the system exhibits two resonantly coupled modes around $\omega\approx1.1 \, \omega_g$, and the gap width $d_{vac}$, so that the mode splitting due to coupling is around the value suggested by $2\kappa=2\sqrt{\Gamma_e\Gamma_a}$ (Eq. (54)).

Figures 5A, 5B, 5C, 5D:
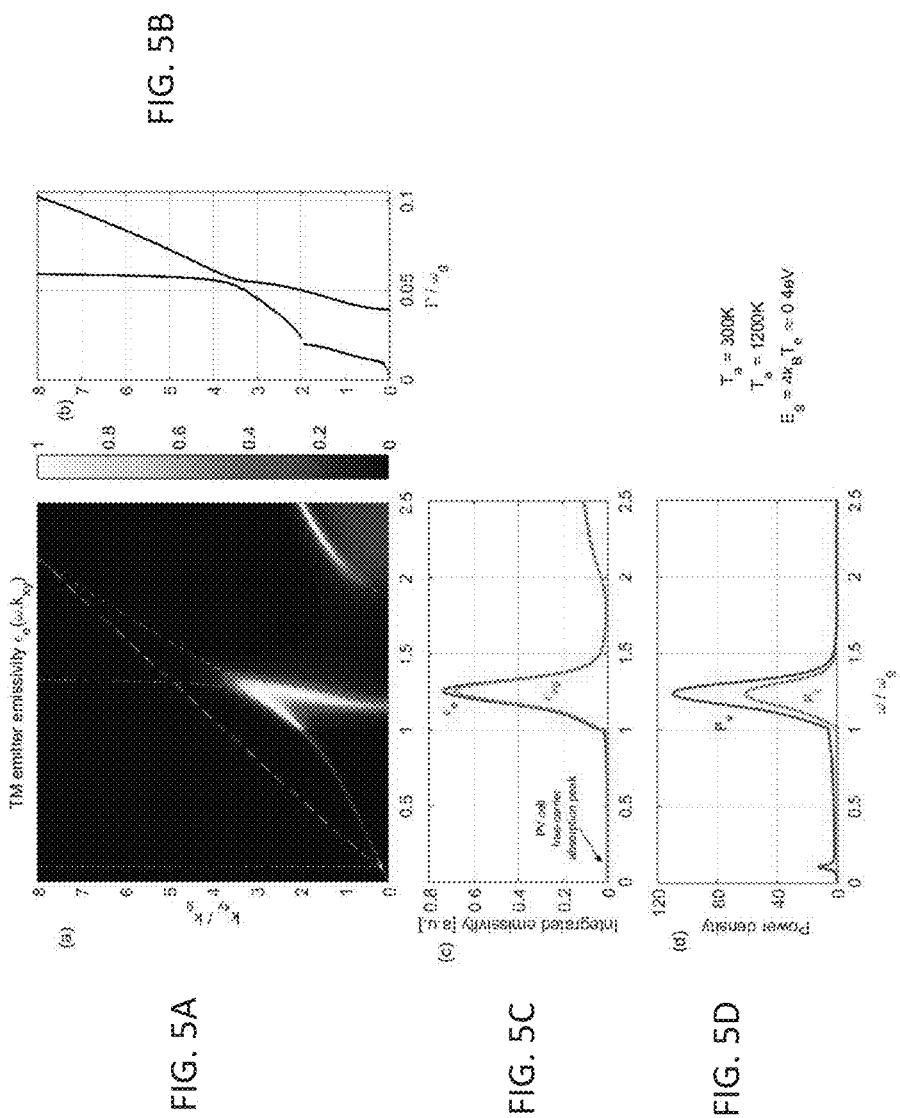
FIG. 5A shows TM emitter emissivity $\in_e(\omega,k_{xy})$ and dispersion of system modes (dotted white lines) for optimized structure of FIG. 4, at $T_e=1200°$ K, $T_a=300°$ K and with $E_g=4k_BT_e\approx0.4$ eV; dashed line is the semiconductor-material radiation cone.
FIG. 5B shows loss rates of the two coupled system modes.
FIG. 5C shows TM emitter emissivity $\in_e(\omega)$ (upper line) and emitter-bandgap transmissivity $\in_{eg}(\omega)$ (lower line) integrated over $k_{xy}$.
FIG. 5D shows TM emitter power $P_e(\omega)$ (upper line) and load power $P_l(\omega)$ (lower line) densities at the optimal-efficiency load voltage.

In FIG. 5A, we show a color plot of the resulting TM emitter thermal emissivity spectrum $\in_e(\omega,k_{xy})$ of the maximum-efficiency photonic structure, with its modes overlaid in dotted white lines. Note that the optimization was done considering both TE and TM polarizations, however, the TE contribution to the emissivity is comparatively small and is not shown in FIG. 5A for clarity.

The resonant crossing ("X-shape") of the emitter SPP mode and the absorber dielectric-waveguide-type mode is clearly visible in FIG. 5, and their coupling indicated by their splitting. Emissivity is maximized at 1 with a double-Lorentzian profile, at the point of resonant crossing and coupling, slightly above the bandgap, and indeed the amount of the splitting 2κ is approximately satisfying the impedance matching condition Eq. (54), as can be confirmed by observing also the loss rates Γ of the two system modes, shown in FIG. 5B. Note that the "kink" of the loss rate of one mode in FIG. 5B is due to the onset of semiconductor interband absorption.

Because of the presence of the metallic back electrode, the emitter SPP mode and the absorber first dielectric-waveguide-type mode couple in a way that, of the two resulting system "super-modes", the higher-frequency one has a ($k_{xy}=0$) cutoff and then (for large $k_{xy}$) gets close to the light-line of the absorber material, which is shown in FIG. 5A by a green dashed line. The optimal PV cell thickness $d_a$ is such that the cutoff is slightly above the bandgap, so the emitter emissivity is high for a large range of wave vectors just above the bandgap, a very desirable feature to enhance output power and efficiency. The lower-frequency (no-cutoff) system "super-mode" leads to some undesired below-bandgap emissivity, which stems primarily from coupling into the silver back-electrode losses. However, the presence of this metallic back electrode works overall beneficially, by essentially removing, from the radiation cone below the bandgap, many absorber modes, which would become additional lossy channels for the emitter to emit into.

One exception, an absorber mode that is not removed by the metal back electrode at low (below bandgap) frequencies, is a SPP mode on the interface between the vacuum gap and the doped semiconductor absorber, due to the free carriers of the latter inducing plasmonic-material behavior with $\sqrt{\varepsilon_{\infty,a}}\omega_{p,a}=0.4 \, \omega_g$, as seen in Eq. (86). Using Eq. (84), the upper-cutoff frequency for this SPP mode is $\omega_{p,a}/\sqrt{1+1/\varepsilon_{\infty,a}}\approx0.1 \, \omega_g$, at which below-bandgap frequency this absorber free-carrier SPP also couples to the emitter SPP and there is an associated undesired emissivity peak. This front-electrode loss mechanism can have a large impact on efficiency in different prior-art topologies.

The second TM dielectric-waveguide-type mode of the thin-film absorber is also evident at higher frequencies and also the high emitter emissivity associated with this mode's exponential tails reaching the emitter. This emissivity is also undesired, as it can be associated with large thermalization losses.

In FIG. 5C, we plot the emitter emissivity and the emitter-bandgap (eg) transmissivity both integrated vs $k_{xy}$ per Eq. (77). In FIG. 5D, we plot the emitter and load power density spectra, essentially the integrands of Eqs. (60) and (63). In comparing FIGS. 5C and 5D, multiplication by the exponentially decreasing factor $\Theta(\omega,0,T_e)$ leads to a beneficial suppression of the high-frequency emissivity into the second dielectric-waveguide-type absorber mode, but unfortunately "amplifies" the below-bandgap losses associated with free-carrier absorption in the thin-film PV cell and absorption by the silver back electrode. However, as shown below, in comparison to a bulk PV cell, the efficiency is substantially higher, because the double-Lorentzian spectrum profile and the relatively large vacuum gap between emitter and absorber have led in FIG. 5C to much suppressed free-carrier absorption loss to start with. The emitter near-field thermal power density spectrum (FIG. 5D) is almost a single impressively-narrowband peak, as desired for high efficiency and power TPV.

Optimized Performance and Design Parameters Vs Emitter Temperature

The optimization procedure is repeated for emitter temperatures $T_e$ from 600° K to 3000° K. At each emitter temperature, the PV-cell semiconductor bandgap is selected from Eq. (85). The resulting optimized efficiency as a function of $T_e$ is shown in FIG. 6A (thick black line) and is compared to the theoretical (Carnot) limit of efficiency $\eta_{max}=1-T_d/T_e$ (grey region) and also to the case of a PEC back electrode (thick purple line). The demonstrated efficiencies are closer to the Carnot limit than the efficiencies of prior-art TPV systems. The system with a PEC back electrode lies 10-15% lower than the Carnot limit and the silver electrode causes an optimal-efficiency drop of another 10-15%. The efficiency is very high ~47% at $T_e=1200°$ K and even higher ~61% at $T_e=3000°$ K with realistic material parameters. In addition to the efficiency, in FIG. 6A, we also show the contributions of the different loss mechanisms. Thermalization losses (thin solid lines) are the largest ones, the silver electrode losses (dashed black line) are around 20% and the free-carrier absorption losses (dash-dotted lines) are suppressed due to the large vacuum gap to less than 4%.

The power density at the output load of the PV cell as a function of temperature, for this optimal design, is also shown in FIG. 6A (thick black line—right axis). As temperature increases, the output power increases due to both the $\sim T_e^4$ dependence and also the fact that efficiency increases. The results indicate that power densities of 2 W/cm$^2$ are achievable at $T_e=1200°$ K (with ~47% efficiency) and even 100 W/cm$^2$ at $T_e=3000°$ K (with ~61% efficiency) with a silver back electrode. Such performance, in terms of both power density and efficiency, has never been demonstrated before, to our knowledge, and opens the way for commercial TPV devices that deliver significant power from heat with little waste.

We show the optimal values of the parameters $\omega_{p,e}$ in FIG. 6B, $d_{vac}$ in FIG. 6C, $qV/E_g\eta_{max}$ in FIG. 6D and $d_a$ in FIG. 6E. Note that we actually show $\omega_{p,e}/\sqrt{2}$, at which $\varepsilon_e'\approx-1$, so that it can be compared to the materials in Table 1. $\omega_{p,e}/\sqrt{2}$ indicates the cutoff for an emitter-vacuum SPP and needs to lie above the semiconductor bandgap $\omega_g$, also shown for guidance (dashed black line). For a PEC back electrode and high enough $T_e$, all normalized structural parameters are fairly constant with $T_e$, indicating that the optimal structure simply scales with $T_e$. For a silver back electrode, the optimal $d_{vac}/\lambda_g$ is smaller than that for a PEC, since the additional silver losses induce a larger absorber-mode loss rate $\Gamma_a$ and therefore the absorber needs to come closer to the emitter, so that the coupling $\kappa$ can be increased to achieve impedance matching. Furthermore, since the silver plasma frequency (9.3 eV/$\hbar$) effectively decreases relatively to the semiconductor bandgap frequency $\omega_g=4k_BT_e/\hbar$, as $T_e$ increases, the normalized PV-cell thickness $d_a/\lambda_g$ needs to be reduced, so that the absorber mode remains at the same relative frequency above the increasing bandgap. The optimal load voltage qV follows pretty closely the value $E_g(1-T_d/T_e)$.

Performance examples of our structures include: at $T_e=1200°$ K, output 2 W/cm$^2$ with ~47% efficiency (e.g., using ZrC emitter and 160 nm-thick InAs absorber at 300 nm vacuum gap), at $T_e=2100°$ K, 24 W/cm$^2$ with ~57% efficiency (e.g., using TiC emitter and 80 nm-thick GaSb absorber at 200 nm gap), and, at $T_e=3000°$ K, 115 W/cm$^2$ with ~61% efficiency (e.g., using W emitter and 50 nm-thick $Ga_{0.3}In_{0.7}P_{0.6}As_{0.4}$ absorber, grown on InP, at 140 nm gap).

Optimized Performance and Design Parameters Vs Load Power Density

Figure 7A:
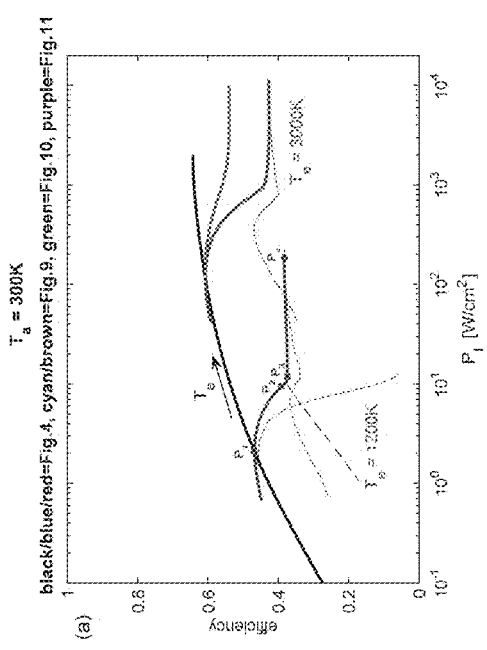

The performance of any electronic power converter, including a TPV, is often judged by the efficiency achievable as a function of the power delivered to the load. Therefore, in FIG. 7 we replot vs power the results of the previous optimization, with $T_e$ being a parameter of the various curves (thick black line). Furthermore, we perform, at a given emitter temperature $T_e$, another, constrained optimization, with optimization parameters same as before, only with the constraint that the load power takes a prescribed value. At this $T_e$, the best overall efficiency attainable is the result of our previous optimization (FIG. 7A thick black line).

The optimization results are shown in FIGS. 7A-7F for two emitter temperatures $T_e=1200°$ K (thick blue lines) and $T_e=3000°$ K (thick red lines). The best achievable efficiency at each power level is plotted in FIG. 7A; the thermalization, silver back-electrode and semiconductor free-carrier losses in FIG. 7B; and the optimal parameter values ($\omega_{p,e}/\omega_g$, $d_{vac}/\lambda_g$, $qV/E_g$ and $d_a/\lambda_g$) in FIGS. 7C-7F respectively. The optimal TM emitter thermal emissivity $\in_e(\omega,k_{xy})$ and the emitter/load power densities are plotted in FIG. 8 for four load-power values at 1200° K (indicated also with dots $P_1$-$P_4$ in FIG. 7A). $P_1$ corresponds to the highest efficiency solution, so FIGS. 8A and 8B are exactly the same as FIGS. 5A and 5D.

The results can be understood as follows: As the desired output power level increases, FIG. 7D shows that, as should be expected, the vacuum gap width decreases. Effectively, impedance matching and thus high emissivity can be achieved at a higher wave vector (and always at a frequency just above bandgap for good efficiency), so that the $k_{xy}$ integration in Eq. (29) leads to more power. However, the absorber dielectric-waveguide-type mode has an upper $k_{xy}$ limit, the light-line of the semiconductor material (indicated in FIG. 8 with dashed green lines). Therefore, resonant crossing and coupling of this absorber mode with the emitter SPP (and the associated double-Lorentzian emissivity profile of Eq. (56)) is possible only up to approximately the power level $P_2$ (FIGS. 8C and 8D). Between $P_1$ and $P_2$, as this "good" resonant coupling worsens, the vacuum gap has decreased so much, that the "bad" coupling of the emitter SPP to the below-bandgap absorber-free-carrier SPP has increased significantly, and thus the associated losses are much larger (FIG. 7B) and efficiency drops (FIG. 7A).

Figure 7B:
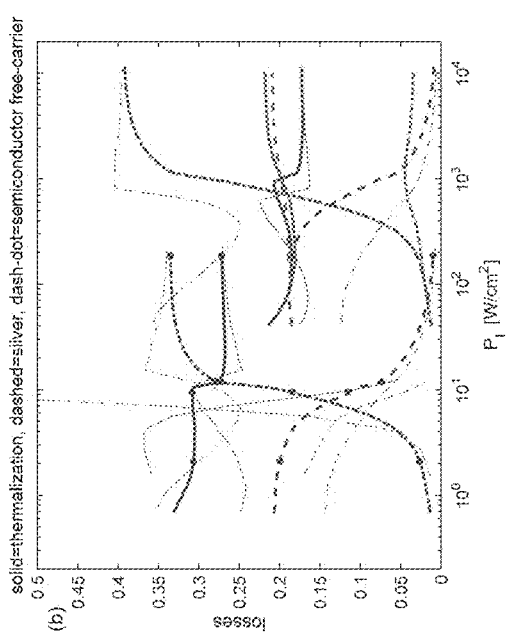

From that point on, the absorber should be so close to the emitter that the emitter SPP has substantial energy inside the absorber. Thus, it is beneficial to redesign this single mode to get an efficient impedance-matched single-Lorentzian emissivity profile (Eq. (49)). So one optimal solution for $\omega_{p,e}/\omega_g$ and $d_a/\lambda_g$ has an abrupt change from $P_2$ to $P_3$ (FIGS. 7C and 7F). For even higher power, the emissivity is dominated by this tightly confined emitter-absorber SPP mode, whose dispersion moves to higher wave vectors, as the vacuum gap further decreases. Its modal energy decays faster in the absorber and sees less of the silver back electrode, whose associated losses then drop (FIG. 7B). In essence, at $P_4$ (FIGS. 8G and 8H) the system looks a lot like a semi-infinite plasmonic emitter separated by a tiny gap from a bulk semiconductor absorber. $qV/E_g$ can be seen, in FIG. 7E, to again stay close to $1-T_a/T_e=\eta_{max}$ for all power levels.

Surface-Plasmon-Polariton Emitter and Bulk Semiconductor Absorber (Prior Art) Performance It is instructive to compare how this prior-art system performs compared to an example of the current system. Consider the structure 900 in FIG. 9A. Like the structure in FIG. 4, the structure 900 in FIG. 9A includes a plasmonic emitter 910 separated by a vacuum gap 920 from a PV-cell absorber 930 having a highly-doped semiconductor front electrode 932, a pn-junction depletion region 934 and a back-surface metallic electrode and reflector 936. Unlike the PV cell 430 in FIG. 4, the PV cell 930 in FIG. 9A includes an additional "base" region 938 in the semiconductor. This base region has a very large (bulk) width (we use $d_{a,base}=5\lambda_g$) and is more lightly doped than the thin front (pn-junction "emitter") region of permittivity $\varepsilon_a$ from Eq. (86).

Figure 9A:
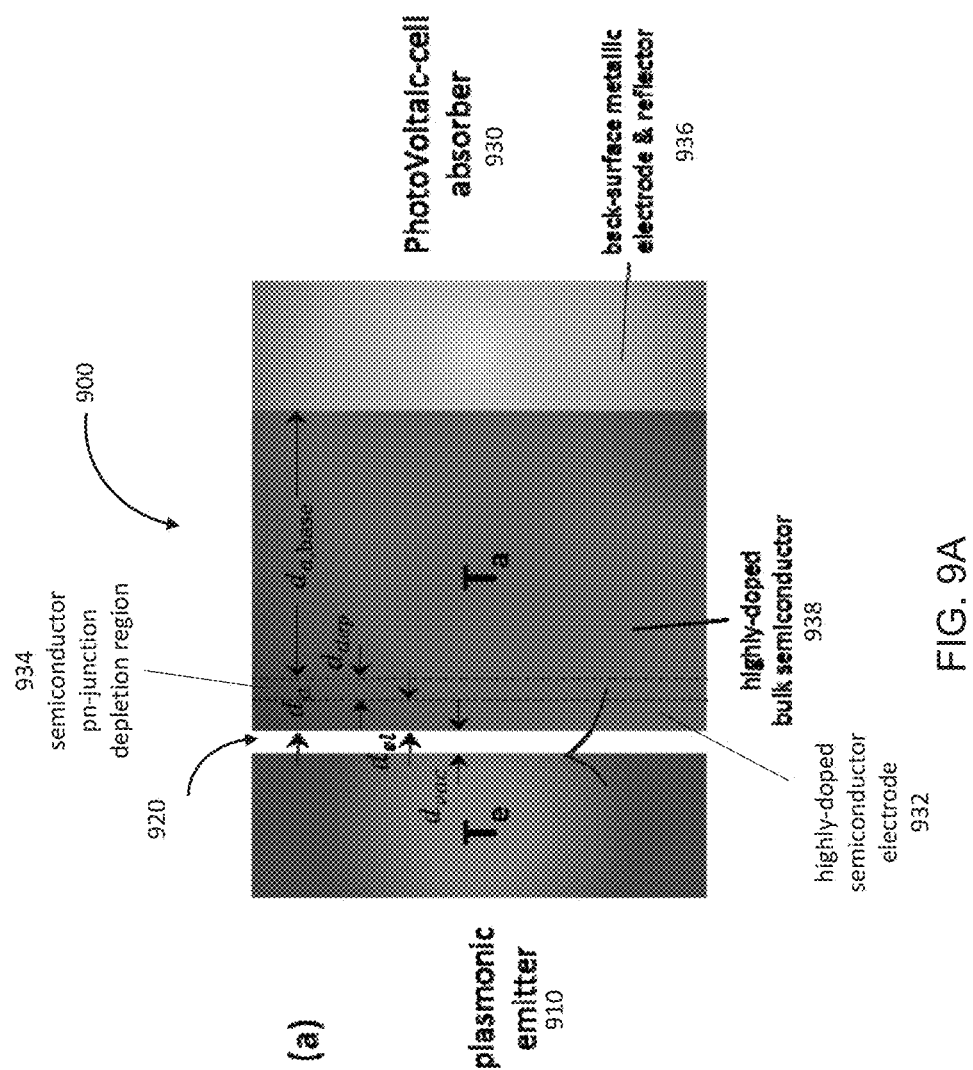
FIG. 9A shows a TPV device with a hot plasmonic emitter is separated by a vacuum gap from a PV cell comprising a semiconductor bulk pn-junction absorber, including a front highly-doped electrode (or pn-junction "emitter") region, a depletion region and a "base" region, backed by a metallic electrode/reflector. Also shown qualitatively is a typical energy-density profile of the emitter SPP mode, on its interface with the vacuum gap, extending into the semiconductor absorber.

We take the doping level of the "base" region 938 in FIG. 9A to be $\omega_{p,a,base}=\omega_{p,a}/2=0.2\omega_g/\sqrt{\varepsilon_{\infty,a}}$, which would correspond, for example, to $N_e \approx 2\times10^{17}$ cm$^{-3}$ electrons at $T_e=1200°$ K, and thus the dielectric permittivity in the "base" region is taken $$\varepsilon_{a,base}(\omega) = 14 - \frac{0.04}{(\omega/\omega_g)^2 + i0.01\omega/\omega_g} + i0.7(\omega_g/\omega)\sqrt{14(\omega/\omega_g-1)} \quad (89)$$

We keep the silver back electrode as it helps prevent radiation of photons within the semiconductor light-line. We optimize again the efficiency vs load power, at $T_e=1200°$ K with fixed $d_a=0.07\lambda_g$ and at $T_e=3000°$ K with fixed $d_a=0.061\lambda_g$, to compare with the thin-film optimized structures at high power. The optimization parameters are $\omega_{p,e}$, $\omega_g$, $d_{vac}/\lambda_g$, $qV/E_g$.

The results are shown in FIG. 7 with thin solid lines, cyan and brown for $T_e=1200°$ K and $3000°$ K respectively, and in FIGS. 9B-9E, the TM emitter emissivities and emitter/load power densities for the two power levels $P_1$, $P_3$ at $1200°$ K. Clearly, the optimal efficiency is significantly lower than the thin-film absorber case (FIG. 7A), especially at lower power levels. Most of the losses come from free-carrier absorption within the semiconductor bulk (FIG. 7B), so we found the efficiency to be mostly dependent on the choice of $\omega_{p,a,base}$ rather than $d_a$. This is because this single-mode impedance matching requires a much smaller vacuum gap at the same power level (FIG. 7D) and thus the emitter SPP couples strongly with the absorber free carriers. At the same time, the bulk absorber geometry means that the semiconductor light cone is filled with modes, even below bandgap, which attribute to loss by free-carrier absorption (FIGS. 9B-9E). This is more pronounced as load power goes down and low-$k_{xy}$ modes play a greater role. The distant silver back electrode does not impact efficiency greatly (FIG. 7B).

In prior art with thick absorbers in both far-field and near-field TPV systems, a metallic back reflector has been shown to slightly improve efficiency by reflecting back into the emitter and recycling the undesired below-bandgap photons. However, this improvement was not significant and we see here that true removal of the radiation modes can only happen with a thin-film PV cell. Notice also how, at the same power level $P_1$, the coupled-resonances structure of FIG. 4 has a much sharper power-density spectrum in FIG. 8B than that in FIG. 9C for the structure with a single resonance of FIG. 9A.

Note that, for both the current thin-film-absorber and the prior-art bulk-absorber TPV systems, the thermalization losses (FIG. 7B) stay relatively close to the $T_a/T_e$ value dictated by the Carnot limit.

Figure 10A:
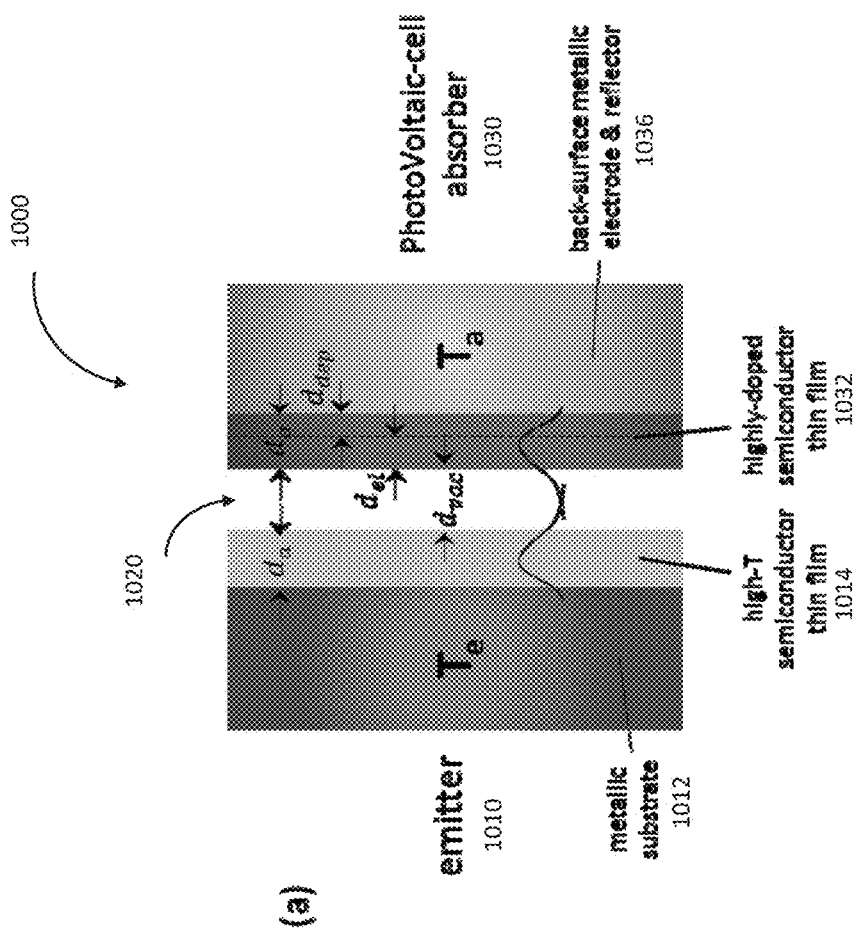
FIG. 10A shows a TPV device with a hot emitter semiconductor thin-film on a metallic substrate is separated by a vacuum gap from a PV cell comprising a highly-doped semiconductor thin-film pn-junction absorber, including a front highly-doped electrode region and a depletion region, backed by a metallic electrode/reflector.

Thin-Film Semiconductor Emitter and Thin-Film Semiconductor Absorber (Prior Art) Performance Another prior-art system, which does use the concept of resonance, is that of two coupled semiconductor thin-films, shown in FIG. 10A, where the bandgaps of the emitter and absorber semiconductors are matched. FIG. 10A shows a TPV cell 1000 that includes an emitter 1010 that includes a high-T semiconductor film 1014 with a metallic substrate. The TPV cell 1000 also includes a PV-cell absorber 1030 opposite the emitter 1010 across a vacuum gap 1020. The PV-cell absorber 1030 includes a highly doped semiconductor thin film 1032 facing the high-T semiconductor thin film 1014 and a back-surface metallic electrode and reflector 1036.

We perform the optimization at $T_e=1200°$ K, which is higher than most semiconductor melting temperatures (exceptions Ge: ~1211° K and Si: ~1638° K), but this temperature helps us compare to the structures already discussed. For the PV cell, we assume the same semiconductor permittivity $\varepsilon_a$ from Eq. (86) and a back silver electrode. For the emitter, we assume an undoped semiconductor with matched bandgap $\omega_g$ and permittivity $\varepsilon_e$ of the form of Eq. (86). However, at that close-to-melting temperature the thermally-excited intrinsic carriers may be extremely high and the mobility of those carriers greatly reduced. It is not easy to exactly predict those quantities, but based on estimations (using $n_i \sim T^{3/2} e^{-E_g/2k_BT}$ and $\mu \sim 1/T$ for n-GaAs), we make the simple assumptions that carriers are 4 times higher than in the absorber, so $\sqrt{\varepsilon_{\infty,e}}\omega_{p,e}=0.88\omega_g$, and that carrier mobility is 4 times lower, so $\gamma_e=0.08\omega_g$. We also ignore the effect that the bandgap shifts to lower frequencies and gets smeared at high temperature; one could claim that an emitter semiconductor can be chosen, such that it has a high-energy bandgap at room temperature, which shifts down to meet the absorber at high temperature; in reality, this is likely possible only for few sets of semiconductor pairs.

Finally, the emitter thin film is backed by tungsten W. By fitting the Drude model to room-temperature experimental data for tungsten in the range (0.1-1) eV, we get $\varepsilon_{\infty,W}=36$, $\sqrt{\varepsilon_{\infty,W}}\hbar\omega_{p,W}=5.88$ eV and $\hbar\gamma_W(300°$ K$)=0.058$ eV; at $1200°$ K, we increase the loss rate in proportion to the increase of the dc resistivity, so $\hbar\gamma_W(1200°$ K$)=0.33$ eV. Since the real parts of $\varepsilon_a$, $\varepsilon_e$ are quite similar and Ag, W performs similarly for modal confinement, we take, for simplicity, equal thickness $d_a$ of the two thin films, which is such that the first dielectric-waveguide-type modes of the emitter and absorber couple just above bandgap. Our optimization parameters are thus $d_{vac}/\lambda_g$, $d_a/\lambda_g$ and $qV/E_g$.

Figure 10B:
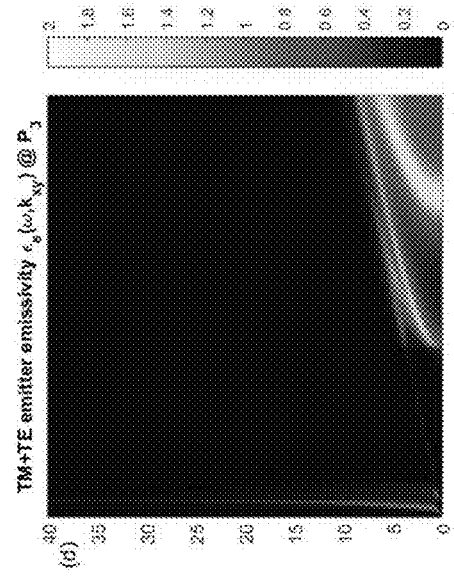
FIGS. 10B-10E show qualitatively typical energy-density profiles of the emitter and absorber dielectric-waveguide-type photonic modes (B, C, E, E) Spectra for optimized results of FIG. 7 green line (FIG. 10A system at $T_e=1200°$ K) at 2 load-power levels indicated on FIG. 7 blue line: (B, C) $P_1$, (D, E) $P_3$. (B, D) Emitter emissivity $\in_e(\omega,k_{xy})$; max value is 2 for sum of TM and TE. (C, E) Emitter power $P_e(\omega)$ (red line) and load power $P_l(\omega)$ (green line) densities at the optimal-efficiency load voltage.
Figure 10D:
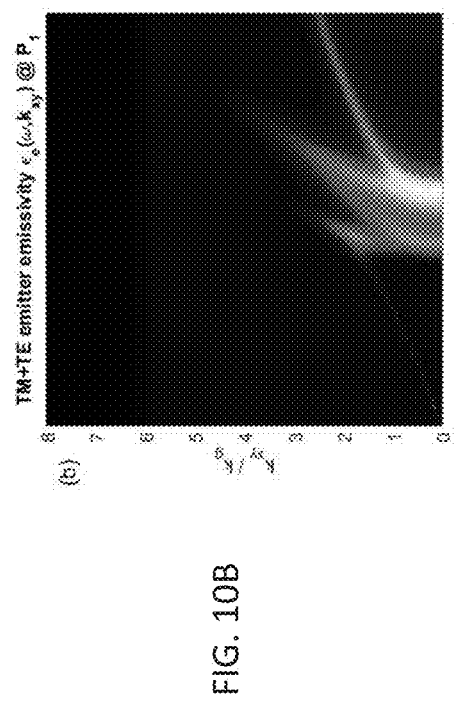
Figure 10C:
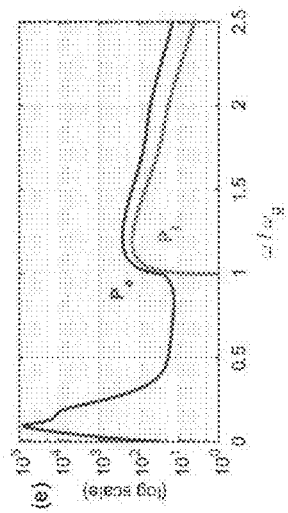
Figure 10E:
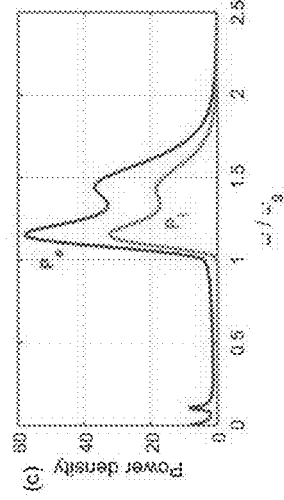

The results are shown in FIG. 7 again, with thin green lines, and in FIG. 10B-E are the emitter emissivities (for both polarizations, thus max value is 2) and emitter/load power densities for $P_1$ and $P_3$. At lower power levels, efficiency is similarly high as the current systems, as the benefits of the resonance with the thin-film absorber are present in this system too: high above-bandgap emissivity due to impedance-matched coupled resonances, suppressed free-carrier absorption due to large vacuum gap, removal of below-bandgap modes due to the metallic (Ag, W) reflectors (FIGS. 10B and 10C). However, as the desired load power increases, the "good" coupling of dielectric-waveguide-type modes meets its $k_{xy}$-limit, while emissivity related to the two (emitter and the absorber) free-carrier SPP ($k_{xy}$-unbounded) modes increases strongly as the vacuum gap decreases, thus efficiency drops very fast (FIGS. 10D and 10E). Note that if these two SPP modes were at the same frequency (a resonance, which we intentionally avoided in these simulations), there would be strong coupling between them as well and the losses would be even greater.

It is certainly difficult to predict accurately the performance of this system, as accurate modeling of the semiconductors (especially at very high temperature) is non-trivial, but qualitatively one can expect a lower load-power limit for these systems.

Example TPV System: Surface-Plasmon-Polariton Emitter and Surface-Plasmon-Polariton Absorber It can be beneficial to design a TPV system where the emitter and absorber support separate resonances, which couple in the near field and are impedance matched at a crossing frequency just above the semiconductor bandgap frequency. However, it was seen that, for one embodiment of a SPP emitter coupled to a thin-film absorber with a silver back electrode/reflector, there was an upper load-power limit, above which it is impossible to maintain resonant coupling, since the dielectric-waveguide-type absorber mode has a $k_{xy}$-limit, the light line of the absorber material. There is another way, however, to achieve resonant coupling between emitter and absorber at any power, if also the absorber supports a SPP mode. Note that this typically requires the semiconductor film to be even thinner.

One such resonant absorber-SPP implementation is to make the back electrode of a plasmonic material ($\varepsilon_{\infty,m}$, $\omega_{p,m}$, $\gamma_m$) with a small enough $\omega_{p,m}$ that the SPP supported at its interface with the semiconductor has a cutoff ($\approx \omega_{p,m}/\sqrt{1+\varepsilon_d/\varepsilon_{\infty,m}}$) just above the semiconductor bandgap $\omega_g$. There are quite a few metals or metallic-type materials with relatively small $\omega_{p,m}$ (for example, some of those presented in Table 1 for the emitter) that can be used as a plasmonic back electrode. Another choice is a very highly-doped semiconductor or a highly-doped conducting oxide (a few of which we see below) whose $\omega_{p,m}$ can be tuned via the doping concentration. However, we saw (in FIG. 7B) that there may be significant losses due to emitter photons absorbed by the back electrode, even for silver, one of the least lossy plasmonic materials. This may be even worse for a SPP mode, which by construction relies on significant modal penetration into the plasmonic material, with a SPP-modal loss rate $\gamma_m/2$ in the limit of large $k_{xy}$. Therefore, the back-electrode plasmonic material may need to have a very small $\gamma_m$ for this mechanism to work efficiently. Most of the above-mentioned materials may unfortunately typically have a quite large $\gamma_m$.

Therefore, we disclose a way to get an effective plasmonic material with parameters in the desired frequency range using silver. It has been shown that metallo-dielectric photonic crystals, which are metals with periodic geometry patterning, can exhibit plasmonic-type effective behavior with a plasma frequency that is lower than that of the metal used to make the photonic crystal and tunable via the fill factor of the patterning. In some sense, one gets a material that is a (fill-factor weighted) average of the metal and dielectric material (often air/vacuum). The period of the geometric patterning is a few times smaller than the SPP propagation wavelength $2\pi/k_{xy}$ for the metamaterial effective medium approximation to hold. These effective SPP modes are called "spoof" plasmons for the subcase of a metal with a 2D periodic patterning of holes on its flat interface.

Figure 11A:
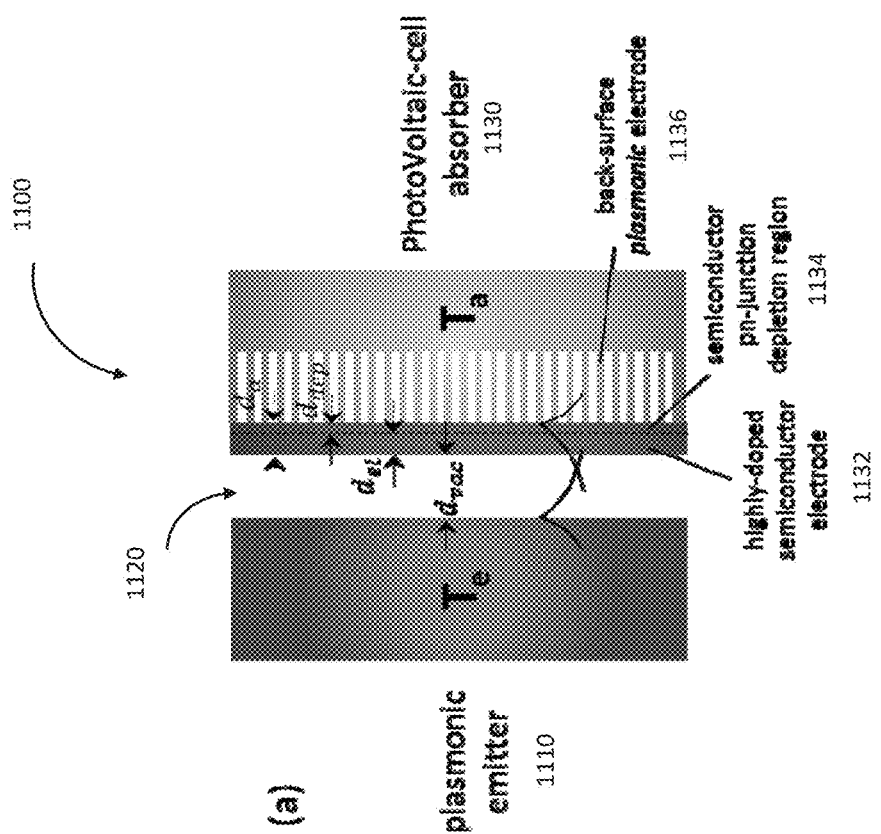
FIG. 11A shows an example near-field TPV structure. A hot plasmonic emitter is separated by a vacuum gap from a PV cell comprising a semiconductor thin-film pn-junction absorber, including a front highly-doped electrode region and a depletion region, backed by a plasmonic electrode/reflector, implemented here effectively via patterning nanoholes into silver. Also shown qualitatively are typical energy-density profiles of the emitter SPP mode, on the emitter's interface with the vacuum gap, and the back-electrode SPP mode, on the interface of the back electrode with the semiconductor thin film and extending into the vacuum gap.

FIG. 11A shows an implementation 1100 for this embodiment of an inventive TPV system. This TPV cell 1100 includes a plasmonic emitter 1110 that faces a PV-cell absorber 1130 across a vacuum gap 1120. The PV-cell absorber 1130 includes a highly doped semiconductor electrode 1132 facing the plasmonic emitter 1110, a semiconductor pn-junction depletion region 1134, and a back surface plasmonic electrode 1136.

In performing optimization of efficiency vs load power for this system, the properties of the plasmonic emitter and semiconductor absorber are the same as in the case of FIG. 4, while the back electrode is now modeled as a "tunable silver" with $\varepsilon_{\infty,Ag}=4$ and $\omega_{p,m}$ being an additional optimization parameter, irrespectfully of the exact details of the geometric patterning that achieve it, as long as it is not much smaller than the silver value $\hbar\omega_{p,Ag}=4.65$ eV. For this latter reason, this scheme may be more applicable for very high emitter temperatures, for which the optimal semiconductor bandgap is high (close to 1 eV). Thus we only perform this optimization for $T_e=3000°$ K. To precisely model the back-electrode loss factor $\gamma_m$, one would need to know the geometry details, but we avoid this complexity here; instead, to get a performance estimate, we simply use the material-averaging argument that the effective losses follow the effective plasma frequency $\gamma_m=\omega_{p,m}\gamma_{Ag}/\omega_{p,Ag}$. We consider the best-case scenario, in which the silver losses remain constant $\hbar\gamma_{Ag}=0.023$ eV, independent of the patterning. In reality, the silver losses may additionally depend on its grain size, with a dependence of the form $\hbar\gamma_{Ag}=0.023$ eV+const/$d_{pattern}$, where $d_{pattern}$ is a characteristic size of the patterning.

Figures 11B, 11C, 11D:
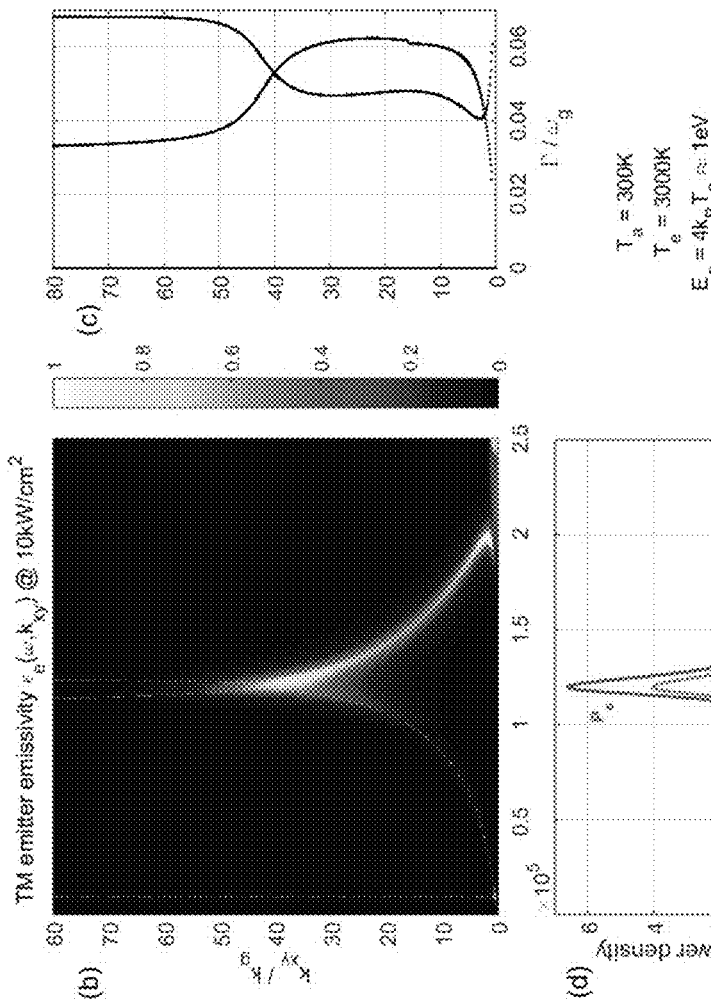
FIG. 11B shows TM emitter emissivity $\in_e(\omega,k_{xy})$ (color plot) and dispersion of system modes (dotted white lines) for optimized structure of FIG. 11A at $P_l=10$ kW/cm², $T_e=3000°$ K, $T_a=300°$ K and with $E_g=4k_BT_e\approx1$ eV.
FIG. 11C shows loss rates of the two coupled system SPP modes.
FIG. 11D shows TM emitter power $P_e(\omega)$ (red line) and load power $P_l(\omega)$ (green line) densities at the optimal-efficiency load voltage.

The results for the best-case scenario are shown in FIG. 7 with thick magenta lines. In FIG. 11B, we show a color plot of the resulting TM emitter thermal emissivity spectrum $\varepsilon_e(\omega,k_{xy})$ of the maximum-efficiency photonic structure at 10 kW/cm². The corresponding emitter/load power densities are shown in FIG. 11D. The system modes' dispersion is overlaid in FIG. 11B with dotted white lines. In FIG. 11C, we plot the loss rates of the two SPP modes, which can be confirmed as approximately impedance matched ($\kappa\approx\sqrt{\Gamma_e\Gamma_a}$). Clearly, in the case of constant silver losses, it can be seen that a large TPV efficiency can be achieved even for very high power levels (FIG. 7A). To achieve impedance matching at higher power, and thus higher $k_{xy}$, a thinner semiconductor film is required (FIG. 7F), and due to the coupled resonances (FIG. 11B), the required vacuum gap for impedance matching is larger than in the other cases (FIG. 7D). Therefore the free-carrier losses stay low even for increasing power, and it is the back electrode losses that limit the performance (FIG. 7B), as predicted.

Therefore, in some embodiments of the near-field TPV systems, patterning the silver back electrode may increase TPV efficiency at high emitter temperatures and load power levels unless the patterning-dependent silver losses are very large. In this case, the back electrode losses may increase so much that it may not be beneficial anymore to use a patterned back electrode instead of plain silver and the implementation of a single emitter-SPP resonance extending into the absorber.

Another way to implement a resonant absorber SPP with strictly (instead of effectively) a planar structure using silver is to use, as back electrode, an ultra-thin silver film on a dielectric substrate. The film supports an SPP on each of its two interfaces (with the semiconductor film and the dielectric substrate). These SPPs couple more strongly as the silver thickness gets smaller and one of the two resulting coupled-SPP modes is shifted to lower frequencies. For some ultralow silver-film thickness, this coupled-SPP mode can be shifted from $\approx \hbar \omega_{p,Ag}/\sqrt{1+\varepsilon_d/\varepsilon_{\infty,Ag}} \approx 2.2$ eV (for $\varepsilon_d \approx 14$) down to $\approx 1.2$ eV and thus become resonant with the emitter SPP, for an emitter at 3000° K.

Our simulations have shown that such an implementation can be efficient, although for the simulation parameters chosen it performed worse than simply a bulk semiconductor absorber. This is because such an absorber-SPP implementation relies heavily on the ultrathin silver film for confinement and is therefore very lossy. In addition, the square resistance of such an ultrathin back electrode may not be adequate for the electrical operation of the device. However, this implementation is practically much simpler and may provide improved performance in certain operational regimes (e.g., if a very low front-electrode resistance is required).

Front-Electrode Designs for Efficient Planar TPV Systems

Figures 12A, 12B:
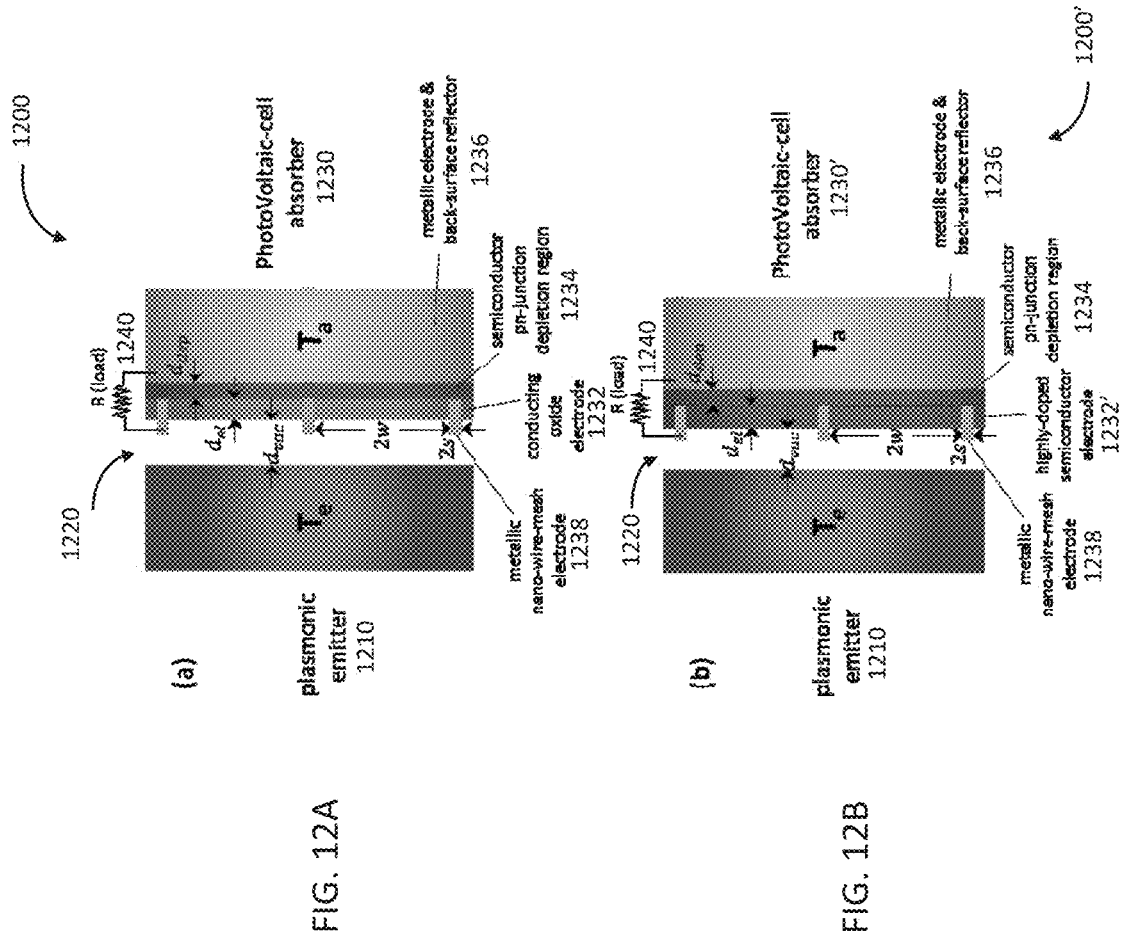
FIGS. 12A-12C show example near-field TPV structures with different front conductive electrodes.
Figure 12C:
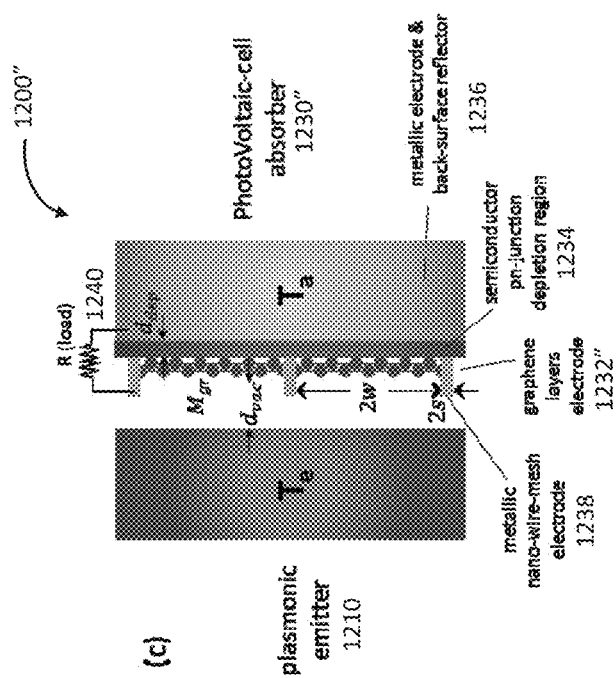

As discussed earlier, the PV cell has a front electrode that is conductive and transmits hot photons to from the emitter to the thin film of semiconductor material. One way to accomplish this is via a medium-conductive thin film electrode, which allows photon passage, assisted by a (parallel or rectangular) nanowire mesh of a highly conducting material (e.g., silver), which would itself be opaque to photons. Such embodiments are shown in FIGS. 12A-12C, where 2w and 2s are the spacing (pitch) and width, respectively, of the parallel metal nanowires. To first order, this mesh blocks $\Delta\eta_{nanowires}=s/(s+w)$ photons, so nanowires with large aspect ratios (thin but tall) may be preferred. The nanowires can be buried inside the thin-film electrode or deposited on top of it as long as they can fit inside the small vacuum gap without getting too close to the emitter.

FIGS. 12A-12C show TPV cells 1200, 1200', and 1200" with different front electrodes. In each structure, a hot plasmonic emitter 1210 is separated by a vacuum gap 1220 from a PV cell 1230, 1230', 1230" comprising a semiconductor thin-film pn-junction depletion region 1234, a front conductive electrode 1232, 1232', 1234" assisted by a metallic nanowire mesh 1238 and a back metallic electrode/reflector 1236. FIGS. 12A-12C also show a load 1240 connected to the front electrode and the back electrode 1236. The front conductive electrode can be: a thin film of a conducting oxide 1232 as shown in FIG. 12A, a highly-doped region of the semiconductor thin-film absorber 1232' as shown in FIG. 12B, or graphene layers as shown in FIG. 12C.

Electrode Square Resistance

The current due to photo-generated carriers, upon exiting the depletion region and entering the thin-film electrode, "turns" to run parallel to this thin film in order to make it to the highly conducting nanowires. How high the DC conductivity $\sigma_{DC,el}=\sigma_{el}(\omega=0)$ and how large the thickness $d_{el}$ of the thin-film electrode should be depends on its necessary square resistance $R_{el}=1/\sigma_{DC,el}d_{el}$. The efficiency drop due to the finite $R_{el}$ can be estimated by $\Delta\eta_{el}=I_A R_{el} w^2/3V=\eta$ $P_{e,A}R_{el}w^2/3V^2$. If we assume the previously explained scaling $E_g \approx 4k_B T_e$ and $qV \approx E_g(1-T_a/T_e) \sim T_e$, for $T_e \gg T_a$, and $P_{e,A} \sim T_e^4$, one can estimate that the efficiency drop $\Delta\eta_{el}$ may be approximately independent of emitter temperature, if $w \sim \lambda_g \sim 1/T_e$ and $R_{el}$ is a constant. Therefore, in our first subsequent simulations, we impose the condition that $R_{el}=60\Omega$, a reasonable value for the square resistance also in solar PV-cell electrodes.

The conductivity can be calculated using the Drude model for free-carriers: we equate the permittivity of Eq. (82) to $\varepsilon_\infty+i\sigma(\omega)/\omega\varepsilon_o$ to find $$\sigma(\omega)=\frac{\varepsilon_o\varepsilon_\infty\omega_p^2}{\gamma-i\omega} \Rightarrow \sigma_{DC}=\sigma(\omega=0)=\frac{\varepsilon_o\varepsilon_\infty\omega_p^2}{\gamma}=\frac{\varepsilon_\infty\omega_p^2}{\zeta_o c\gamma} \quad (90)$$

where $\zeta_o=\sqrt{\mu_o/\varepsilon_o}$ the impedance of free space. For each candidate electrode material the mobility $\mu_{el}$ of free carriers depends on their density N; since $\gamma(N)=q/\mu(N)m^*$ and $\omega_p=q\sqrt{N/\varepsilon_o\varepsilon_\infty m^*}$ from Eq. (83), each electrode material can be described either by $\mu_{el}(N)$ or, equivalently, by a function $\gamma_{el}(\omega_{p,el})$, where N is an underlying tunable-via-doping parameter. Therefore, a given desired electrode square resistance imposes the condition $$\frac{1}{R_{el}}=\sigma_{DC,el}d_{el}=q\mu_{el}(N)Nd_{el}=\frac{\varepsilon_{\infty,el}\omega_{p,el}^2}{\zeta_o c \gamma_{el}(\omega_{p,el})}d_{el} \quad (91)$$

Typically, the higher the carrier density N (and thus $\omega_{p,el}$), the more conductive the thin-film electrode material is, and thus the thinner it should be.

Optimal Electrode Doping Level

However, a material with high DC conductivity $\sigma_{DC}$ typically also has high AC conductivity $\text{Re}\{\sigma(\omega)\}$, thus absorbing more impingent photons instead of transmitting them. If we consider the ratio $\text{Re}\{\sigma(\omega)\}/\sigma_{DC}$, then, using Eq. (90), $$\text{Re}\{\sigma(\omega)\}=\frac{\varepsilon_o\varepsilon_\infty\omega_p^2\gamma}{\gamma^2+\omega^2} \Rightarrow \frac{\text{Re}\{\sigma(\omega)\}}{\sigma_{DC}}=\frac{\gamma^2}{\gamma^2+\omega^2} \quad (92)$$

Therefore, one may be tempted to conclude that we are looking for the smallest possible loss rate $\gamma_{el}$. Certainly, given a free-carrier plasma frequency $\omega_{p,el}$, the material with a small or minimum $\gamma_{el}$ (namely least possible carrier scattering rates and thus highest mobility) may be the best. However, given a certain material, it is not straightforward that one should choose the doping level ($\omega_{p,el}$) that minimizes $\gamma_{el}$, as Eq. (91) poses an additional restriction. Therefore, for a given electrode material, it is not clear what is the optimal doping level (N) under condition Eq. (91).

To examine this problem in more detail, we study a TPV system with a SPP emitter and the PV cell including a thin-film semiconductor absorber, a silver back electrode, and a thin-film front electrode described by the Drude model (FIG. 12A). We make again the simplified but not unreasonable electrode-material assumption that $\mu_{el} \sim 1/N \Rightarrow \gamma_{el} \sim \omega_{p,el}$, and specifically $\gamma_{el}=0.06\omega_{p,el}$ with $\varepsilon_{\infty,el}=4$, which resembles some real materials, as shown below. With $R_{el}=60\Omega$, Eq. (91) is rewritten as $d_{el}=0.015\lambda_{p,el}$, where $\lambda_{p,el}=2\pi c/\omega_{p,el}$. Since a separate thin film takes care of the front-electrode functionality, this time we assume that the semiconductor's entire thickness is the depletion region with permittivity:

$$\varepsilon_{dep}(\omega)=14+i0.7\sqrt{14\omega_g(\omega-\omega_g)}/\omega \qquad (93)$$

and that the internal quantum efficiency in the depletion region is $\eta_{iq,dep}(\omega)=H(\omega-\omega_g)$, where H the Heaviside step function, ignoring the very small free-carrier absorption and radiative recombination in it and all other recombination mechanisms. We then optimize the TPV efficiency at $T_e=3000°$ K $\Rightarrow E_g\approx 1.03$ eV with respect to $\omega_{p,e}/\omega_g$, $d_{vac}/\lambda_g$, $d_{dep}/\lambda_g$ and $qV/E_g$, for different values of $\omega_{p,el}$.

Figure 13A:
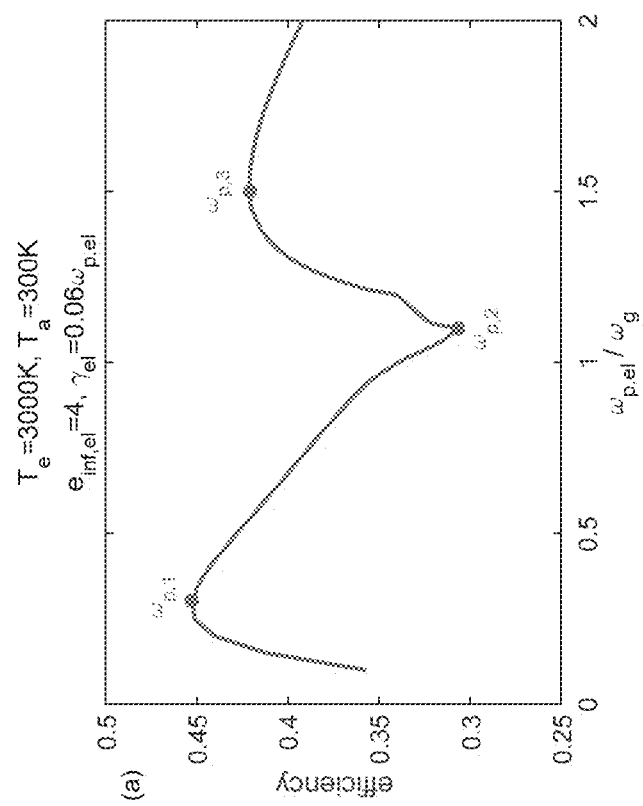

The results are shown in FIG. 13A for the efficiency and the optimal parameters are shown in FIGS. 13B-13E. In FIGS. 13F-13K, we show the optimized TM emitter emissivity and emitter/load power densities for 3 doping levels $\omega_{p1}-\omega_{p3}$. FIG. 13A shows an interesting dependence of efficiency on $\omega_{p,el}$, departing from the previous argument of wanting minimal $\gamma_{el}$, which would show efficiency monotonically decreasing with $\omega_{p,el}$. That argument may hold for a thick electrode and structure, but, in the current systems, resonances are involved, which alter the results. Indeed, maximum efficiency is observed at an $\omega_{p,el}=\omega_{p1}<\omega_g$, such that the electrode is transparent at and above $\omega_g$ (namely $\text{Re}\{\varepsilon_{el}(\omega\geq\omega_g)\}>0$).

Figures 13F, 13G, 13H, 13I, 13J, 13K:
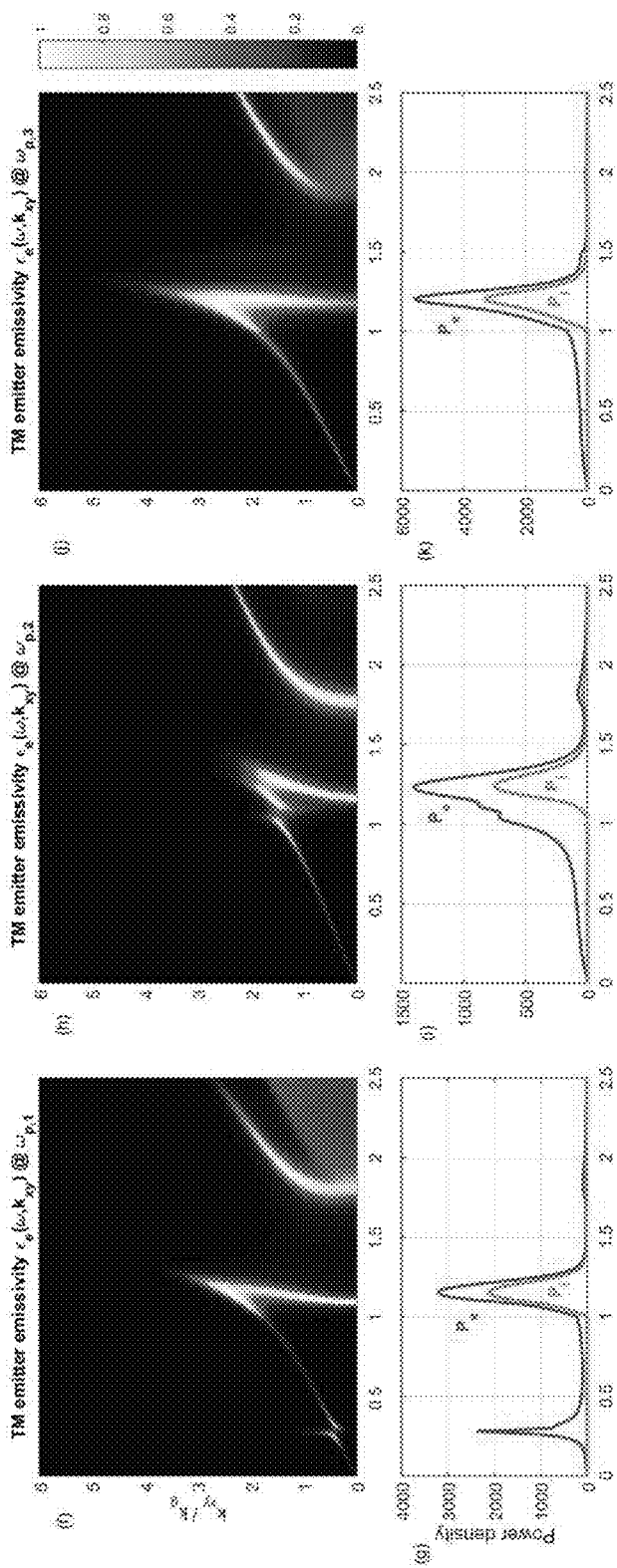

The corresponding TM emitter emissivity spectrum (FIG. 13F) indicates hot photons absorbed by a SPP mode formed on the interface of the plasmonic front electrode and the vacuum gap at a frequency below $\omega_g$, with an associated peak in emitted (but lost) power in FIG. 13G. For smaller values of $\omega_{p,el}<\omega_{p1}$, $d_{el}$ increases so much that the absorber dielectric-waveguide-type mode confined in the semiconductor (depletion region) becomes so distant from the emitter that coupling/impedance-matching between it and the emitter SPP is lost. As $\omega_{p,el}$ increases above $\omega_{p1}$, the SPP mode due to the electrode free carriers moves closer to the bandgap and its associated loss increases, reaching a system-efficiency minimum at $\omega_{p,el}=\omega_{p2}\gtrsim\omega_g$, where a triple resonance is observed among the emitter SPP mode, the electrode SPP mode, and the absorber photonic mode (FIG. 13H) and thus more emitter power is transmitted to the lossy carriers. At $\omega_{p,el}=\omega_{p3}>\omega_g$, another peak in efficiency is observed. The electrode is opaque at $\omega_g(\text{Re}\{\varepsilon_{el}(\omega_g)\}<0)$, but it is ultra-thin, so the hot photons tunnel through it. The triple resonance is avoided, with the electrode SPP appearing above $\omega_g$ (FIG. 13J), so the efficiency is high, but it is slightly lower than at $\omega_{p1}$, mainly because $\gamma_{el}$ is higher. Also for this reason, the efficiency decreases for $\omega_{p,el}>\omega_{p3}$.

For all values of $\omega_{p,el}$, the optimized structures have electrode and depletion-region widths such that the first ($k_{xy}=0$) cutoff of the system photonic modes lies at a frequency slightly above the bandgap (FIGS. 13F, H, J), as should be expected to avoid below-bandgap transmission.

Note also that, in some embodiments, if the electrode material is such that the carrier scattering rates are extremely small (for example, the electrode is a high-$T_c$ superconductor), the triple resonance may not have such a negative effect on efficiency. In fact, in such embodiments, it can be beneficial to use the triple resonance, as the latter allows efficient transmission of photons also with an even larger vacuum gap, as seen in FIG. 13C.

In conclusion, a low-square-resistance front electrode can be achieved by doping its material at an appropriate level, so that the passage of hot photons happens either via propagation through a transparent ($\text{Re}\{\varepsilon_{el}\}>0$) layer or evanescent tunneling through an ultra-thin opaque ($\text{Re}\{\varepsilon_{el}\}<0$) layer. In both cases, the free-carrier absorption of the electrode should be reduced or minimized, so materials with very low carrier scattering rates should be chosen.

Optimal Electrode Performance for Realistic Materials

We now calculate the optimal TPV efficiency for front electrodes made with real materials whose conductivity can be tuned via doping and with the same imposed square resistance $R_{el}$.

In some embodiments, part of the front electrode can be shaped by a thin film of a transparent conducting oxide (TCO), as shown in FIG. 12A. A commonly used oxide is Indium Oxide. When doped with Tin, Indium Tin Oxide (ITO) can become conductive with a plasma frequency in the visible region and small loss rate, so it is the material of choice for front electrodes of many solar PV cells. For TPV applications, however, the plasma frequency should be in the infrared. It turns out that doping Indium Oxide with Molybdenum (IMO) creates carriers with much higher mobility and that IMO can be doped to be transparent in the infrared. We extracted and interpolated the mobility data $\mu_{IMO}(N)$ from N. Yamada, T. Tatejima, H. Ishizaki and T. Nakada, "Effects of Postdeposition Annealing on Electrical Properties of Mo-Doped Indium Oxide (IMO) Thin Films Deposited by RF Magnetron Cosputtering," Japanese Journal of Applied Physics, vol. 45, no. 44, pp. L1179-L1182, 2006, and S. Parthiban, K. Ramamurthi, E. Elangovan, R. Martins and E. Fortunato, "Spray deposited molybdenum doped indium oxide thin films with high near infrared transparency and carrier mobility," Applied Physics Letters, vol. 94, no. 21, p. 212101, 2009. Using this data and $\varepsilon_{\infty,IMO}=4$, $m_{e,IMO*}=0.35m_e$, we plot $\gamma_{IMO}(\omega_{p,IMO})$ in FIG. 14 with a green line.

Another oxide, Cadmium Oxide doped with Dysprosium (CDO), was recently discovered to have even higher mobility and can also be useful for infrared applications. We extracted and interpolated this mobility data $\mu_{CDO}(N)$ and, using $\varepsilon_{\infty,CDO}=5.5$, $m_{e,CDO*}=0.21m_e$, we plot $\gamma_{CDO}(\omega_{p,CDO})$ in FIG. 14 with a blue line.

In some embodiments, part of the front electrode can be shaped by highly doping a region of the same semiconductor thin film that also performs the photo-current generation, as discussed in the previous section and shown in FIG. 12B. Since we are targeting relatively low electrode resistances with a very thin electrode region, we assume here that doping is so high that minority-carrier recombination in the electrode region is really fast and the diffusion length is really short. Therefore, this doped-semiconductor electrode region does not contribute to photo-current or voltage, which we model by ignoring interband absorption (setting $\varepsilon_g''(\omega)=0$) in it and considering it simply as a plasmonic material with tunably many free (majority) carriers. Assuming some $Ga_xIn_{1-x}As_ySb_{1-y}$ (GIAS) quaternary semiconductor with xy-tunable bandgap $\omega_g$, we use $\varepsilon_{\infty,GIAS}=14$, $m_{e,GIAS*}=0.035\ m_e$ like before, however, this time we consider a more precise model of electron mobility $\mu_{GIAS}(N_D)=420+8500/[1+(N_D/5\times10^{17}\ cm^{-3})^{0.7}]\ cm^2/Vsec$, leading to the loss rate functional $\gamma_{GIAS}(\omega_{p,GIAS})$ shown in FIG. 14 with a red line. We have limited the maximum doping level $N_D$ to $10^{20}\ cm^{-3}$.

In some embodiments, part of the front electrode can be shaped by layers of graphene, as shown in FIG. 12C. Using graphene layers on the front of the PV cell has been suggested before, but, in earlier cases, the PV cell had a bulk geometry and not a thin-film geometry as suggested here. In our simulations, we assume there are $M_{gr}$ non-interacting monolayers of graphene, but it can also be coupled multi-layers. A graphene monolayer is modeled via its 2D conductivity, which has an intraband and an interband term:

$$\sigma_{gr}^{2D}(\omega) = \frac{q^2}{\pi \hbar} \frac{\frac{2k_B T_a}{\hbar} \ln\left(2\cosh\frac{E_F}{2k_B T_a}\right)}{\gamma_{gr} - i\omega} + \quad (94)$$

$$\frac{q^2}{4\hbar}\left[G(\omega/2) + \frac{\omega}{i\pi}\int_0^\infty du \frac{G(u) - G(\omega/2)}{u^2 - (\omega/2)^2}\right]$$

where $T_a=300°$ K the absorber (PV cell) temperature, $E_F = \hbar v_{gr}\sqrt{\pi N^{2D}}$ the Fermi level due to carriers of density $N^{2D}$ and with $v_{gr}=10^6$ m/sec, and $G(u)=\sin h(\hbar u/k_B T_a)/[\cos h(E_F/k_B T_a)+\cos h(\hbar u/k_B T_a)]$. The loss rate $\gamma_{gr}$ includes two terms due to scattering of free carriers with acoustic and optical phonons:

$$\gamma_{gr} = \gamma_{gr}^{AP} + \gamma_{gr}^{OP}(\omega) \approx \frac{qv_{gr}^2}{\mu_{gr}E_F} + 0.04\sqrt{\frac{E_F}{\hbar}(\omega - \omega_{gr}^{OP})} \quad (95)$$

where $\omega_{gr}^{OP}=0.2$ eV/$\hbar$ the optical phonon frequency in graphene. The second term is a very rough (and likely pessimistic) approximation of the optical-phonon-related scattering rate $\gamma_{gr}^{OP}$ and is dependent on the frequency $\omega$ of the photon. For the first term, it is believed that, in graphene monolayers at room temperature, carrier mobility due to acoustic-phonon scattering scales as $\mu_{gr} \sim 1/N^{2D} \sim 1/E_F^2$, so we use $\mu_{gr}(N^{2D})=3.47\times10^{16}/N^{2D}$/Vsec appropriate for the very high doping levels ($N^{2D}>10^{13}$ cm$^{-2}$ $\Rightarrow E_F>0.37$ eV) used here.

Figure 14:
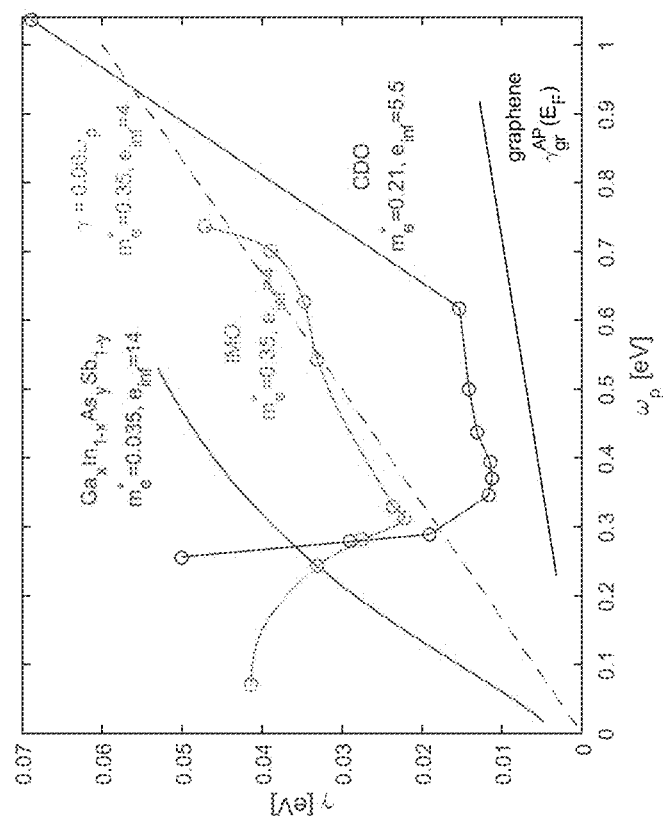
FIG. 14 shows carrier scattering rates $\gamma$ vs doping level (quantified via $\omega_p$), for different front-electrode conducting materials: Molybdenum-doped Indium Oxide (IMO) (green line), Dysprosium-doped Cadmium Oxide (CDO) (blue line), donor-doped $Ga_xIn_{1-x}As_ySb_{1-y}$ (red line), material from FIG. 13 with $m^*_e=0.35m_e$ (dashed grey line) and graphene monolayers (black line, showing Acoustic-Phonon scattering rate vs Fermi level).

With this scaling, the acoustic-phonon-scattering rate $\gamma_{gr}^{AP}$ becomes proportional to the Fermi level $E_F$, and $\gamma_{gr}^{AP}(E_F)$ is plotted in FIG. 14 with a black line. (Note that a constant $\gamma_{gr}^{AP}$ implies $\mu_{gr} \sim 1/\sqrt{N^{2D}} \sim 1/E_F$.) The number $M_{gr}$ of monolayers is chosen, so that the required electrode square resistance $R_{el}$ is obtained:

$$\frac{1}{R_{el}} = \sigma_{DC,gr}^{2D}M_{gr} = q\mu_{gr}(N^{2D})N^{2D}M_{gr} \approx \frac{q^2 E_F}{\pi\hbar^2\gamma_{gr}(E_F)}M_{gr}$$

For the assumed mobility scaling, $\sigma_{DC,gr}^{2D}$ is constant, so a square resistance $R_{el}=60\Omega$ gives $M_{gr}=3$ non-interacting graphene monolayers. For different values of $R_{el}$, we here allow $M_{gr}$ to simply be a continuous number for continuity of the results and to fairly compare with other electrode materials.

We assume that the depletion region of the semiconductor extends throughout the entire thin region between the front and back electrodes, with permittivity $\varepsilon_{dep}(\omega)$ of Eq. (93) and thickness $d_{dep}$, as shown in FIGS. 12A-12C. The optimization parameters for these structures are $\omega_{p,e}$, $d_{vac}/\lambda_g$, $d_{dep}/\lambda_g$, $qV/E_g$ and $\omega_{p,el}$ for TCOs and GIAS (which determines $d_{el}/\lambda_g$ via Eq. (91)) or $E_F$ for graphene.

We saw in FIG. 13 that optimal performance is expected when the free-carrier plasma frequency is less than the bandgap frequency ($\omega_{p,el}<\omega_g$) and thus when the electrode material is transparent at and above $\omega_g$. Therefore, FIG. 14 can be interpreted qualitatively as follows: given the operating $\omega_g$, efficiency may be optimal at the $\omega_{p,el}<\omega_g$ that reduces or minimizes $\gamma_{el}$, as long as the electrode thickness $d_{el}$ does not increase too much due to Eq. (91). In the case of graphene, for $E_F<\omega_g/2$, the interband losses of Eq. (94) become active at $\omega>\omega_g$, so $\omega_g/2$ sets the lower $E_F$ limit.

We perform a first optimization as a function of emitter temperature $T_e$, for a fixed desired square resistance $R_{el}=60\Omega$. The optimization results are shown in FIG. 15 and, indeed, the optimal $\omega_{p,el}$ (FIG. 15D) lies below $\omega_g$. For IMO and CDO, it stays fairly constant, close to their respective $\gamma_{el}$ minima. Therefore, the electrode thickness $d_{el}$ is fairly constant with $T_e$ (the normalized $d_{el}/\lambda_g$ increases in FIG. 15E) and the photonic design forces the optimal $d_{dep}/\lambda_g$ to decrease (FIG. 15G). For GIAS, the situation is different: in order to get small $\gamma_{el}$, the optimal $\omega_{p,el}$ is relatively small at low $T_e$, but the $R_{el}$ constraint of Eq. (91) forces it to increase with $T_e$, so the necessary doped (electrode) semiconductor region $d_{el}$ is larger at low $T_e$ and then decreases (FIG. 15E), while $d_{dep}/\lambda_g$ is roughly constant (FIG. 15G); at very high $T_e$, the doping limit of GIAS is reached. For graphene, the optimal $E_F$ always lies slightly above $\omega_g/2$.

As expected, the optimal $\omega_{p,e}$ (FIG. 15B) in all cases is such that the emitter SPP appears always at a frequency little above $\omega_g$. The range of values of $\omega_{p,e}/\sqrt{2}$ agrees with the Table 1 of suggested emitter materials. The optimal vacuum gap (FIG. 15C) is related, via the decay length of the absorber photonic mode, to the thickness of the semiconductor region: the wider the high-index core, the faster the absorber mode decays in the vacuum, so the closer the emitter has to be placed. In all cases, the required gap is relatively large, compared to prior-art non-resonant near-field TPV implementations, therefore the current structures should be easier and cheaper to fabricate. As always, the optimal $qV/E_g$ is close to $1-T_a/T_e=\eta_{max}$ (FIG. 15F).

Figure 15A:
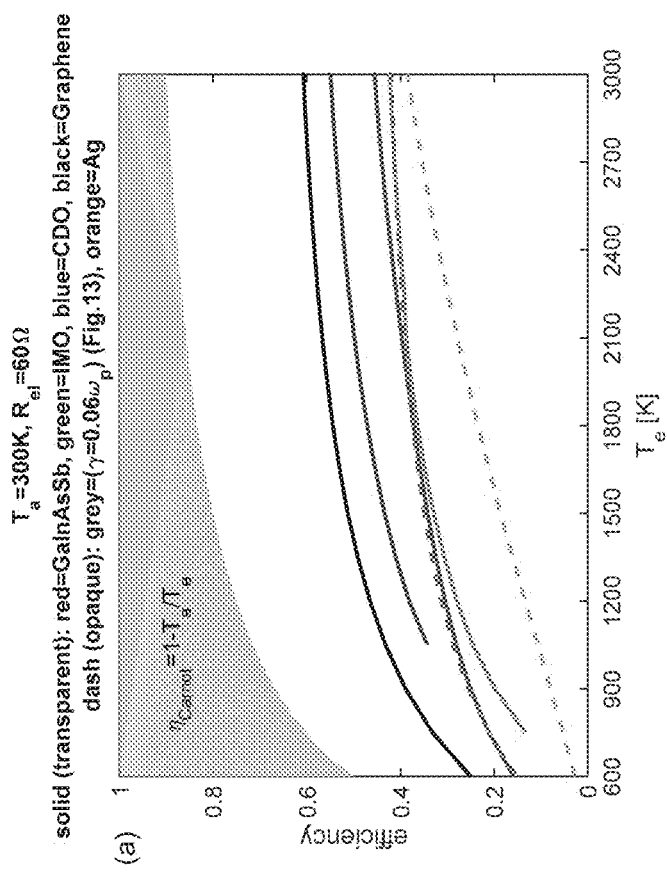

FIG. 15A shows that a graphene electrode is more efficient than a CDO electrode, which is more efficient than a IMO or a GIAS electrode. This is expected from their loss-rate ordering, seen in FIG. 14. In fact, the CDO electrode can be thinner than the IMO to get the same $R_{el}$ (FIG. 15E). These results indicate that very efficient TPV conversion can be achievable for realistic materials, geometries and emitter temperatures.

In FIG. 15, we also show, with dashed lines, the performance of two opaque front electrodes. Grey lines correspond to the previously-used Drude plasmonic electrode, with $\varepsilon_{\infty,el}=4$ and $\gamma_{el}=0.06$ $\omega_{p,el}$ (plotted also in FIG. 14), operated so that it is opaque at $\omega_g$ (Re$\{\varepsilon_{el}(\omega_g)\}<0$). Essentially, the optimal $\omega_{p,el}>\omega_g$ (FIG. 15D) follows the second efficiency peak (at $\omega_{p3}$) of FIG. 13A and the conductivity is so high that only a very thin film is required to get $R_{el}$ (FIG. 15E). FIG. 15A suggests that tunneling hot photons through this very thin opaque electrode can be as efficient as transmitting those photons through a transparent thicker electrode with the same loss rates (similar to IMO in FIG. 14). Therefore, in embodiments of the present TPV systems, a conducting material that is opaque above the bandgap frequency can be used as a front electrode. For example, Indium Oxide doped with Tin (ITO) can be used. In this case, the relation between the doping level of ITO and the bandgap frequency should be chosen so that efficiency is as high as possible.

Orange lines are for an ultra-thin silver film used as an opaque front electrode. Because of the large number of carriers ($\omega_{p,Ag}$) and small loss rate ($\gamma_{Ag}$) of silver, the required thickness is extremely small (FIG. 15E). Therefore, in calculating this necessary thickness, we assume that the silver loss rate actually depends on it, in the form: $\hbar\gamma_{Ag}=0.023$ eV$+0.25*1.36e^6$ (m/sec$^2$)/$d_{el}$. The emitter field decays fast inside the silver, especially at low temperatures, so the vacuum gap needs to be small for enough tunneling to occur (FIG. 15C), but still the achievable efficiency is significantly smaller at low temperatures (FIG. 15A). Ultrathin films of other metals can also be used, such as gold, aluminum or copper, but efficiency may be lower.

Figure 16A:
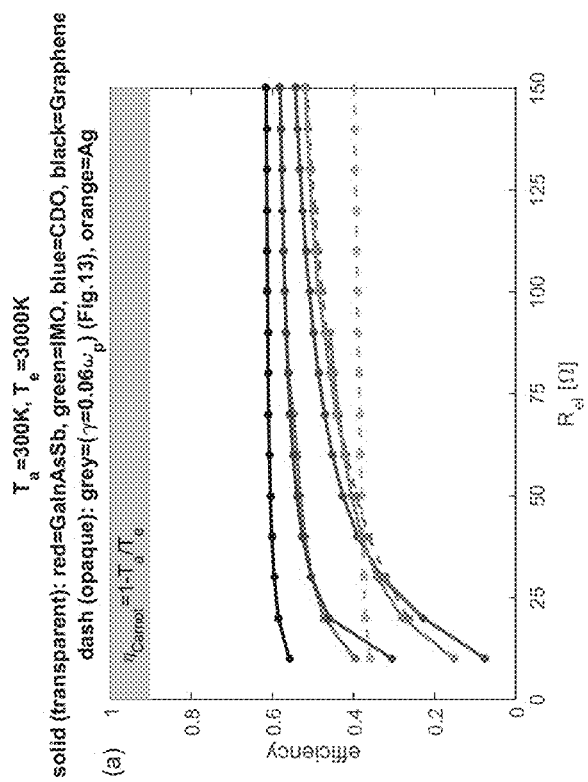

We also perform another optimization to find optimal performance as a function of desired front-electrode square resistance $R_{el}$, for a fixed emitter temperature $T_e=3000°$ K. The results are shown in FIG. 16. It is interesting to notice that two solution branches exist for CDO (shown in two shades of blue) and IMO (shown in two shades of green), one branch following the $\omega_{p,el}$ with minimum loss rate of the material and another branch with more carriers (FIG. 16D) but thinner electrode (FIG. 16E). The various materials perform in similar order as before. It is seen from FIG. 16A that optimal efficiency may decrease significantly at very low electrode square resistance. This is because the electrode then has more carriers and a larger thickness, so it absorbs more hot-emitter photons. The resonance exacerbates this issue, which is why a radiative far-field (large vacuum gap) solution may in fact exhibit, at small $R_{el}$, better efficiency than those shown in FIG. 16A, although the output power may be much lower. Very interestingly though, at this high emitter temperature, an opaque silver electrode can perform very well even at small $R_{el}$, with minimal drop in efficiency (FIG. 16A). This is because, as a thicker electrode is required, the silver loss rate actually improves.

In some embodiments, a hybrid design can have a combination of a TCO, graphene layers, an ultra-thin opaque plasmonic layer and some doping on the semiconductor to implement the front PV-cell electrode.

Back-Electrode/Reflector Designs for Efficient Planar TPV Systems

On the side of the thin-film PV cell opposite of the emitter and vacuum gap, a back electrode/reflector confines the resonant waveguide-mode. As we have used so far, in some embodiments of the current TPV systems, the back electrode/reflector can be achieved via a low-loss metallic material (typically silver) up against the semiconductor thin film. This can remove modes from the radiation cone and can position a system mode just above the semiconductor bandgap for increased power output and efficiency. However, we saw that, at the optimal efficiency operating point, most of the loss goes into this back electrode. Therefore, let us examine some alternatives.

In some embodiments, the back metallic electrode/reflector may be spaced apart from the thin-film semiconductor absorber via a thin spacer layer of a lower-refractive-index material. In some embodiments, this spacer layer can be formed of a lossless dielectric material and ultra-thin so that photo-generated carriers can tunnel to the back metallic electrode. In this case, there may still be significant penetration of the mode into the back metallic electrode, without substantial improvement in efficiency. In some embodiments, this spacer layer can be a bit thicker so that it can provide the dielectric-waveguide-type mode confinement. In this way, the absorber mode decays sufficiently by the point it reaches the back metal electrode. In this case, however, this material should be conductive for the electrons and holes photo-generated in the semiconductor to reach the metallic back electrode. Therefore, this thin film may be a TCO, such as those we examined in the previous section (IMO, CDO, etc.). It may be preferable for this film to be thin enough, so that its resistive loss is limited and the metal electrode still sufficiently removes modes from the semiconductor radiation cone.

Figures 17A, 17B:
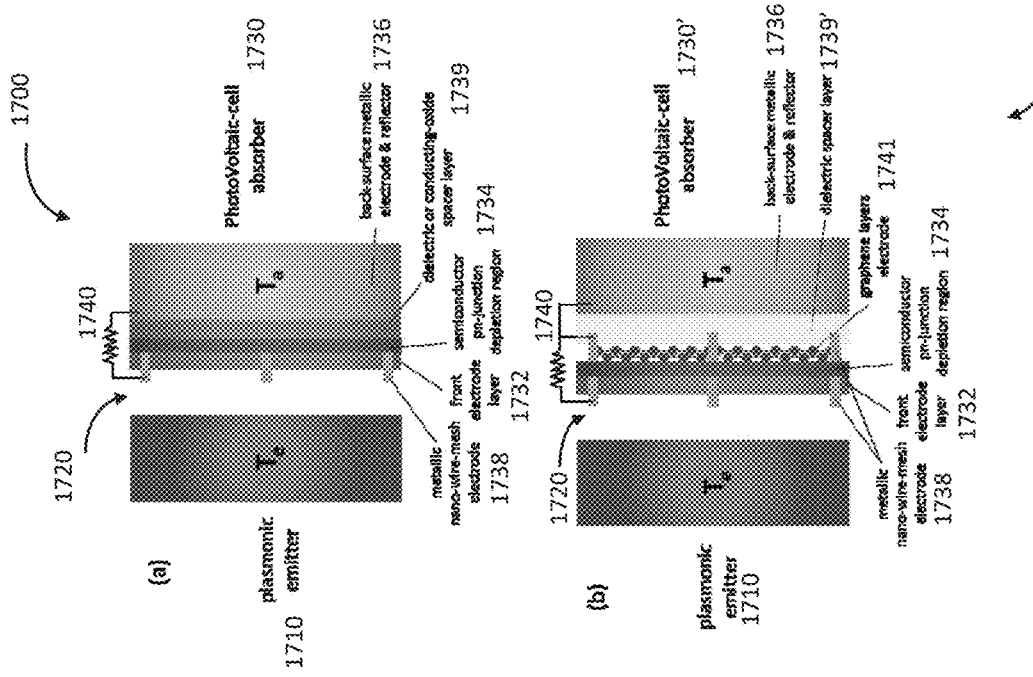
FIGS. 17A and 17B show example near-field TPV structures with thin-film dielectric layers.

FIGS. 17A and 17B show TPV structures with dielectric spacer layers like those described immediately above. Each structure 1700, 1700' includes a hot plasmonic emitter 1710 that is separated by a vacuum gap 1720 from a PV cell 1730, 1730' comprising a semiconductor thin-film pn-junction absorber 1734, a front conductive electrode 1732 assisted by a metallic nanowire mesh 1738, a back metallic electrode/reflector 1736. A load 1740 is connected to the front conductive electrode 1732 and the back metallic electrode 1736. In FIG. 17A, an ultrathin film 1739 of a dielectric or a thin film of a conducting oxide forms a spacer layer between the metallic back electrode/reflector 1736 and the semiconductor thin-film pn-junction absorber 1734. In FIG. 17B, the structure 1700' includes one or more graphene layers 1741, optionally assisted by another metallic nanowire mesh, and a thin film 1739' of a dielectric forming a spacer layer to the metallic back reflector.

In some embodiments, part of the back electrode can be shaped by depositing on the semiconductor absorber layers of graphene, such as non-interacting monolayers or coupled multilayers. In some embodiments, the graphene back electrode can be assisted by a (parallel or rectangular) nanowire mesh of a highly conducting material (e.g., silver). These nanowires may be thin so that they absorb few hot photons. In some embodiments, the graphene/nanowires back electrode may be spaced apart from a metallic back reflector by a thin lossless dielectric film, as shown in FIG. 3, to remove the radiation modes in the semiconductor light cone and beneficially shape the system modes.

Photo-Diode Designs for Efficient Planar TPV Systems

In some embodiments, the PV-cell photo-diode, which converts absorbed hot photons to electron-hole pairs and then load voltage/current, can be a semiconductor p-n junction. In some embodiments, the absorbing region can include bulk semiconductor or quantum wells (QW) or quantum wires (QWR) or quantum dots (QD). Our simulations have shown that using quantum wells for our photonic topologies may not contribute a significant improvement in efficiency when the losses are dominated by the silver back-electrode absorption. However, a quantum-dot absorber may be beneficial in that it creates a triple resonance system: emitter SPP mode coupled to absorber photonic or SPP mode and coupled to electronic QD states.

In some embodiments, the PV-cell photo-diode, which converts absorbed hot photons to electron-hole pairs and then load voltage/current, can be a vertical graphene p-n junction, instead of a semiconductor p-n junction. In this case, the interband absorption of graphene due to the tunable-via-doping Fermi level $E_F$ can be used to create a photo-diode with a tunable-via-doping bandgap.

Emitter Designs for Efficient Planar TPV Systems

Figure 18B:
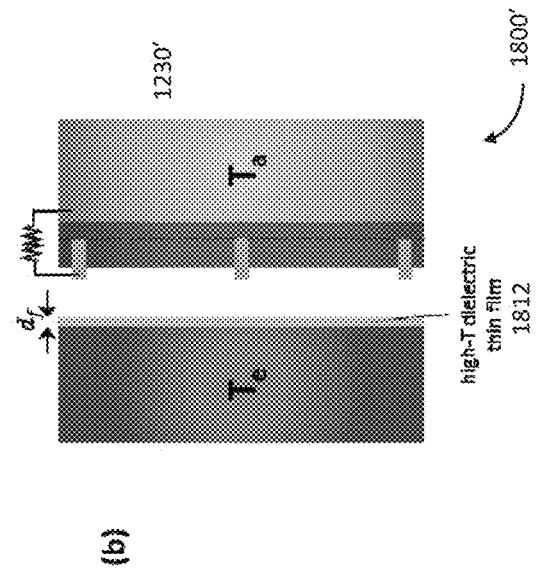
FIGS. 18A-18C show example near-field TPV structures like those of FIGS. 12A-12C with a thin dielectric film of high melting temperature on the plasmonic emitter. This film helps prevent oxidation of the plasmonic material and can help shape the dispersion of the emitter SPP mode.
Figure 18A:
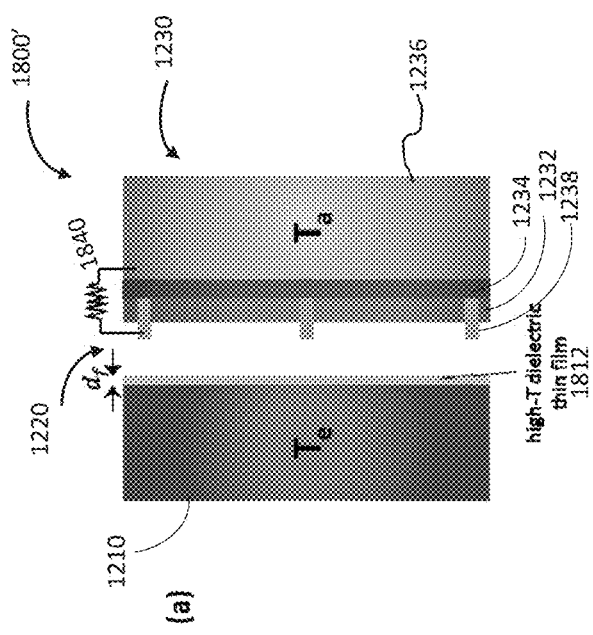
Figure 18C:
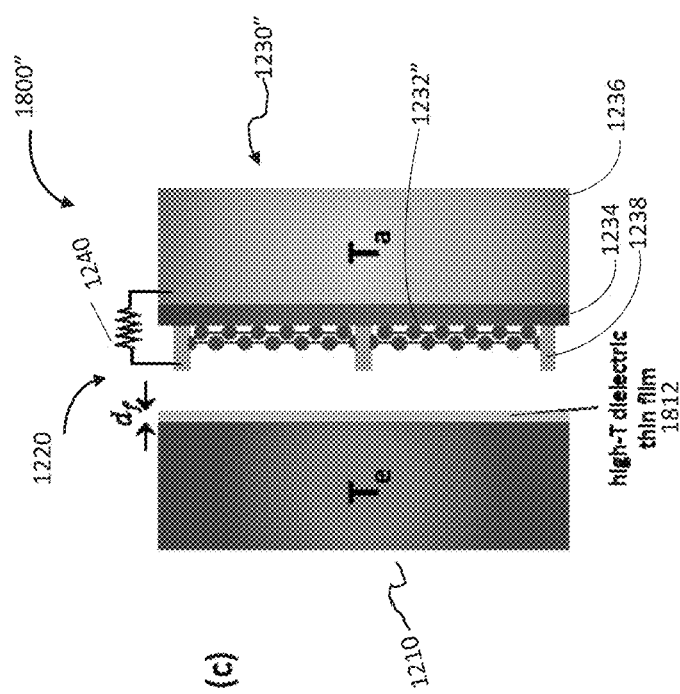

In some embodiments, a very thin dielectric film can be deposited on the interface between the plasmonic material and the vacuum gap. For example, FIGS. 18A-18C show example near-field TPV structures 1800, 1800', and 1800'' like those of FIGS. 12A-12C with the addition of a thin dielectric film 1812 of high melting temperature on the plasmonic emitter 1210. This film 1812 can help the SPP surface mode acquire negative group velocity and thus enforce a clearer crossing with the absorber waveguide mode. In this case, the upper cutoff frequency of the SPP is the frequency at which the mode exhibits zero group velocity, while as $k \to \infty$ the SPP asymptotes to the (smaller) frequency given by Eq. (84) with $\varepsilon_d$ the dielectric permittivity of the thin film. This film can also prevent oxidization of the plasmonic material from the little oxygen that may be present in the vacuum gap. This dielectric material can typically be an oxide of a very high melting temperature, such as $ThO_2$ ($T_{melt}=3660°$ K), $HfO_2$ (3031° K) and $ZrO_2$ (2988° K).

In some embodiments, the emitter plasmonic material itself can be a thin film, e.g., deposited on another support material of very high melting temperature. We found that, if the supporting material was a PEC, such a thin film plasmonic material would have superior TPV efficiency than a thick (bulk) plasmonic material. Unfortunately, real metals may not have low enough losses, especially at really high temperatures, for this implementation to be beneficial.

In some embodiments, the emitter can be a multilayered structure that includes many thin layers of dielectric and plasmonic materials. This multilayered structure can support at least one SPP resonant mode that couples to a resonant mode of the absorber. In some embodiments, the two coupled modes are impedance-matched at a frequency just above the absorber bandgap. In some embodiments, this multilayered structure can be designed such that its coupled SPP mode has a prescribed dispersion.

In planar systems, including those with metamaterials, a guided mode can be characterized by a wavevector k or $k_{xy}$ in the plane of uniform symmetry of the planar system. The upper cutoff frequency for the relevant surface polaritonic mode in a planar system is the highest value reached by the real part of the surface polaritonic mode eigenfrequency as k varies from 0 to ∞ (or π over the subwavelength period of a metamaterial) in the absence of the absorber.

Design of Efficient Non-Planar TPV Systems

So far, we have examined only (at least effectively) planar TPV systems. We saw that, at a given emitter temperature, efficiency can be optimized by coupling and impedance matching, just above the semiconductor bandgap, a planar emitter SPP mode with a planar absorber photonic mode. The emitter emissivity spectrum of FIG. 5A shows that losses arise mainly from low-$k_{xy}$ coupling to the PV cell free carriers in the front electrode and in the silver back electrode. In this section of the specification, we disclose a class of non-planar TPV systems that can further suppress these low-$k_{xy}$ losses and accomplish even higher efficiencies.

An example method includes patterning at least one of the emitter and the absorber in the xy plane so as to create in-plane localized resonances with lateral extent on the order of $\sim(\pi/k_o)^2$ in a way that only modes with $k_{xy} \approx mk_o$ (m integer) survive in the emitter emissivity spectrum.

In some embodiments, the emitter plasmonic material can be patterned to create an array of pillars of size $\sim(\pi/k_o)^2$. In some embodiments, the space between the pillars can be filled with a high-melting-temperature dielectric material to provide structural support of the patterning at high temperatures. In some embodiments, the pillars can be spaced sufficiently, so that their in-plane localized resonant modes do not couple to each other significantly. The patterning is deep enough that modes generated at the bottom of the grooves do not couple efficiently to the distant absorber, rather simply circulate thermal energy inside the emitter.

Figures 19A, 19B:
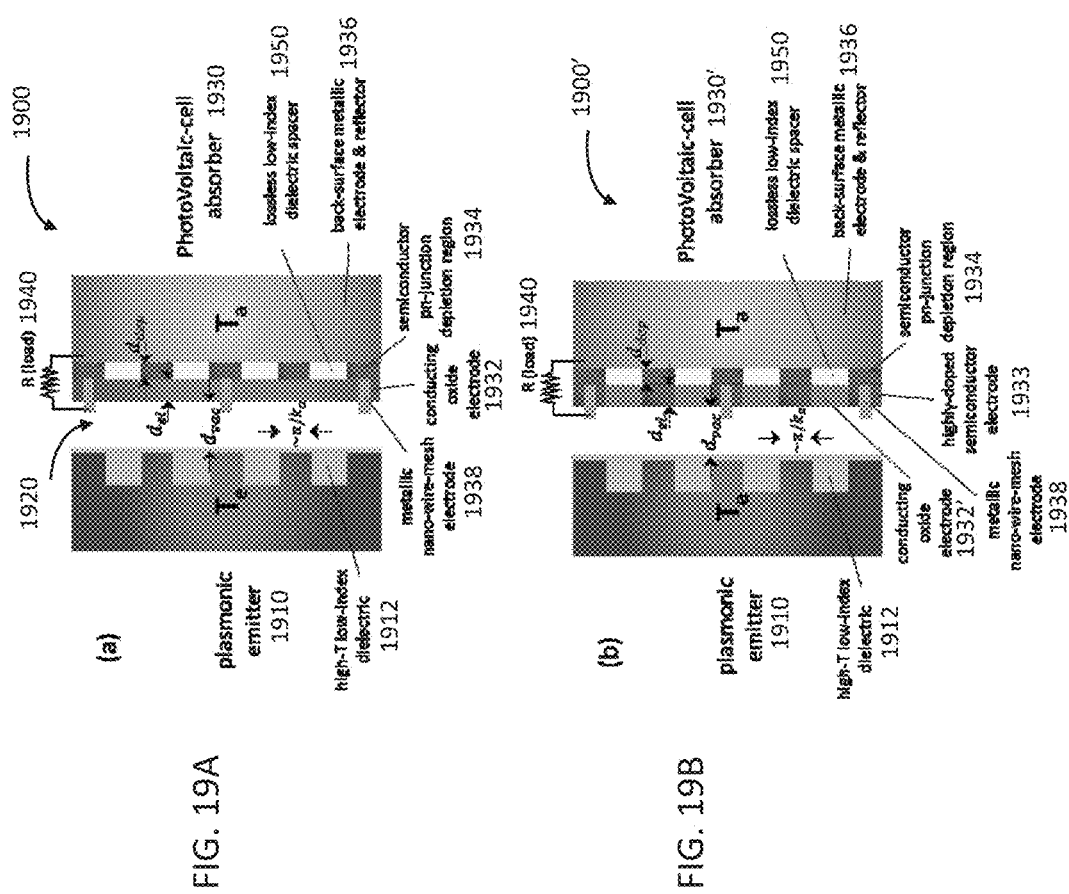
FIGS. 19A and 19B show example near-field TPV structures with plasmonic nanopillars.

In some embodiments, the absorber semiconductor material can be patterned to create an array of pillars of size $\sim(\pi/k_o)^2$. In some embodiments, the space between the pillars can be partially filled with a low-loss dielectric material to provide structural support for a front-electrode material on top of the low-loss dielectric material. In some embodiments, a uniform thin film of a transparent conducting oxide or graphene layers can be deposited on top of the semiconductor pillars to provide a front electrode, as shown in FIG. 19A. In some embodiments, the top of each semiconductor pillar is highly doped to provide conductivity and the top of the space in between the pillars is filled with a transparent conducting oxide to provide a continuous conductive path for photo-generated carriers, as shown in FIG. 19B. In some embodiments, the pillars can be spaced sufficiently, so that their in-plane localized resonant modes do not couple to each other significantly.

FIGS. 19A and 19B show TPV structures 1900 and 1900' with plasmonic nanopillars patterned into the hot emitter and the PV-cell absorber. Each structure has a hot emitter 1910 that comprises a plasmonic material with patterned corrugations filled with a dielectric material 1912 of high melting temperature, so that SPP resonant modes are formed in the vicinity of the top interface of each plasmonic nanopillar and the neighboring vacuum gap 1920, which separates the hot emitter 1910 from a PV cell 1930 and 1930'. The emitter 1910 is across a vacuum gap 1920 from a PV cell 1930 and 1930' that comprises semiconductor-absorber nano-pillars 1934, each one having a pn-junction inside it, separated via low-loss dielectric material 1950 and backed by a metallic electrode/reflector 1936. The PV-cell front electrode can be a thin film 1932 of a conducting oxide as shown in FIG. 19A. It can also be formed via highly doping the top of each semiconductor nanopillar 1934 to providing a conducting path to a conducting oxide 1932' deposited on top of the dielectric material 1950 as shown in FIG. 19B. The front electrode can be assisted by a metallic nanowire mesh 1938. The plasmonic nanopillars are aligned to face the semiconductor nanopillars 1934 so that thermal transmission is high between them and low between the corrugations on either side.

In some embodiments, the absorber is patterned and the emitter is planar, so the emitter geometry can be stable at very high temperatures.

To estimate the performance of such systems, we start with a planar system and assume that, after patterning holes in it for in-plane confinement, the patterned system emissivities and transmissivities are the same as for the original planar system, but only the discrete set of wave vectors $k_{xy} \approx mk_o$ survives. This would be exact if the lateral modal confinement was achieved with perfect boundaries (PEC or PMC). In the case of (potentially filled) holes, there may be some field penetration in the holes, but we assume that these holes are deep enough that only the system resonances at $k_{xy} \approx mk_o$ contribute significantly to the transmissivity spectra. In fact, we let $k_o$ be an additional optimization parameter whose optimal value is expected close to the peak of the emitter emissivity (impedance-matching point). To further simplify the calculations, since the emitter emissivity at $2k_o$ is negligible for the planar systems disclosed above, we approximately describe the class of patterned systems by analyzing the underlying planar systems only at the optimizable $k_{xy} \approx k_o$.

The optimization results as a function of emitter temperature are shown in FIG. 6 with green lines. The optimal efficiency in FIG. 6A is expected to increase by ~10% compared to the underlying optimized planar system, reaching an impressive ~70% at $T_e$=3000° K. This increase comes primarily from suppression of losses at the back silver electrode (dashed green line). The optimal $k_o$ is shown on the right axis of FIG. 6B. As temperature decreases, a thicker absorber (FIG. 6E) at a closer distance to the emitter (FIG. 6C) seems to be preferable.

The thickness of the semiconductor material and the width of the vacuum gap are measured along a direction perpendicular to the interface of the PV cell with the vacuum gap. For example, in FIG. 19B, the thickness of the semiconductor material is the height of each nanopillar, namely the distance between the back-surface electrode/reflector and the vacuum gap.

A surface polaritonic mode is a mode supported on an interface of a polaritonic material, in the sense that the mode field is evanescent in both directions away from the interface of the polaritonic material. In non-planar systems, a mode is to be understood as a resonant mode that may not be able to be characterized by a wavevector. Therefore, while in planar systems there may often be only a single surface polaritonic mode, guided on a planar interface of a polaritonic material, in non-planar systems there may be multiple resonant surface polaritonic modes, which may be localized at regions of a potentially non-planar interface of a polaritonic material and may not be able to be characterized by a wavevector. In this case, the upper cutoff frequency of at least one surface polaritonic mode is the highest value of the real parts of the eigenfrequencies of all related (at least one) surface polaritonic modes, where two surface polaritonic modes are related, when they are supported on roughly the same region of an interface of a polaritonic material and within the same continuous frequency range of negative real part of the permittivity of the polaritonic material. For example, if the permittivity of a polaritonic material has several frequency ranges of alternating negative and positive real part, the polaritonic material may support on an interface several surface polaritonic modes with eigenfrequencies in two different frequency ranges of negative real part of the permittivity; such two modes will not be considered related.

Modes of Operation and System Control

As already discussed, a ThermoPhotoVoltaic (TPV) system is a power converter, converting thermal power to electricity. Such a converter can be used in several applications, with different modes of operation.

In some embodiments, the TPV converter can be powering a varying load, such as an electronic device, a battery charger, an electrical machine, an automobile, etc. (FIG. 20A). In those cases, it is useful to know the dependence of efficiency on the varying-load desired power. Note that our efficiency-vs-load power plot (FIG. 7A) was a plot of optimal efficiency, where the TPV system physical parameters are optimized at each load power level. An actual TPV converter may be designed for optimal performance at one load-power level. During operation, as the desired load power varies, the converter may not follow this optimal-efficiency plot. Instead, the output voltage may vary from the optimal-efficiency point in FIG. 3A towards the desired load power point, and thus the efficiency versus load power may look like the upper branch of FIG. 3B.

In some embodiments, the TPV converter can receive heat in a controllable way from some energy storage system. In some embodiments, the energy storage system can be fuel, such as gasoline or propane, which is burned to provide heat. As the input amount of heat is controlled, the emitter temperature can be controlled. In some embodiments, the amount of heat (and thus the emitter temperature) can be controlled by adjusting the flow of fuel into the burner. In some embodiments, the amount of heat (and thus the emitter temperature) can be controlled by adjusting the flow of oxygen or air into the burner. In some embodiments, the TPV converter can include a control feedback system, which can control the input amount of heat (and thus the emitter temperature) as the load power varies, in order to optimize efficiency (FIG. 20A).

In FIG. 7A, we show with a dashed black line such an example of efficiency vs load power during operation, for a system whose geometry was optimized at $T_{e,max}=1200°$ K and one load power, but then $T_e$ is tuned at different power levels. Note that lowering the emitter temperature can lead to much more efficient operation at lower power than simply letting the output voltage increase from its maximum-efficiency value (FIG. 3B). In some embodiments, the control feedback system can monitor the load voltage and/or current and emitter/absorber temperatures and can control the input amount of heat (and thus emitter temperature) as the load power varies, in order to regulate the load voltage and/or current to a desired value. In some embodiments, the desired voltage value can be $\approx E_g(1-T_d/T_e)/q$, which may be approximately optimizing efficiency. In some embodiments, the desired voltage and/or current value can be a fixed level.

In some embodiments, the TPV converter can receive heat from a varying but uncontrollable source. In some embodiments, the varying and uncontrollable heat source can be absorbed solar illumination (in which case, the TPV converter is called a solar TPV converter) (FIG. 20B) or a radio-isotope. In those cases, it may be useful to know the dependence of efficiency on the varying-source input power. Note that our optimal efficiency-vs-load power plot (FIG. 7A) can also be plot as optimal efficiency-vs-source power, which can be understood as a plot of optimal efficiency, where the TPV system physical parameters are optimized at each source power level. An actual TPV converter may be designed for optimal performance at one source-power level, however, during operation, as the desired source power varies (for example solar power from day to night), the converter may typically not follow this optimal-efficiency plot. Instead, the output voltage may vary from the optimal-efficiency point in FIG. 3A.

In some embodiments, the TPV converter can be powering a controllable load, such as a battery charger. In some embodiments, the TPV converter can control the amount of power fed into the load, such as controlling the charge current of a battery charger. In some embodiments, the TPV converter can include a control feedback system, which can control the load power as the source power (and thus the emitter temperature) varies, in order to optimize efficiency (FIG. 20B). In some embodiments, the control feedback system can monitor the load voltage and/or current and emitter/absorber temperatures and can control the load power as the source power (and thus emitter temperature) varies, in order to regulate the load voltage and/or current to a desired value. In some embodiments, the desired voltage value can be $\approx E_g(1-T_d/T_e)/q$, which may be approximately optimizing efficiency. In some embodiments, the desired voltage and/or current value can be a fixed level.

In some embodiments, the TPV converter includes a component to tune the width of the vacuum gap between the emitter and the absorber. In some embodiments, the tuning component includes at least one MicroElectroMechanical Systems (MEMS) actuator device. Since the thin-film PV cell is ultra-thin, it is also light enough that it can be placed on top of at least one MEMS actuator, which can push the thin-film PV cell by nanometer-sized controllable amounts and thereby effectively tune the width of the vacuum gap. Since the PV-cell is also flexible, at least one MEMS actuator can be used to bend the PV cell surface closer to the emitter by nanometer-sized controllable amounts and thereby effectively tune the width of the vacuum gap. As discussed below, the TPV converter can include a control feedback system, which can control the width of the vacuum gap, as either the desired load power or the applied source power varies, in order to increase or optimize efficiency.

In some embodiments, the TPV converter can control both the impedance of the output load and the input amount of heat. For example, the impedance of the output load can be controlled by periodically opening an electronic switch (e.g., a FET) placed in series with the load or by periodically shorting an electronic switch (e.g., a FET) placed in parallel with the load. In some embodiments, the control feedback system can monitor the load voltage and/or current and control the impedance of the load to regulate the load voltage and/or current. In some embodiments, the control feedback system to regulate the load voltage and/or current can include a hysteresis mechanism to set maximum and minimum levels for the load voltage and/or current under regulation. In some embodiments, the control feedback system can simultaneously monitor the input power and control the input power and/or tune the width of the vacuum gap to increase the efficiency. The control loop for regulating the output voltage and/or current may be faster than the control loop for increasing the efficiency.

FIG. 20A shows an integrated micro-burner and thermophotovoltaic converter 2000. The micro-burner 2010 burns fuel and oxygen/air 2052 to heat the emitter, which emits hot photons across vacuum gaps 2020 for absorption by PV cells 2030. The fuel and oxygen/air 2052 are supplied at a controllable flow rate to the micro-burner 2010 via capillary tubes 2052. The electrical outputs of the top and bottom PV cells 2030 drive varying loads 2040 (which can be connected in series or in parallel or in another way). A control feedback system 2050 monitors the electrical outputs and adjusts the fuel and oxygen/air flow rates towards some optimization objective, such as maximum efficiency or load voltage/current regulation.

FIG. 20B shows an integrated solar absorber and thermophotovoltaic converter 2000'. Solar irradiation 2052' is incident on and absorbed by the integrated solar absorber and emitter 2010, which are supported by rods 2054', with varying intensity throughout the day. The solar absorber heats the emitter, which emits hot photons across a vacuum gap 2020 towards a PV cell 2030, which in turn absorbs the photons. The electrical output of the PV cell 2030 drives a controllable load 2040. A control feedback system 2050' monitors the electrical output (and perhaps incident radiation via a regular PV cell, not shown) and adjusts the load towards some optimization objective, such as maximum efficiency or load voltage/current regulation.

Figure 20C:
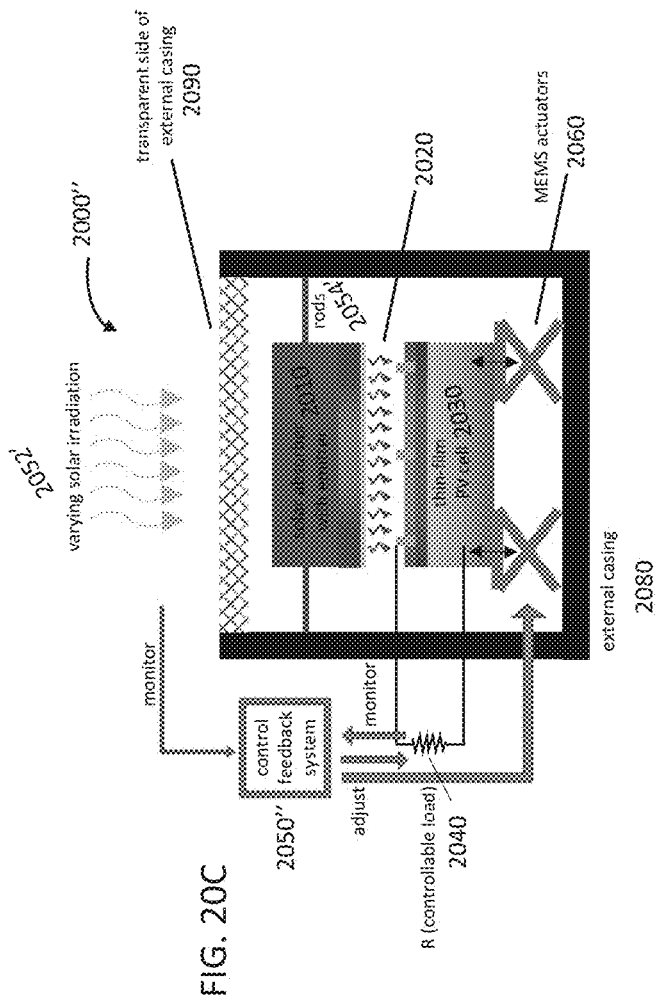
FIG. 20C shows an integrated solar absorber and thermophotovoltaic converter with MEMS actuators that vary the size of the vacuum gap between the emitter and PV cell in the thermophotovoltaic converter.

FIG. 20C shows an integrated solar absorber and thermophotovoltaic converter 2000". Solar irradiation 2052' is incident on and absorbed by the integrated solar absorber and emitter 2010, which are supported by rods 2054', with varying intensity throughout the day. The solar absorber heats the emitter 2010, which emits hot photons across a vacuum gap 2020 towards a PV cell 2030, which in turn absorbs the photons. The electrical output of the PV cell 2030 drives a controllable load 2040. The PV cell is placed on top of MEMS actuators 2060, which can adjust the PV cell's position with nanometer presicion and thereby tune the width of the vacuum gap 2020. A control feedback system 2050" monitors the electrical output (and perhaps incident radiation via a regular PV cell, not shown) and adjusts the load and the width of the vacuum gap 2020 towards some optimization objective, such as maximum efficiency or load voltage/current regulation.

Fabrication

In some embodiments, the planar plasmonic emitter and thin-film PV cell structures described here can be fabricated separately and then placed at the desired distance within a vacuum. The emitter and PV cell can be fabricated with standard deposition and epitaxy techniques, such as physical vapor deposition (PVD) (e.g., evaporation or sputtering), chemical vapor deposition (CVD), atomic layer deposition (ALD), vapor phase epitaxy (VPE), liquid phase epitaxy (LPE), and molecular beam epitaxy (MBE). The thin-film PV cell can be fabricated on a reusable substrate and separated from it with an epitaxial lift-off process.

The heat-generating unit can be a micro-reactor, using carbohydrate or nuclear fuels, or a solar absorber, built out of a refractory material that can withstand the desired operating emitter temperature. It can be suspended from the walls of the vacuum chamber via long and low-thermal-conductivity (e.g., glass or other oxide) veins or capillary tubes that can also serve as fluidic connections for carbohydrate fuels and air/oxygen. In some embodiments, the emitter can be attached to the heat-generating unit. The attachment process can be welding or brazing or diffusion brazing. In some embodiments, the emitter can be built right on top of the heat-generating unit. In some embodiments, the heat-generating unit can itself be built out of the emitter refractory material, so that it can also function as the emitter.

Achieving and maintaining under operation a sub-µm vacuum gap can be challenging. In some embodiments, isolated posts or pillars can separate the emitter and PV cell by the fixed desired gap. These posts should be narrow and sparse to provide large thermal resistance and thus to reduce or minimize thermal conduction between the emitter and the cell. In some embodiments, the posts can be narrower than the vacuum gap. In some embodiments, deep holes can be etched into the emitter. The posts can penetrate into these holes without touching the hole walls. In these cases, the length of the posts is approximately equal to the depth of the holes plus the desired vacuum gap.

In some embodiments, a temporary thin film of thickness equal to the desired vacuum gap can be deposited on either the emitter or the PV cell. The emitter and PV cell can be bonded together so that the heat-generating unit, the emitter, the temporary film, and the PV cell form a single structure (FIG. 21B). Then, while leaving at least one opening, the vacuum chamber can be partly built onto this single structure, so that the veins or capillary tubes are attached to it and also the PV cell is attached to it (FIG. 21C). Then, without disturbing the rigidity of the whole structure, the temporary film can be removed. For example, it can be etched away via a selectively reacting agent. Or it can be melted or evaporated away if made out of a low-melting/evaporation-temperature material (FIG. 21D). Finally, the vacuum packaging can be completed to vacuum seal the TPV cell.

In maintaining the desired vacuum gap during operation within a specific tolerance, thermal expansion of the hot emitter material may have to be taken into account. The expected expansion at the nominal operating emitter temperature can first be calculated or experimentally determined, so the vacuum gap can be fabricated to be larger by the predetermined amount than the desired gap under operation.

FIGS. 21A-21D show an example method of fabricating the TPV cells used in the system 2000 shown in FIG. 20A. In FIG. 21A, a micro-reactor is fabricated and thermal emitters are attached to it via existing fabrication methods (e.g., deposition or diffusion brazing). Thin rods or capillary tubes 2052 are attached to the micro-reactor 2010 to provide mechanical connection to an external casing 2120 (and supply fuel and oxygen/air in the case of a micro-burner). Also two thin-film PV cells 2003 are fabricated via existing fabrication methods.

In FIG. 21B, temporary thin films 2110 of thickness equal to the desired vacuum gap are deposited on the PV cells 2030 and bonded on the thermal emitters 2010, creating a single connected structure 2100. In FIG. 21C, the external casing 2120 of the apparatus is built on four sides, with both metal back electrodes of the PV cells 2030 attached to two sides and the thin rods or capillary tubes 2052 to the other two sides. In FIG. 21D, the temporary thin films 2110 are removed (e.g., via selective chemical etching or melting/evaporation). The final two casing sides are built and sufficient vacuum is created.

The same fabrication method can be used to fabricate solar TPV cells. In this case, the heat-generating unit is a solar absorber. FIG. 20C shows an integrated solar absorber and thermophotovoltaic converter 2000″. The solar absorber 2010 is attached to the external casing 2080 again via thin rods 2054'. Compared to the case of a micro-reactor, there is only one emitter 2010 and one PV cell 2030, placed on the side of the solar absorber away from the sun, as seen in FIG. 20C, and the external casing 2080 encloses the solar absorber, the emitter and the PV cell, but is transparent on the side 2090 of the solar absorber facing the sun, so that the solar irradiation can be transmitted to the solar absorber.

The term "vacuum gap" does not necessarily mean that absolute vacuum (zero air pressure) occupies the gap between the thermal emitter and the PV cell. Rather, "vacuum gap" means that there is sufficient vacuum (sufficiently low air pressure) in a volume between the thermal emitter and the PV cell such that the thermal power conducted from the emitter to the PV cell via this volume is much lower than the thermal power radiated to the PV cell via the photons emitted by the emitter and absorbed inside the PV cell.

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used.

Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments can be implemented in any of numerous ways. For example, embodiments of designing and making the technology disclosed herein may be implemented using hardware, software or a combination thereof. When implemented in software, the software code can be executed on any suitable processor or collection of processors, whether provided in a single computer or distributed among multiple computers.

This disclosure includes various explanations and theories about how and why the inventive devices and methods operate. These explanations and theories should be considered illustrative rather than binding. They are not intended to and should not limit the scope of the appended claims.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A thermophotovoltaic apparatus comprising:
   a thermal emitter, in thermal communication with a heat source, to receive heat from the heat source, the thermal emitter supporting a resonant electromagnetic mode to provide thermally emitted photons; and
   a photovoltaic cell, in electrical communication with an electrical load, to deliver power to the electrical load,
   wherein the photovoltaic cell is separated from the thermal emitter by a vacuum gap and is configured to receive the thermally emitted photons from the thermal emitter,
   wherein the photovoltaic cell comprises at least one semiconductor material having an electronic band gap of energy $\hbar\omega_g$, where $\hbar$ is Planck's constant and $\omega_g$ is an angular frequency of the electronic band gap,
   wherein the at least one semiconductor material only supports one resonant electromagnetic mode that couples to the resonant electromagnetic mode of the thermal emitter to generate the power,
   wherein the photovoltaic cell further comprises a back reflector having a reflectivity at $\omega_g$ of at least 90%,
   wherein the vacuum gap has a width of less than $\lambda_g=2\pi c/\omega_g$, where c is the speed of light in vacuum, and
   wherein the thermal emitter comprises at least one material having a relative dielectric permittivity with a real part of −1 at a frequency between $\omega_g$ and 1.7 $\omega_g$.

2. The thermophotovoltaic apparatus of claim 1, wherein the at least one material of the thermal emitter is Zirconium Carbide.

3. The thermophotovoltaic apparatus of claim 2, wherein the at least one semiconductor material of the photovoltaic cell is Indium Gallium Arsenide.

4. The thermophotovoltaic apparatus of claim 1, wherein the at least one material of the thermal emitter is Vanadium Carbide.

5. The thermophotovoltaic apparatus of claim 1, wherein the at least one material of the thermal emitter is Titanium Carbide.

6. The thermophotovoltaic apparatus of claim 5, wherein the at least one semiconductor material of the photovoltaic cell is Gallium Antimonide.

7. The thermophotovoltaic apparatus of claim 1, wherein the at least one material of the thermal emitter is Tungsten.

8. The thermophotovoltaic apparatus of claim 7, wherein the at least one semiconductor material of the photovoltaic cell is Indium Gallium Antimonide Phosphide.

9. The thermophotovoltaic apparatus of claim 7, wherein the at least one semiconductor material of the photovoltaic cell is Silicon.

10. The thermophotovoltaic apparatus of claim 1, wherein when the thermal emitter is at a temperature $T_e$ during operation, the electronic band gap $\hbar\omega_g$ of the at least one semiconductor material of the photovoltaic cell is within 50% of $4k_B T_e$, where $k_B$ is the Boltzmann constant.

11. The thermophotovoltaic apparatus of claim 1, wherein at least one of the thermal emitter or the photovoltaic cell has a periodic patterning.

12. The thermophotovoltaic apparatus of claim 11, wherein the periodic patterning of the at least one of the thermal emitter or the photovoltaic cell forms an array of nanopillars.

13. The thermophotovoltaic apparatus of claim 1, wherein the thickness of the at least one semiconductor material is less than $\lambda_g/\eta=2\pi c/\eta\omega_g$, where $\eta$ is a refractive index of the at least one semiconductor material.

14. The thermophotovoltaic apparatus of claim 1, wherein the back reflector comprises at least one of silver, gold, aluminum, or copper.

15. The thermophotovoltaic apparatus of claim 14, wherein the back reflector has a periodic patterning.

16. The thermophotovoltaic apparatus of claim 1, wherein the photovoltaic cell further comprises a front electrode comprising a conducting material having a dielectric permittivity with a positive real part at frequency $\omega_g$.

17. The thermophotovoltaic apparatus of claim 16, wherein the at least one conducting material of the front electrode is Indium Oxide doped with Molybdenum.

18. The thermophotovoltaic apparatus of claim 16, wherein the at least one conducting material of the front electrode is Cadmium Oxide doped with Dysprosium.

19. The thermophotovoltaic apparatus of claim 1, wherein the photovoltaic cell further comprises a front electrode comprising graphene.

20. The thermophotovoltaic apparatus of claim 1, wherein the photovoltaic cell further comprises a front electrode comprising a conducting material having a dielectric permittivity with a negative real part at frequency $\omega_g$.

21. The thermophotovoltaic apparatus of claim 20, wherein the conducting material of the front electrode is Indium Oxide doped with Tin.

22. The thermophotovoltaic apparatus of claim 20, wherein the conducting material of the front electrode is at least one of silver, gold, aluminum, or copper.

23. The thermophotovoltaic apparatus of claim 1, further comprising:
   a control system configured to monitor at least one of a voltage across the electrical load or a current into the electrical load.

24. The thermophotovoltaic apparatus of claim 23, wherein the control system is configured to vary an efficiency of the thermophotovoltaic apparatus by at least one of:
   tuning an impedance of the electrical load;
   controlling an amount of heat received by the thermal emitter from the heat source; or varying a width of the vacuum gap.

25. The thermophotovoltaic apparatus of claim 23, wherein the control system is configured to regulate at least one of the voltage across the electrical load or the current into the electrical load by at least one of:

tuning an impedance of the electrical load;
controlling an amount of heat received by the thermal emitter from the heat source; or
varying a width of the vacuum gap.

26. The thermophotovoltaic apparatus of claim 23, wherein the control system is configured to regulate at least one of the voltage across the electrical load or the current into the electrical load by tuning an impedance of the electrical load and to vary an efficiency of the thermophotovoltaic apparatus by at least one of:
controlling an amount of heat received by the thermal emitter from the source of heat;
or
varying a width of the vacuum gap.

27. A thermophotovoltaic apparatus comprising:
a thermal emitter, in thermal communication with a heat source, to receive heat from the heat source; and
a photovoltaic cell, in electrical communication with an electrical load, to deliver power to the electrical load,
wherein the photovoltaic cell is separated from the thermal emitter by a vacuum gap and is configured to receive thermally emitted photons from the thermal emitter,
wherein the photovoltaic cell comprises at least one semiconductor material having an electronic band gap of energy $\hbar\omega_g$, where $\hbar$ is Planck's constant and $\omega_g$ is an angular frequency of the electronic band gap,
wherein the at least one semiconductor material has a thickness of less than $\lambda_g=2\pi c/\omega_g$, where c is the speed of light in vacuum,
wherein the photovoltaic cell further comprises a back reflector having a reflectivity at $\omega_g$ of at least 90%,
wherein the vacuum gap has a width of less than $\lambda_g$,
wherein the thermal emitter comprises at least one polaritonic material,
wherein the thermal emitter supports, on an interface of the at least one polaritonic material, at least one surface polaritonic mode having (i) an upper cutoff frequency between $\omega_g$ and 1.7 $\omega_g$ and (ii) a field that extends inside the vacuum gap,
wherein the photovoltaic cell further comprises a front electrode, and
wherein each of the front electrode and the at least one semiconductor material has a thickness such that respective photonic modes of the front electrode and the at least one semiconductor material have a first cutoff at a frequency greater than $\omega_g$.

28. A thermophotovoltaic apparatus comprising:
a thermal emitter, in thermal communication with a heat source, to receive heat from the heat source; and
a photovoltaic cell, in electrical communication with an electrical load, to deliver power to the electrical load,
wherein the photovoltaic cell is separated from the thermal emitter by a vacuum gap and configured to receive thermally emitted photons from the thermal emitter, and
wherein the photovoltaic cell comprises at least one semiconductor material having an electronic band gap of energy $\hbar\omega_g$, where $\hbar$ is Planck's constant and $\omega_g$ is an angular frequency of the electronic band gap, and
wherein the at least one semiconductor material has a thickness of less than $\lambda_g=2\pi c/\omega_g$, where c is the speed of light in vacuum,
wherein the photovoltaic cell further comprises a back reflector having a reflectivity at $\omega_g$ of at least 90%,
wherein the vacuum gap has a width of less than 80 $_g$,
wherein the thermal emitter comprises at least one polaritonic material,
wherein the thermal emitter supports, on an interface of the at least one polaritonic material, a surface polaritonic mode having a resonant frequency between $\omega_g$ and about 1.5 $\omega_g$,
wherein the photovoltaic cell supports a photonic mode having a resonant frequency between $\omega_g$ and about 1.5 $\omega_g$,
wherein the surface polaritonic mode of the thermal emitter couples with the photonic mode of the photovoltaic cell with a coupling coefficient $\kappa$, where $\kappa/\omega_g$ is larger than 0.01, and
wherein the photovoltaic cell further comprises a front electrode comprising a conducting material having a dielectric permittivity with a negative real part at frequency $\omega_g$.

* * * * *

UNITED STATES PATENT AND TRADEMARK OFFICE
CERTIFICATE OF CORRECTION

PATENT NO. : 11,005,413 B2
APPLICATION NO. : 15/864634
DATED : May 11, 2021
INVENTOR(S) : Karalis et al.

Page 1 of 1

It is certified that error appears in the above-identified patent and that said Letters Patent is hereby corrected as shown below:

In the Claims

Column 60 In Claim 28, Line 24, replace "wherein the vacuum gap has a width of less than 80 g," with – wherein the vacuum gap has a width of less than $\lambda g$, –.

Signed and Sealed this
Seventeenth Day of August, 2021

Drew Hirshfeld
*Performing the Functions and Duties of the*
*Under Secretary of Commerce for Intellectual Property and*
*Director of the United States Patent and Trademark Office*